(12) United States Patent
Miyairi et al.

(10) Patent No.: US 7,179,699 B2
(45) Date of Patent: *Feb. 20, 2007

(54) METHOD OF FABRICATING SEMICONDUCTOR DEVICE

(75) Inventors: Hidekazu Miyairi, Atsugi (JP); Atsuo Isobe, Atsugi (JP); Tomoaki Moriwaka, Atsugi (JP); Akihisa Shimomura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 160 days.

This patent is subject to a terminal disclaimer.

(21) Appl. No.: 10/920,316

(22) Filed: Aug. 18, 2004

(65) Prior Publication Data

US 2005/0020096 A1    Jan. 27, 2005

Related U.S. Application Data

(62) Division of application No. 10/395,366, filed on Mar. 25, 2003, now Pat. No. 6,841,434.

(30) Foreign Application Priority Data

Mar. 26, 2002 (JP) .............................. 2002-087232
Mar. 26, 2002 (JP) .............................. 2002-087243

(51) Int. Cl.
*H01L 21/00* (2006.01)

(52) U.S. Cl. ................ 438/166; 438/487; 257/E21.134

(58) Field of Classification Search ................ 438/166, 438/487
See application file for complete search history.

(56) References Cited

U.S. PATENT DOCUMENTS 4,330,363 A    5/1982    Biegesen et al.
5,643,826 A    7/1997    Ohtani et al.
5,854,803 A    12/1998   Yamazaki et al.
5,953,597 A    9/1999    Kusumoto et al.
6,160,827 A    12/2000   Tanaka (Continued)

FOREIGN PATENT DOCUMENTS

JP    62-104117    5/1987

(Continued)

OTHER PUBLICATIONS

Masatake Kishino et al., "Physics of VLSI Device," Maruzen Co., Ltd., 1995, pp. 144-146.

(Continued)

*Primary Examiner*—Chandra Chaudhari
(74) *Attorney, Agent, or Firm*—Eric J. Robinson; Robinson Intellectual Property Law Office, P.C.

(57) ABSTRACT

The objective of the invention is to provide a method of fabricating semiconductor device using a laser crystallization method capable of preventing a grain boundary from being formed on the channel-forming region of a TFT and preventing the mobility of the TFT from extremely deteriorating, on-current from decreasing, or off-current from increasing due to a grain boundary and a semiconductor device fabricated by the fabrication method. Striped (banded) or rectangular concave and convex portions are formed. Then, a semiconductor film formed on an insulating film is irradiated with a laser beam diagonally to the longitudinal direction of concave and convex portions on the insulating film.

30 Claims, 41 Drawing Sheets

U.S. PATENT DOCUMENTS

| | | |
|---|---|---|
| 6,210,996 B1 | 4/2001 | Yamazaki et al. |
| 6,274,414 B1 | 8/2001 | Ogata et al. |
| 6,291,320 B1 | 9/2001 | Yamazaki et al. |
| 6,365,933 B1 | 4/2002 | Yamazaki et al. |
| 6,475,840 B1 | 11/2002 | Miyanaga et al. |
| 6,516,009 B1 | 2/2003 | Tanaka |
| 6,521,492 B2 * | 2/2003 | Miyasaka et al. ........... 438/166 |
| 2001/0035526 A1 | 11/2001 | Yamazaki et al. |
| 2002/0004292 A1 | 1/2002 | Yamazaki et al. |
| 2002/0098628 A1 | 7/2002 | Hamada et al. |

FOREIGN PATENT DOCUMENTS

| | | |
|---|---|---|
| JP | 06-349735 | 12/1994 |
| JP | 07-130652 | 5/1995 |
| JP | 08-078329 | 3/1996 |
| JP | 08-195357 | 7/1996 |
| JP | 10-135468 | 5/1998 |
| JP | 10-135469 | 5/1998 |
| JP | 2001-144027 | 5/2001 |
| JP | 2002-014337 | 1/2002 |
| JP | 2002-324808 | 11/2002 |

OTHER PUBLICATIONS

M.W. Geis et al., "Crystallographic Orientation of Silicon on an Amorphous Substrate Using an Artificial Surface-Relief Grating and Laser Crystallization," Appl. Phys. Lett. 35, 1979, pp. 71-74.

* cited by examiner

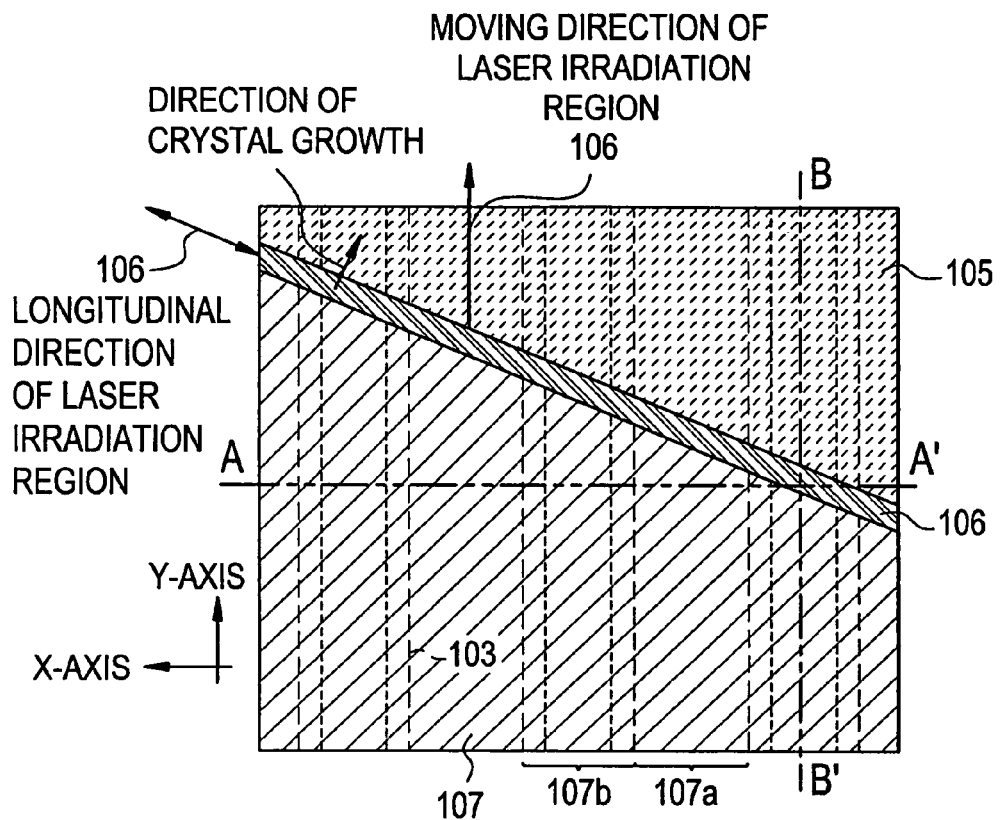
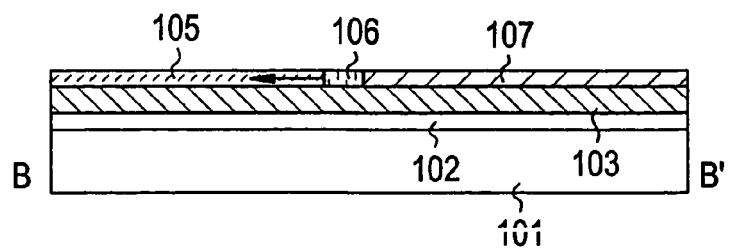

109 ACTIVE LAYER

SOURCE REGION 112

MOVING DIRECTION OF LASER IRRADIATION REGION

141

140

113 DRAIN REGION

106 LASER IRRADIATION REGION

141

MOVING DIRECTION OF CARRIER
= DIRECTION OF CRYSTAL GROWTH
= <110>

501 RESIST MASK

SCHEMATIC VIEW AFTER SECCO ETCHING

REGION WHERE SECOND INSULATING FILM IS REMOVED

FIRST CRYSTALLINE SEMICONDUCTOR REGION

SECOND GROUND FILM 351    FIRST GROUND FILM 350

MASK 352    CONVEX PORTION 353

SILICONIZED NICKEL FILM 354

AMORPHOUS SILICON FILM 355    362

GRAIN BOUNDARY 356    363 CRYSTALLINE SILICON FILM

CRYSTALLINE SILICON FILM (AFTER GETTERING) 357    360    359    358

CRYSTALLINE SEMICONDUCTOR FILM (AFTER ETCHING) 361

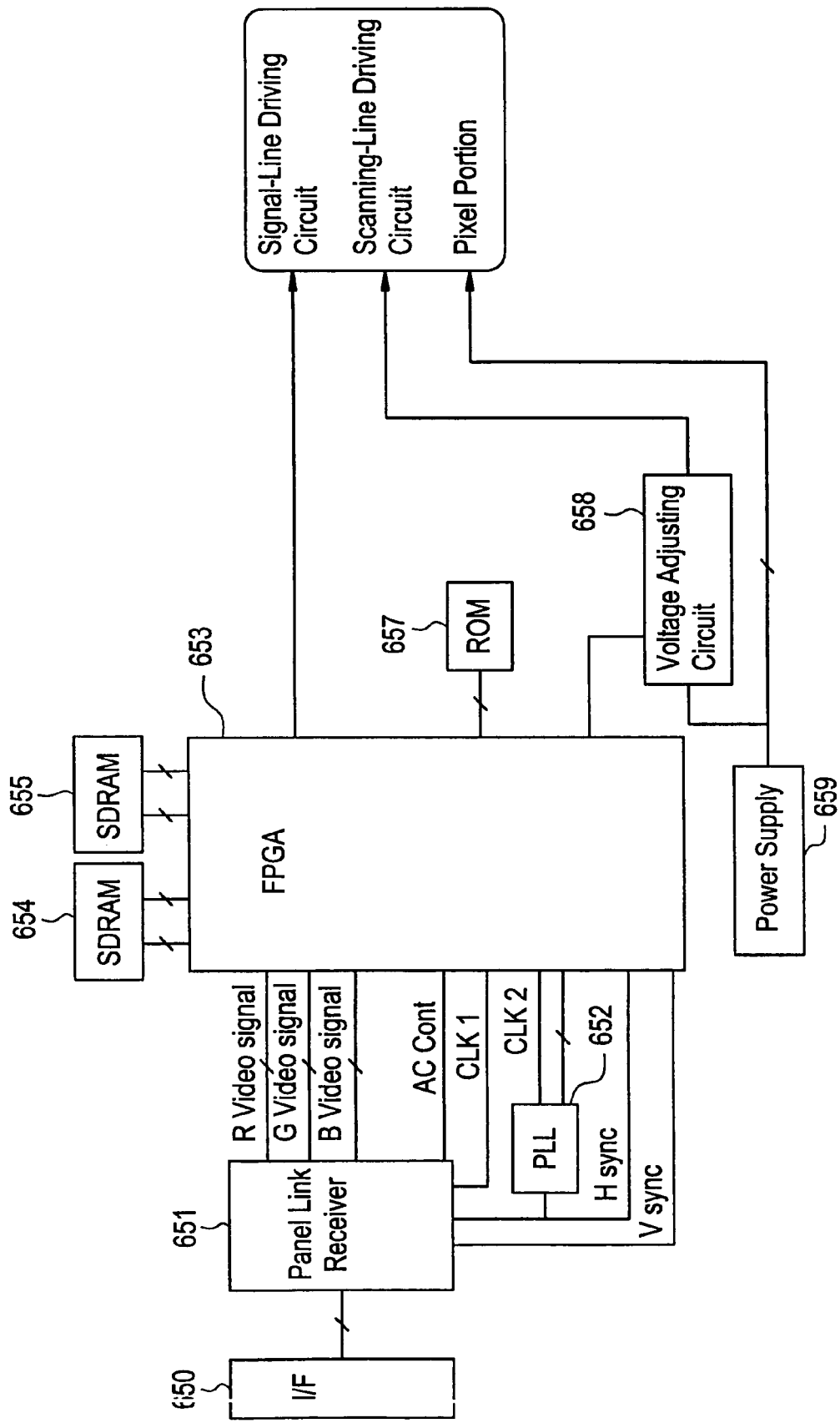

T-1
K
+1.757e+03
+1.393e+03
+1.029e+03

CONCAVE STRUCTURE
L=1.0μm, S=1.5μm, P=45°

STEP
H=250nm, d=150nm

FILM STRUCTURE
QUARTZ
STEP SiON (250nm) / CG-Si (150nm)

LC CONDITION
POWER=6.50W, V=50cm/sec.

CONCAVE STRUCTURE
  L=1.0μm, S=1.5μm, P=45°

STEP
  H=250nm, d=150nm

FILM STRUCTURE
  QUARTZ
  STEP SiON (250nm) / CG-Si (150nm)

LC CONDITION
  POWER=6.50W, V=50cm/sec.

CONCAVE STRUCTURE
    L=1.0μm, S=3.0μm, P=45°

STEP
    H=250nm, d=150nm

FILM STRUCTURE
    QUARTZ
    STEP SiON (250nm) / CG-Si (150nm)

LC CONDITION
    POWER=6.50W, V=50cm/sec.

METHOD OF FABRICATING SEMICONDUCTOR DEVICE

BACKGROUND OF THE INVENTION.

1. Field of the Invention

The present invention relates to a semiconductor element formed by using a semiconductor film having a crystal structure (also referred to as crystalline semiconductor film) and its fabrication method and a semiconductor device provided with a circuit obtained by integrating the semiconductor element and its fabrication method. The present invention relates to a field effect transistor in which a channel-forming region is formed by a crystalline semiconductor film formed on an insulating surface, particularly to a thin-film transistor.

2. Related Art

An art is developed which forms a semiconductor element such as a thin film transistor using a crystalline semiconductor film formed on an insulating substrate such as glass. An art for forming a TFT on a glass substrate is greatly advanced and application of the art to an active-matrix semiconductor display which is one of semiconductor devices is progressed.

Particularly, an art for crystallizing an amorphous semiconductor film by irradiating the film with a laser beam is applied to an art for fabricating a thin-film transistor (TFT). A glass substrate is regarded to be prospective as a substrate used for a semiconductor device from the viewpoint of cost, compared to a single-crystal-silicon substrate. A glass substrate is inferior in heat resistance and is easily deformed. Therefore, when forming a polysilicon TFT on a glass substrate, it is very effective to use a laser annealing method for crystallization of a semiconductor film in order to avoid thermal deformation of a glass substrate.

Because a TFT using a polycrystalline semiconductor film (polysilicon TFT) has a field-effect mobility (also referred to as mobility) higher than that of the conventional TFT using an amorphous semiconductor film, it realizes high-speed operations. Therefore, it is possible to perform pixel control which has been performed so far by a driving circuit set outside a substrate by a driving circuit formed on the same substrate as pixels. A thin-film transistor fabricated by a crystalline semiconductor film is applied to a planar display (flat panel display) represented by a liquid-crystal display or an EL (electroluminescence) display.

The laser annealing method has features that treatment time can be greatly decreased compared to the annealing method which uses radiation heating or conduction heating and a substrate is hardly thermally damaged because it is selectively or locally heated.

The above laser annealing method represents an art for recrystallizing a damaged layer formed on a semiconductor substrate or semiconductor film or an art for crystallizing a semiconductor film formed on a substrate. Moreover, the laser annealing method includes an art to be applied to flattening or surface reforming of a semiconductor substrate and semiconductor film. A laser oscillator to be applied is a gas laser oscillator represented by an excimer laser or a solid laser oscillator represented by a YAG laser, which is known as an oscillator for crystallizing the surface layer of a semiconductor by irradiating the surface layer with a laser beam and thereby heating it for a very short time such as several tens of nanoseconds to several tens of microseconds.

Lasers are roughly divided into two types such as pulse oscillation and continuous oscillation in accordance with the oscillation method of a laser. Because an output of the pulse oscillation has a comparatively high output energy, it is possible to improve the mass productivity by setting the size of a laser beam to several square centimeters. Particularly, by forming the shape of a laser beam like a line having a length of 10 cm or more by an optical system, it is possible to efficiently apply a laser beam and further improve the mass productivity. Therefore, it had been a main stream to use a pulse-oscillation laser for crystallization of a semiconductor film.

However, it is recently found that the grain diameter of crystal formed in a semiconductor film increases by using a continuous-oscillation laser compared to the case of using a pulse-oscillation laser for crystallization of the semiconductor film. When the crystal grain diameter in a semiconductor film increases, the mobility of a TFT formed by the semiconductor film rises. Therefore, the continuous-oscillation laser is suddenly started to get into the spotlight.

In a semiconductor fabrication process, a gas laser represented by an excimer laser or a solid laser represented by a YAG laser is normally used as the light source of a laser beam. The following Patent Document 1 discloses an art for crystallizing an amorphous semiconductor film by irradiating it with a laser beam, that is, an art for polycrystallizing an amorphous semiconductor film through high-speed scanning without completely melting the film by setting the scanning rate of a laser beam to a beam-spot diameter×5,000/sec or higher. The following Patent Document 2 discloses an art for substantially forming a single-crystal region by irradiating a semiconductor film formed like an island with an extended laser beam. Moreover, a method for applying a laser beam by forming the laser beam into a line by an optical system is known like the case of the laser treatment apparatus disclosed in Patent Document 3.

Patent Document 1

Official gazette of Japanese Patent Laid-Open No. 104117/1987 (p. 92)

Patent Document 2

Specification of U.S. Pat. No. 4,330,363 (FIG. 4)

Patent Document 3

Official gazette of Japanese Patent Laid-Open No. 195357/1996 (pp. 3–4, FIGS. 1–5)

Moreover, the following Patent Document 4 discloses an art for fabricating a transistor by using a solid laser oscillator such as an Nd:YVO$_4$ laser and thereby irradiating an amorphous semiconductor film with a laser beam which is the second harmonic of the laser oscillator to form a crystalline semiconductor film having a crystal grain diameter larger than the conventional one.

Patent Document 4

Official gazette of Japanese Patent Laid-Open No. 144027/2001

A crystalline semiconductor film formed by the laser annealing method is generally realized when a plurality of crystal grains are collected. Because positions and sizes of the crystal grains are random, it is difficult to form a crystalline semiconductor film by specifying positions and sizes of crystal grains. Therefore, an interface (grain boundary) between crystal grains may be present in an active layer formed by patterning the crystalline semiconductor film like an island.

A grain boundary is one of lattice defects, which is classified into a plane defect and also referred to as a crystalline interface. Plane defects include not only a grain boundary but also a twin plane and a stacking fault. In the case of this specification, however, electrically active plane defects respectively having a dangling bond, that is, a grain boundary and a stacking fault are generally known as a grain boundary.

Recombination centers and trapping centers due to an amorphous structure or crystal defect are innumerably present in a grain boundary differently from the inside of a crystalline interface. When a carrier such as an electron or positive hole is trapped by the trapping center, the potential of the grain boundary rises and works as a barrier for the carrier. Therefore, it is known that the current carrying characteristic of the carrier is deteriorated, that is, the mobility of the electron or positive hole is deteriorated. Therefore, when a grain boundary is present in the active layer of a TFT, particularly in a channel-forming region, it seriously affects TFT characteristics because the mobility of a TFT extremely deteriorates, on-current decreases, or off-current increases because current flows through a grain boundary. Moreover, characteristics of a plurality of TFTs fabricated by assuming that the same characteristics are obtained are fluctuated due to presence or absence of a grain boundary in an active layer.

When irradiating a semiconductor film with a laser beam, positions and sizes of obtained crystal grains become random because of the following reasons. That is, it takes some time until a solid-phase nucleus is generated in a liquid semiconductor film completely melted due to irradiation with a laser beam. Moreover, countless crystal nucleuses are produced in the completely-melted region with elapse of time and crystals are grown from the crystal nucleuses. Because positions of the crystal nucleuses are random, the crystal nucleuses are unevenly distributed. Moreover, because crystal growth ends when crystal grains collide with each other, positions and sizes of the crystal grains become random.

Thus, by irradiating an amorphous semiconductor film formed on a flat surface with a laser beam and thereby crystallizing it, crystal becomes polycrystal, a defect such as a crystalline interface is optionally formed, and thereby it is difficult to obtain the crystal in which orientations are arranged. Particularly, it is difficult to obtain the crystal in which orientations are arranged on a glass substrate by a laser crystallization art.

Moreover, it is impossible to form a semiconductor film in which no strain or crystal defect is present because of volume shrinkage of a semiconductor film caused by crystallization or mismatch of thermal stress or lattice with a ground. Therefore, it is impossible to obtain the same quality as a MOS transistor formed on a single-crystal substrate from a crystalline semiconductor film formed on an insulating surface and crystallized or recrystallized.

In the case of the above planar display, a transistor is built in by forming a semiconductor film on an inexpensive glass substrate. However, it is almost impossible to arrange transistors so as to avoid a crystalline interface to be optionally formed. That is, it is impossible to strictly control the crystallinity of the channel-forming region of a transistor and exclude an unintentionally-included crystalline interface or crystal defect. As a result, electrical characteristics of a transistor are deteriorated and moreover, individual element characteristic is fluctuated.

Particularly, when forming a crystalline semiconductor film on a non-alkali glass substrate industrially frequently used by a laser beam, there is a problem that the focus of the laser beam is fluctuated due to the swell of the non-alkali glass substrate and resultantly crystallinity is fluctuated. Moreover, in the case of the non-alkali glass substrate, it is necessary to use a protective film such as an insulating film as a ground film. Therefore, it is almost impossible to form a crystalline semiconductor film excluding a crystalline interface or crystal defect on the ground film at a large grain diameter.

It is ideal to form a channel-forming region which greatly affects TFT characteristics by single crystal grains by excluding the influence of a grain boundary. However, it is almost impossible to form an amorphous silicon film in which no grain boundary is present by the laser annealing method. Therefore, a TFT using a crystal silicon film as an active layer crystallized by the laser annealing method having the same characteristic as a MOS transistor formed on a single-crystal silicon substrate has not been obtained yet.

The present invention is made to solve the above problems and its object is to provide an inexpensive semiconductor device constituted by a semiconductor element or a group of semiconductor elements capable of performing high-speed operations, having a high current-driving capacity, and having a small fluctuation between a plurality of elements and obtained by forming a crystalline semiconductor film having no crystalline interface in at least a channel-forming region on an insulating surface, particularly an insulating surface using an inexpensive glass substrate as a support substrate.

It is another object of the present invention to provide fabrication method of a semiconductor display device using a laser crystallization method capable of preventing the mobility of a TFT from being extremely deteriorated due to a grain boundary, on-current from decreasing, or off-current from increasing and a semiconductor display fabricated by using the fabrication method.

Moreover, when analyzing at least the above crystalline semiconductor film having no crystalline interface is present in a channel-forming region by the EBSP (Electron Backscatter diffraction Pattern) method, it is a problem to decide a crystal plane which most frequently appears on the main surface as a plane {110} (the crystal plane is referred to as predominant crystal plane). The EBSP method will be described later.

A crystal plane is expressed by putting it in parentheses so that the Miller index is shown by (110) and an equivalent crystal plane such as (101) or (011) is expressed by braces as shown by {110}. Moreover, a crystal orientation (crystal axis) is expressed by putting it in angle brackets as shown by [110] and an equivalent crystal orientation such as [101] or [011] is expressed as shown by <110>.

SUMMARY OF THE INVENTION

The present inventor et al. find that by forming a semiconductor film on an insulating film having concave and convex portions and irradiating the film semiconductor with a laser beam, a grain boundary is selectively formed at a portion located on a convex portion of the insulating film of the crystallized semiconductor film.

FIGS. 34A and 34B show sectional images of a TEM in the direction vertical to the scanning direction of a continuous-oscillation laser beam when irradiating a 200-nm amorphous semiconductor film formed on an insulating film having concave and convex portions with the laser beam so that the scanning rate of the laser beam becomes 5 cm/sec. FIG. 34B schematically illustrates sectional images of the TEM shown in FIG. 34A. A convex portion 8001 has a width of 0.75 μm, a concave portion has a width of 0.4 μm, and a convex portion has a thickness of 250 nm. In FIG. 34A, symbols 8001 and 8002 denote convex portions respectively formed by an insulating film. Moreover, a crystallized semiconductor film 8004 has a grain boundary 8003 on the convex portions 8001 and 8002.

As shown in FIG. 34B, a grain boundary 8003 is formed on the convex portions 8001 and 8002. The present inventor et al. estimate that one of factors producing a grain boundary on a convex portion is the fact that a semiconductor film is temporarily melted due to irradiation with a laser beam, thereby the semiconductor film located on an upper part of insulating film performs a volume movement toward a concave portion, and therefore the semiconductor film located on a convex portion becomes thin and cannot withstand a stress. Moreover, a grain boundary is preferentially formed on the semiconductor film thus crystallized at the convex portions 8001 and 8002 while a grain boundary is not easily formed on a portion located at a concave portion. A concave portion indicates a recessed region where no convex portion is formed.

Moreover, FIGS. 35A to 35F show simulation results of change of temperature distribution of a semiconductor film formed on an insulating film having concave and convex portions with time when irradiating the semiconductor film with a laser beam. Concave and convex portions at the lower side of FIG. 35A shows a ground film 8008. Moreover, an upper-side line 8009 denotes a boundary between silicon and air layer, showing a portion irradiated with a laser beam. An oxide film and silicon film respectively have a thickness of 200 nm and the interval between concave and convex portions is 1 µm. Laser-beam irradiation conditions are set to a peak energy density of 45,000 W/cm² and σ of 7×10⁻⁵ sec in accordance with a Gaussian method.

FIG. 35A shows a temperature distribution immediately after irradiation with a laser beam and FIGS. 35B to 35F respectively show a temperature distribution by 2.5 µsec.

A dark region is a portion estimated as a highest-temperature portion and it is found that dark portions are decreased as the state moves from FIG. 35A to FIG. 35F. Particularly, in the case of the temperature of the silicon 8009, it is found that the temperature of the portion on the concave portion of the ground film 8008 lowers earlier than the portion on the convex portion as time elapses.

FIG. 36 shows simulation results of change of a semiconductor film formed on an insulating film having concave and convex portions with time according to the position of the semiconductor film when irradiating the semiconductor film with a laser beam.

In the case of the graph shown in FIG. 36, the axis of ordinate denotes the temperature (K) of a semiconductor film and the axis of abscissa denotes time (sec). A continuous line denotes the temperature of a semiconductor film located on a convex portion and a broken line denotes the temperature of a semiconductor film located on a concave portion. In the case of the simulation in FIG. 36, temperature drop is temporarily stopped at 1,600 K due to phase transition. However, after the phase transition, the semiconductor film on the concave portion shown by a broken line starts temperature drop earlier compared to the case of the semiconductor film on the convex portion and thereby, it is found that phase transition is early performed.

Because a concave portion has a large volume of an insulating film for the area contacting a semiconductor film in a predetermined range compared to the case of a convex portion, the concave portion has a larger heat capacity. Therefore, it is estimated that released heat is not easily confined and thereby, heat release is efficiently performed. Thus, a crystal nucleus is early produced at the vicinity of a concave portion compared to the case of a convex portion while the heat in the semiconductor film is released to insulating film and the semiconductor film is solidified after the film is melted due to irradiation with a laser beam.

Moreover, as time elapses, crystal growth progresses from the crystal nucleus grown in the vicinity of the concave portion toward the upper side of the convex portion. Therefore, it is estimated that one of factors producing a grain boundary on a convex portion lies in the fact that crystal growths started with vicinities of concave portions adjacent to each other collide with each other on the convex portion which is nearby the middle between the crystal growths.

Anyway, in the case of the crystallized semiconductor film, a grain boundary is selectively formed on a convex portion while a grain boundary is not easily formed at a portion located on a concave portion.

Moreover, the present inventor et al. find that it is more difficult to form a grain boundary on a concave portion if a laser beam is applied diagonally in longitudinal directions of concave and convex portions, even if comparatively increasing the width of the concave portion in the direction vertical to the longitudinal direction of the concave portion (hereafter simply referred to as width of concave portion). It is preferable that the above predetermined angle is close to 45° or 135°, typically the angle ranges between 30° and 60° or between 120° and 150°.

FIG. 37 shows an image of an SEM (Scanning Electron Microscopy) sample obtained by scanning an amorphous semiconductor film of 150 nm formed on a ground film having striped convex portions with a continuous-oscillation laser beam having an output energy of 6.5 W at a scanning rate of 50 cm/sec at an angle of 45° from the longitudinal direction of a convex portion. The width in the direction vertical to the longitudinal direction of a convex portion 8100 (hereafter simply referred to as width of convex portion) is 1 µm, the width of concave portion is 1.5 µm, and the thickness of the convex portion is 250 nm.

In FIG. 37, because the thickness of the semiconductor film is too small, almost all of the semiconductor films on the convex portion 8100 move to concave portions and the upper face of the convex portion 8100 is exposed. Moreover, grain boundaries are hardly present on the semiconductor film on the 8100.

FIG. 38 shows an SEM image when the width of a concave portion is 2.5 µm. FIG. 38 is different from FIG. 37 only in the width of a concave portion. Though the width of a concave portion increases also in FIG. 38, grain boundaries are hardly present on a semiconductor film on the concave portion formed between convex portions 8100.

FIG. 39 shows an SEM image when the width of a concave portion is 3 µm. FIG. 39 is different from FIGS. 37 and 38 only in the width of a concave portion. Though the width of a concave portion increases also in FIG. 39, grain boundaries are hardly present on a semiconductor film on the concave portion formed between convex portions 8100.

Thus, by only tilting the scanning direction of a laser beam from the longitudinal direction of a convex portion by a predetermined angle, a grain boundary is not easily formed on a concave portion even if comparatively increasing the width of the concave portion. Whether the effect that a grain boundary is not easily formed is obtained by increasing the width of a concave portion slightly depends on such conditions as the scanning rate and energy density of a laser beam, thickness of a semiconductor film, and thickness of a concave portion. However, it is found that the tolerance of the width of a concave portion from which it is possible to determine that an effect can be obtained increases compared to the case of adjusting the scanning direction of a laser beam to the longitudinal direction of a convex portion.

Moreover, the present inventor et al. consider using a portion having a comparatively small number of grain boundaries formed on a concave portion of a semiconductor film crystallized by a laser beam for the active layer of a TFT. The present invention has a feature of forming an insulating film provided with concave and convex portions extending in the form of linear stripe patterns on a substrate having an insulating surface, forming an amorphous semiconductor film on the insulating film, forming a crystalline semiconductor film crystallized by melting a semiconductor film and pouring the melted semiconductor film into a portion serving as the concave portion of the insulating film (hereafter simply referred to as concave portion), forming a crystalline semiconductor film (serving as a part of a semiconductor element later) divided into islands from the crystalline semiconductor film by etching off unnecessary regions, and forming a gate insulating film and a gate electrode on the crystalline semiconductor film formed on the concave portion so that at least a portion for forming a channel-forming region serves as the crystalline semiconductor film.

The present invention has a feature of using a laser beam beam-worked so that the irradiation region of the laser beam becomes linear (hereafter referred to as linear laser beam) when crystallizing a semiconductor film by melting the semiconductor film and pouring the melted film into the concave portion of the insulating film, and moreover applying the laser beam so that the longitudinal direction of the irradiation region becomes diagonal to an insulating film extending in the form of the stripe pattern and moving the laser beam along the insulating film extending in the form of the stripe pattern.

In this case, it is allowed that the lateral face of the insulating film extending in the form of the linear stripe pattern is vertical or tilted (tapered). Moreover, though in the case of the insulating film provided with a portion serving as the above concave portion or convex portion, the crystallinity of the crystalline semiconductor film formed on the portion serving as the convex portion (hereafter simply referred to as convex portion) is inferior to that of the crystalline semiconductor film formed on the concave portion, it is allowed to positively use the crystalline semiconductor film formed on the convex portion as an electrode (corresponding to the source region or drain region of a thin-film transistor) or wiring. When using the semiconductor film formed on the convex portion as a wiring, it is possible to use the semiconductor film as a resistance by adjusting the length of the wiring or provide functions of a protective circuit for the semiconductor film by curving the film.

It is allowed to form the above concave portion by forming a thick film made of silicon oxide, silicon nitride, or silicon oxide nitride film and etching the film. It is preferable to form the concave portion in accordance with the layout of an island-shaped semiconductor film including the channel-forming region of a transistor at least so as to coincide with the channel-forming region.

Moreover, it is preferable that the concave portion is provided so as to extend in the longitudinal direction of a channel and formed at a width (channel-width direction when using the concave portion as a channel-forming region) ranging between 0.01 and 4 μm (both included) (preferably between 0.1 and 3 μm) and at a depth ranging between 0.01 and 3 μm (preferably between 0.1 and 2 μm). Particularly, it is allowed that the concave portion has a width of 2 μm or more. This advantage is very useful when using a glass substrate as a substrate. The reason is described below.

The present invention is an art for showing a true value when a pattern must be formed by an exposure system having a minimum working dimension of 1.5 μm or more. Because advantages of the present invention can be obtained even if a concave portion has a width of 1.5 μm or more, it is possible to use an exposure system having a minimum working dimension of 1.5 μm or more.

When forming a pattern through one-to-one exposure or enlargement exposure, a minimum working dimension frequently becomes 1.5 μm or more and it is known that the one-to-one exposure or enlargement exposure is inferior to the case of using a stepper in resolution. However, when using a glass substrate as a substrate, it is difficult to adjust a focal depth due to the swell of the surface of the glass substrate or the like in the case of a stepper and form a high-resolution pattern on the glass substrate.

Therefore, when using a glass substrate as a substrate, it is inevitably necessary to use an exposure system having a minimum working dimension of 1.5 μm or more. However, the present invention can be executed with no problem even under the above condition. A reduction projection exposure system referred to as stepper is superior in resolution and suitable to transfer a pattern of 1 μm or less. However, because the system performs exposure while stepping every approx. 22-mm square, it has a disadvantage that the exposure time is comparatively long. Moreover, a pattern is easily displaced due to concave and convex portions of approx. several microns on the surface of a glass substrate. However, because one-to-one projection exposure is inferior to the reduction projection exposure in resolution, it can only correspond to a pattern of 1.5 μm or more. In the case of the one-to-one exposure, however, the exposure time can be decreased because a pattern is not easily displaced due to a swell of several microns on the surface of a glass substrate and the exposure area ranges between 50 and 100 mm square which are generally larger than the case of a stepper. Because it is enough that patterns for forming concave and convex portions have a minimum working dimension of 1.5 μm or more, an exposure system using the one-to-one projection exposure method can sufficiently correspond to the patterns. That is, the present invention has a feature that it is possible to form a crystalline semiconductor film superior in crystallinity not only in the case of using an exposure system having a minimum working dimension of 1.5 μm or less but also under the condition using an exposure system having a minimum working dimension of 1.5 μm or more.

According to the above configuration, a grain boundary is formed on a convex portion of a semiconductor film for crystallization by irradiation with a laser beam. Then, a semiconductor film located on a concave portion of an insulating film does not always exclude a grain boundary though it is superior in crystallinity. However, even if a grain boundary is present, the crystal grain of the grain boundary is larger than that of a semiconductor film located on a convex portion of an insulating film and the crystallinity is comparatively superior. Therefore, when the shape of an insulating film is designed, it is possible to estimate a position at which the grain boundary of a semiconductor film is formed to a certain extent. That is, because the present invention makes it possible to selectively decide a position at which a grain boundary is formed, it is possible to lay out an active layer so that the number of grain boundaries included in the active layer, more preferably in a channel-forming region, is minimized.

In the case of the present invention, it is possible to prevent a grain boundary from being formed in the channel-forming region of a TFT by positively using a semiconductor film located on a convex portion of an insulating film as the active layer of the TFT. It is possible to prevent the mobility of the TFT from being extremely deteriorated due to a grain boundary, on-current from being reduced, or off-current from being increased.

The vicinity of the edge of a laser beam generally has a low energy density compared to the central portion of the beam and moreover it may be frequently inferior in crystallinity of semiconductor film. Therefore, when scanning the vicinity of the edge with a laser beam, it is preferable that a portion serving as the channel-forming region of a TFT does not overlap with the edge of the trace of the portion. Moreover, it is at least necessary to irradiate the portion serving as the channel-forming region with a laser beam having a certain energy density. Therefore, in the case of the present invention, it is at least necessary to use a laser beam having an energy-density distribution so that a region having a uniform energy density completely overlap with a portion serving as a channel-forming region, more preferably the whole region serving as an active layer through scanning with the laser beam. To satisfy the condition of the above energy density, it is preferable to form the shape of the laser beam into a rectangle or linear shape.

Moreover, it is possible to form an island-shaped insulating film on an insulating surface to positively form a convex portion. In this case, convex portions extending in the form of a plurality of linear stripe patterns respectively form a portion relatively contacting a concave portion between adjacent stripe patterns. Therefore, it is allowed to form the concave portion in accordance with the layout of an island-shaped semiconductor film including the channel-forming region of a semiconductor element and also keep the width in the above described range.

Moreover, it is allowed that a semiconductor film formed on an insulating film or a concave portion at the first stage is any one of an amorphous semiconductor film formed by a publicly-known method, polycrystal semiconductor film (including a formed film and a solid-phase-grown film), and a microcrystal semiconductor film.

A pulse-oscillation or continuous-oscillation laser beam using a gas laser oscillator or solid laser oscillator as a light source is used as means for crystallizing a crystalline semiconductor film by melting it. Though it is most preferable that a laser beam is continuously oscillated, it is also allowed to use a pulse-oscillation laser beam. Moreover, it is preferable that the cross section of a convex portion in the direction vertical to the scanning direction of a laser beam is a quadrangle including a rectangle or it is allowed that the cross section is a triangle.

A laser beam to be applied is linearly condensed by an optical system and it is allowed that the intensity distribution of the laser beam has a uniform region in the longitudinal direction or a distribution in the crosswise direction and a rectangular-beam solid laser oscillator is applied to a laser oscillator used as a light source, most preferably a slab laser oscillator is applied. Moreover, it is allowed to use a solid laser oscillator using a rod doped with Nd, Tm, or Ho, particularly a laser oscillator constituted by combining a slab-structure amplifier with a solid laser oscillator using the crystal obtained by doping the crystal of YAG, $YVO_4$, YLF, or $YAlO_3$ with Nd, Tm, or Ho. A slab material uses one of crystals of Nd:YAG, Nd:GGG (gadolinium, gallium, garnet), and Nd:GsGG (gadolinium, scandium, gallium, garnet). In the case of a slab laser, a beam progresses through the plate laser medium in a zigzag optical path while repeating total reflection.

Moreover, it is allowed to apply intensified light conforming to the above beam. For example, it is allowed to use high-energy-density light obtained by condensing the light emitted from a halogen lamp, xenon lamp, high-pressure mercury lamp, metal-halide lamp, or excimer lamp by a reflector or lens.

The laser beam or intensified light linearly condensed and expanded in the longitudinal direction irradiates a crystalline semiconductor film, relatively moves the irradiation position of the laser beam and a substrate on which a crystalline semiconductor film is formed, melts the crystalline semiconductor film by scanning a part or the whole of the substrate, and crystallizes or recrystallizes the semiconductor film after melted. Scanning by the laser beam is performed along the longitudinal direction of a concave portion extending in the form of a linear stripe pattern formed on an insulating film or the channel-length direction of a transistor. Thereby, crystals are grown along the scanning direction of the laser beam and it is possible to prevent a crystalline interface from crossing with the channel-length direction.

By setting the depth of a concave portion to a value equal to or more than the thickness of a semiconductor film, the semiconductor film melted due to irradiation with a laser beam or intensified light is coagulated on the concave portion due to the surface tension of the melted semiconductor film and solidified. As a result, the thickness of the semiconductor film present at a convex portion of an insulating film decreases and it is possible to concentrate stress strains on the thin semiconductor film. Moreover, the lateral face of the concave portion has an effect for specifying a crystal orientation to a certain extent.

By melting a semiconductor film and coagulating the melted semiconductor film on a concave portion formed on the surface of an insulating film by the surface tension of the melted semiconductor film and growing crystals from the lateral face of the concave portion, it is possible to concentrate strains generated due to crystallization on a region other than the concave portion. That is, it is possible to release a crystalline semiconductor region (first crystalline semiconductor region) formed so as to fill the concave portion from strains. Moreover, a crystalline semiconductor region including crystalline interfaces and crystal defects (second crystalline semiconductor region) is formed on the insulating film.

Then, a crystalline semiconductor film including no crystalline interface is formed on the concave portion and the active layer (semiconductor layer functioning as a carrier moving path) of a semiconductor element is formed through patterning, a gate insulating film contacting the active layer is formed, and a gate electrode is formed. In the case of the above patterning, it is preferable to taper ends of the active layer. Thereafter, it is possible to form a field-effect transistor in accordance with a publicly-known method.

According to the above invention, it is possible to specify a region where a semiconductor element such as a transistor, particularly the channel-forming region of the semiconductor element will be formed and form a crystalline semiconductor region not including crystalline interface in the above region. Thereby, it is possible to prevent characteristics from being fluctuated due to unexpectedly-present crystalline interface or crystal defect. That is, it is possible to form a semiconductor device constituted by semiconductor elements capable of performing high-speed operations, having high current-driving capacities, and having a small fluctuation between the elements or a group of the semiconductor elements.

Moreover, it is allowed to screen a low-energy-density portion of a laser beam through a slit. By using the slit, it is possible to uniformly perform crystallization by a laser beam having a comparatively uniform energy density. Furthermore, by setting the slit, it is possible to locally change the width of a laser beam in accordance with the pattern information on an insulating film or semiconductor film and decrease restrictions on a channel-forming region and moreover the layout of the active layer of a TFT. The width of a laser beam denotes the length of the laser beam in the direction vertical to the scanning direction of the laser beam.

Furthermore, it is allowed to use a laser beam obtained by synthesizing laser beams oscillated from a plurality of laser oscillators for laser crystallization. It is possible to compensate portions of laser beams where the energy density is low each other by the above configuration.

Furthermore, it is allowed to irradiate a formed semiconductor film for crystallization with a laser beam so that the film is not exposed to atmospheric air (to realize a specified gas atmosphere or decompression atmosphere of a rare gas, nitrogen, or oxygen). It is possible to prevent a contaminant at a molecular level in a clean room such as boron contained in a filter for improving the cleanliness of air from entering a semiconductor film when crystallized with a laser beam.

BRIEF DESCRIPTION OF THE DRAWINGS

FIGS. 2A to 2C are a top view and longitudinal sectional views for explaining fabrication steps of a transistor of the present invention;

FIG. 31 is a block diagram showing a configuration of the controller of a light-emitting device which is one of semiconductor displays of the present invention;

PREFERRED EMBODIMENTS OF THE INVENTION

Embodiment 1

For this embodiment, a mode for fabricating a thin-film transistor by executing the present invention is described. The number of transistors to be fabricated can be properly decided by an executor, and drawings used do not restrict the present invention.

Figure 1A:
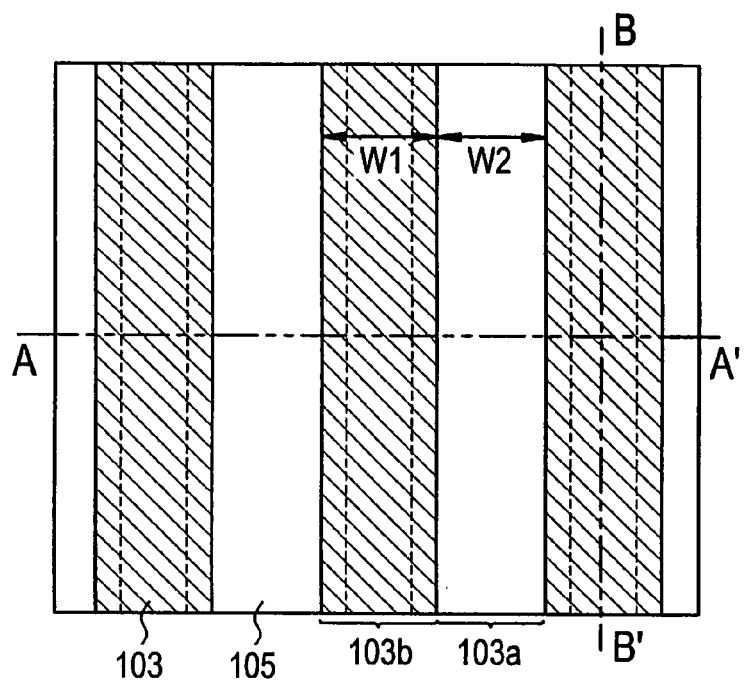
FIGS. 1A to 1C are a top view and longitudinal sectional views for explaining fabrication steps of a transistor of the present invention.
Figure 1B:
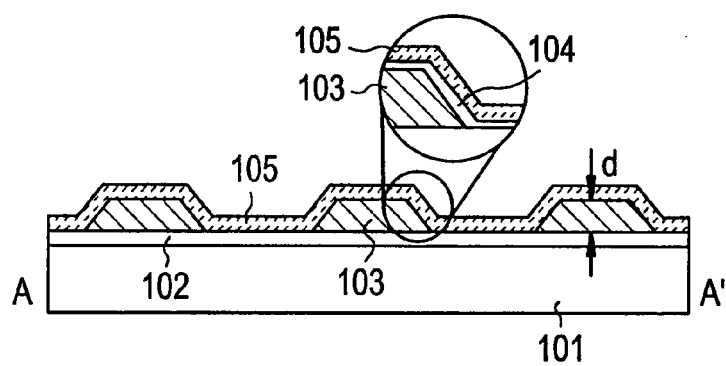
Figure 1C:
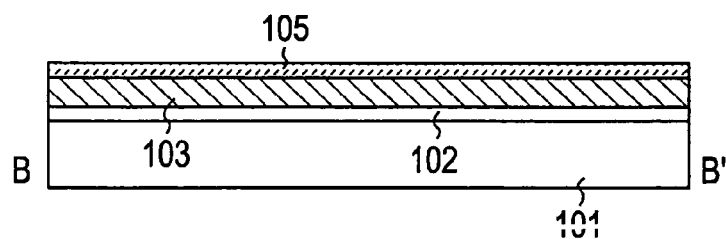

First, FIGS. 1A to 1C are described below. FIG. 1A is a top view, FIG. 1B is a sectional view taken along the line A–A' in FIG. 1A, and FIG. 1C is a sectional view taken along the line B–B' in FIG. 1A. FIGS. 1A to 1C show states in which a first insulating film 102 and a linear-stripe-pattern-formed second insulating film 103 are formed on a substrate 101. In this specification, a concave portion denotes the portion shown by symbol 103a and a convex portion denotes the portion shown by symbol 103b.

The substrate 101 can use any one of a marketed no-alkali glass substrate, quartz substrate, sapphire substrate, substrate obtained by covering the surface of a single-crystal or polycrystal semiconductor substrate with an insulating film, and substrate obtained by covering the surface of a metallic substrate with an insulating film. To solve the problem of obtaining an inexpensive semiconductor device, it is allowed to use an inexpensive no-alkali glass substrate.

To form a linear stripe pattern in accordance with a submicron design rule, it is preferable to set the concave and convex portions of the surface of a substrate and the swell or twist of the substrate to the focal depth of an exposure system (particularly, stepper) or less. Specifically, it is preferable to set the swell or twist of a substrate to 1 μm or less and more preferably 0.5 μm or less in a region of one-time exposure-light irradiation. Particularly, it is necessary to pay attention to the above point when using no-alkali glass as a support substrate.

It is preferable that the width (W1) of the second insulating film 103 formed into a linear stripe pattern ranges between 0.1 and 10 μm (more preferably between 0.5 and 1 μm) and the interval (W2) between adjacent second insulating films ranges between 0.01 and 5 μm (more preferably between 0.1 and 3 μm), and the thickness (d) of the second insulating film ranges between 0.01 and 3 μm (more preferably between 0.1 and 2 μm). Moreover, it is not necessary that a step shape is a regular cyclic pattern but it is allowed to arrange step shapes at different intervals in accordance with the width of an island-shaped semiconductor film. The length of the step shape is not numerically restricted and it is possible to form a step shape long so as to extend from one end to the other end of a substrate. For example, it is possible to set a step shape to a length capable of forming the channel-forming region of a transistor.

The first insulating film 102 can use a material as long as the material can secure a selection ratio with a second insulating film to be formed later. Typically, the film 102 is formed by a material selected from silicon nitride, silicon oxide, silicon oxide nitride (shown as SiOxNy), silicon nitride oxide (shown as SiNxOy), aluminum nitride (shown as AlxNy), aluminum oxide nitride (shown as AlOxNy), aluminum nitride oxide (AlNxOy), or aluminum oxide at a thickness of 30 to 300 nm. Particularly, because an aluminum-oxide film is effective to prevent contamination by a glass substrate because the blocking effect to sodium (Na) can be expected.

It is preferable to use a material containing 25 to 35 atomic % of Si, 55 to 65 atomic % of oxygen, 1 to 20 atomic % of nitrogen, and 0.1 to 10 atomic % of hydrogen as a silicon oxide nitride film (SiOxNy). Moreover, it is preferable to use a material containing 25 to 35 atomic % of Si, 15 to 30 atomic % of oxygen, 20 to 35 atomic % of nitrogen, and 15 to 25 atomic % of hydrogen as a silicon nitride oxide film (SiNxOy). Furthermore, it is preferable to use a material containing 30 to 40 atomic % of Al, 50 to 70 atomic% of oxygen, and 1 to 20 atomic % of nitrogen as an aluminum oxide nitride film (AlOxNy). Furthermore, it is preferable to use a material containing 30 to 50 atomic % of Al, 0.01 to 20 atomic % of oxygen, and 30 to 50 atomic % of nitrogen as an aluminum nitride oxide film (AlNxOy).

Furthermore, it is preferable to form the second insulating film 103 by silicon oxide or silicon oxide nitride with a thickness of 10 to 3,000 nm, preferably 100 to 2,000 nm. It is possible to form a silicon oxide film in accordance with the plasma CVD method by mixing tetraethyl ortho silicate (TEOS) with $O_2$. It is possible to form a silicon nitride oxide film in accordance with the plasma CVD method by using $SiH_4$, $NH_3$, and $N_2O$, or $SiH_4$ and $N_2O$ as materials.

As shown in FIGS. 1A to 1C, to form a linear stripe pattern by a double-layer insulating film, it is necessary to provide a high selection ratio between the first insulating film 102 and the second insulating film 103 in etching. Actually, it is preferable to properly adjust materials and film-forming conditions so that the etching rate of the second insulating film 103 becomes relatively higher than that of the first insulating film 102. As the etching method, the following is executed: etching using buffering hydrofluoric acid or dry etching using $CHF_3$.

As the second insulating film 103, it is preferable to use an insulating film formed by the CVD method (typically, plasma CVD method or thermal CVD method) or PVD method (typically, sputtering method or vacuum deposition method). This is because it is estimated that for an amorphous semiconductor film to have a flexibility capable of moderating a stress for crystallization when the film is crystallized plays an important role for obtaining a preferable crystallinity. The reason will be described later.

After forming the second insulating film 103, a silicon oxide film is formed as a buffer layer 104 by the CVD method or sputtering method to continuously form an amorphous semiconductor film 105 in the same system at a thickness of 0.01 to 3 μm (more preferably 0.1 to 1 μm) without releasing the silicon oxide film to atmospheric air. The buffer film 104 is formed in order to exclude influences of a chemical contaminant such as boron attached to surfaces of the first insulating film 102 and second insulating film 103 and improve the adhesiveness. Therefore, even a thin buffer film has a sufficient effect. Typically, it is enough to set the thickness of the buffer film to 5 to 50 nm (20 nm or more is more preferable in order to improve the blocking effect for chemical contamination).

In this case, it is preferable to set the thickness of the amorphous semiconductor film 105 to a value equal to or more than the depth of a concave portion formed by the second insulating film 103 (corresponding to the step d in FIG. 1B). That is, it is preferable that the step d of the second insulating film 103 and the film thickness t02 of the amorphous semiconductor film 105 at the concave portion 103a have a relation of d≧t02. However, when d is excessively larger than t02, it is necessary to pay attention to the fact that a crystalline semiconductor film does not remain on the convex portion 103b. It is possible to use a compound or alloy of silicon and germanium or a compound or alloy of silicon and carbon for an amorphous semiconductor film.

Then, FIGS. 2A to 2C are described below. FIG. 2A is a top view, FIG. 2B is a sectional view taken along the line A–A' in FIG. 2A, and FIG. 2C is a sectional view taken along the line B–B' in FIG. 2A. FIGS. 2A to 2C show states in which the amorphous semiconductor film 105 is crystallized after the above amorphous semiconductor film 105 is formed by a continuous-oscillation laser beam.

In the above process, a linear laser beam is applied to the amorphous semiconductor film 105 by condensing the laser beam to an energy density at which the film 105 is melted. Moreover, an irradiation region with the linear laser beam (hereafter referred to as laser irradiation region) 106 is irradiated so that the moving direction of the irradiation region becomes diagonal to the longitudinal direction of it. It is preferable to set the angle formed between the longitudinal direction and moving direction to 45±25° (more preferably, 45±15°). Because the moving direction of the laser irradiation region 106 is a direction along the second insulating film 103, the longitudinal direction of the laser irradiation region 106 is formed diagonally to the second insulating film 103. Moreover, in this case, it is obtained as the knowledge of the present inventor et al. that crystal growth progresses in the direction vertical to the longitudinal direction of the laser irradiation region 106 and the crystal orientation of the crystal growth is the direction <110>.

As for a linear laser beam, it is particularly preferable to apply a laser beam using a continuous-oscillation-laser oscillator as a light source. The laser beam to be used is a laser beam linearly condensed by an optical system and expanded in the longitudinal direction so as to have a region in which the intensity distribution is uniform in the longitudinal direction and a slight distribution in the crosswise direction.

For example, one of conditions for crystallization is a condition of using a YVO$_4$ laser oscillator in the continuous oscillation mode, thereby condensing the output of 5 to 10 W of the second harmonic (wavelength of 532 nm) of the oscillator to a linear laser beam in which the ratio of the longitudinal direction to the crosswise direction is equal to or more than 10, moreover condensing the linear laser beam so as to have an energy density distribution uniform in the longitudinal direction, and crystallizing an object by scanning the object at a rate of 5 to 200 cm/sec. A uniform energy-density distribution does not exclude a completely constant distribution. A range allowed in an energy density distribution is kept at ±10%.

Moreover, it is allowed to complete crystallization by a linearly-condensed laser beam through only one-time scanning (that is, one way) or through reciprocal scanning in order to further improve crystallinity. Furthermore, after crystallizing the silicon film by the laser beam, it is allowed to apply the same crystallization to the film by removing oxide from the film by hydrofluoric acid or treating the surface of the film by an alkaline solution such as ammonia hydrogen peroxide solution treatment, and selectively removing a low-quality portion having a high etching rate from the film. Crystallinity can be improved in this way.

Furthermore, it is preferable not to crystallize a position such as an end of a substrate on which a marker to be used for mask alignment of patterning will be formed later at the time of crystallization. This is because the transmission coefficient of visible light is raised in the case of a crystalline semiconductor film (particularly, crystalline silicon film) by crystallizing the film and thereby, it is difficult to identify a marker. However, the above mentioned is not a problem when performing the alignment control for optically identifying the difference between contrasts due to the step of a marker.

A laser oscillator uses a rectangular-beam solid laser oscillator and most preferably uses a slab laser oscillator. A slab material uses a crystal such as Nd:YAG, Nd:GGG (gadolinium, gallium, garnet), or Nd:GsGG (gadolinium, scandium, gallium, garnet). A slab laser beam progresses through the flat laser medium in a zigzag optical path while repeating total reflection. Moreover, it is allowed to use a solid laser oscillator using a rod doped with Nd, Tm, or Ho, particularly a laser oscillator obtained by combining a slab-structure amplifier with a solid laser oscillator using the crystal such as the crystal of YAG, YVO$_4$, YLF, or YAlO$_3$ doped with Nd, Tm, or Ho.

In the present invention, the term "linear" denotes a case in which the ratio of the crosswise length of the laser irradiation region 106 to the longitudinal length of it is 1/10 or less. Moreover, though only a part is illustrated in FIG. 2, it is allowed that an end of the irradiation region 106 of a linear laser beam is rectangular or a shape having a curvature.

Furthermore, it is preferable that the wavelength of a continuous-oscillation laser beam ranges between 400 and 700 nm by considering the light absorption coefficient of an amorphous semiconductor film. The beam in the above wavelength band can be obtained by using a wavelength conversion element and thereby fetching second and third harmonics of a basic wave. The wavelength conversion element uses one of ADP (ammonium dihydrogen phosphate), Ba$_2$NaNb$_5$O$_{15}$ (barium sodium niobate), CdSe (selenium cadmium), KDP (potassium dihydrogen phosphate), LiNbO$_3$ (lithium niobate), Se, Te, LBO, BBO, and KB$_5$. Particularly, it is preferable to use LBO. As a typical example, the second harmonic (532 nm) of an Nd:YVO$_4$ laser oscillator (basic wave of 1064 nm) is used. The oscillation mode of a laser uses a single mode which is a TEM mode.

In the case of silicon selected as a most suitable material, a region having an absorption coefficient of $10^3$ to $10^4$ cm$^{-1}$ is almost present in a visible light region. A substrate having a high visible-light transmission coefficient such as glass and an amorphous semiconductor film formed by silicon at a thickness of 30 to 200 nm can be crystallized by irradiating them with the light in a visible-light region having a wavelength of 400 to 700 nm and thereby selectively heating the semiconductor film without damaging a ground insulating film. Specifically, because the penetration depth of the light having a wavelength of 532 nm is approx. 100 to 1,000 nm to an amorphous silicon film, the depth can be sufficiently reached to the inside of the amorphous semiconductor film 105 formed at a thickness of 30 to 200 nm. That is, it is possible to heat the semiconductor film from the inside and therefore, uniformly heat almost the whole of the semiconductor film in a laser-beam irradiation region.

The laser irradiation region 106 is scanned along the second insulating film 103 while keeping an angle of 45±25° formed between the longitudinal direction of the region 106 and the direction in which the second insulating film 103 extends and a melted semiconductor is poured into a concave portion because a surface tension works and is solidified. Under the solidified state, the surface is almost flattened as shown in FIG. 2B. This is because when a semiconductor is once melted, the interface between the melted semiconductor and a vapor phase reaches a balanced state independently of a position on a convex portion or concave portion and a flat surface is formed. Moreover, a crystal growth end and a crystalline interface are formed on a second insulating film (on a convex portion). Thus, a crystalline semiconductor region 107 is formed. Symbol 107a denotes a high-crystallinity semiconductor region formed on a concave portion (hereafter referred to as first crystalline semiconductor region) and 107b denotes a crystalline semiconductor region inferior in crystallinity formed on a convex portion (hereafter referred to as second crystalline semiconductor region).

In the above crystallization process, when the second insulating film is a soft insulating film (low-density insulating film), the effect of moderating a stress due to contraction of a semiconductor film when crystallized can be expected. However, when the second insulating film is a hard insulating film (high-density insulating film), a stress is generated against the semiconductor film to be contracted or inflated. Therefore, stress and strain are easily left in the crystallized semiconductor film and they may cause a crystal defect. For example, in the case of the publicly-known graphoepitaxial art (M. W. Geis, D. C. Flanders, H. I. Smith: Appl. Phys. Lett. 35(1979) pp 71), concave and convex portions are directly on a substrate and are directly formed on hard quartz. In this case, however, it is impossible to moderate thermal contraction or stress due to crystallization and therefore, a strain due to a stress or a defect due to transfer may occur. Moreover, because quartz is expensive, the quartz is improper to achieve the object of the present invention of fabricating an inexpensive semiconductor device.

However, the present applicant uses a soft insulating film by the CVD or PVD method in order to form concave and convex portions on an inexpensive glass substrate by just considering the above points. By using a material softer than quartz glass for a second insulating film serving as a ground, the art of the applicant is different from the above publicly-known graphoepitaxial art in that the art of the applicant purposes moderation of a stress for crystallization.

The insulating film softer than quartz glass denotes an insulating film having an etching rate higher than quartz glass (quartz glass industrially used as a substrate) under the same measuring condition or an insulating film having a low hardness under the same measuring condition. It is allowed that the above etching rate and hardness are relatively compared with quartz glass. Therefore, the absolute value of an etching rate is not a problem. Thus, the etching rate or hardness does not depend on an etching-rate measuring condition or hardness measuring condition.

For example, when using a silicon oxide nitride film as a second insulating film, it is preferable to use a silicon oxide nitride film formed by the plasma CVD method using $SiH_4$ gas and $N_2O$ gas as materials. In the case of the silicon oxide nitride film, an etching rate of a mixed aqueous solution containing 7.13% of ammonium hydrogen fluoride ($NH_4HF_2$) and 15.4% of ammonium fluoride ($NH_4F$) at 20° C. ranges between 110 and 130 nm/min (between 90 and 100 nm/min after heat treatment at 500° C. for 1 hr and after heat treatment at 550° C. for 4 hr).

Moreover, when using a silicon nitride oxide film as a second insulating film, it is preferable to use a silicon nitride oxide film formed by the plasma CVD method using $SiH_4$ gas, $NH_3$ gas, and $N_2O$ gas as materials. In the case of the silicon nitride oxide film, an etching rate of a mixed aqueous solution containing 7.13% of ammonium hydrogen fluoride ($NH_4HF_2$) and 15.4% of ammonium fluoride ($NH_4F$), at 20° C. ranges between 60 and 70 nm/min (between 40 and 50 nm/min after heat treatment at 500° C. for 1 hr and after heat treatment at 550° C. for 4 hr).

As described above, it is possible to concentrate strains or stresses due to crystallization on a region other than a concave portion by forming a linear stripe pattern having concave and convex portions by an insulating film, depositing an amorphous semiconductor film on the stripe pattern, melting the semiconductor film by irradiation with a laser beam and then crystallizing the semiconductor film and pouring the melted semiconductor film into a concave portion and solidifying the semiconductor film and thus, form selectively a region having a low crystallinity such as a crystalline interface. Moreover, it is possible to use a semiconductor region having a high crystallinity as a region in which carriers are moved such as the channel-forming region of a thin-film transistor.

Thereafter, it is preferable to perform a heat treatment at 500 to 600° C. and remove strains from a crystalline semiconductor film. These strains are produced due to volumetric contraction of a semiconductor caused by crystallization or mismatching of thermal stress or lattice with a ground. It is allowed to use a normal heat treating system for the above heat treatment. For example, it is allowed to perform a treatment for 1 to 10 min by using the gas-heating instantaneous annealing (RTA) method. The above process is not an indispensable requisite for the present invention but can be performed when necessary.

Figure 3A:
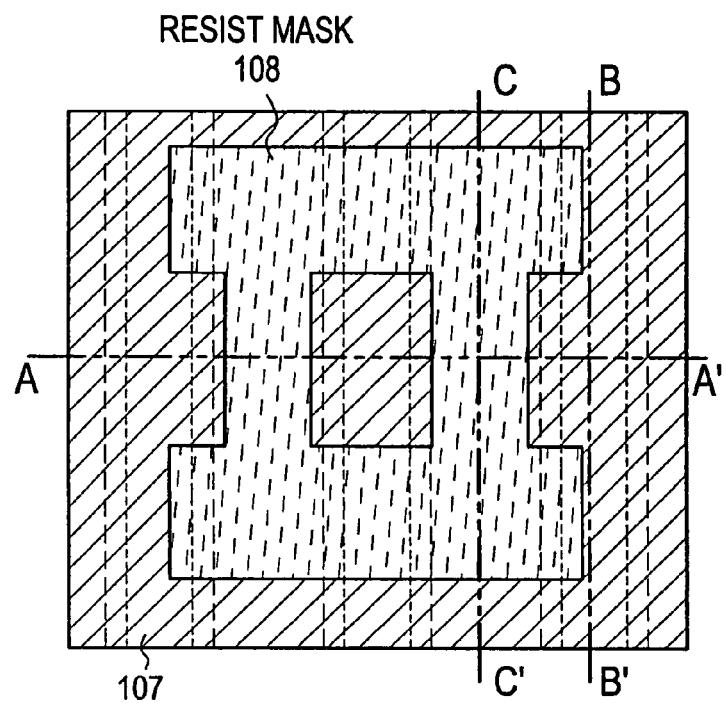
FIGS. 3A to 3D are a top view and longitudinal sectional views for explaining fabrication steps of a transistor of the present invention.
Figure 3B:
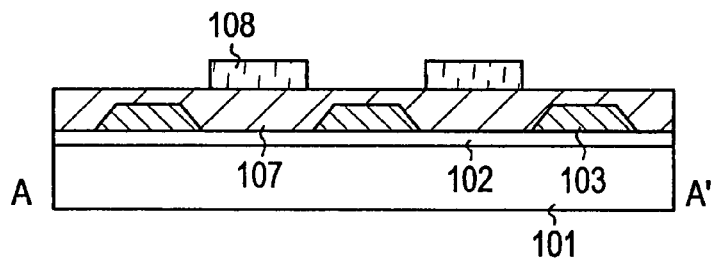
Figure 3C:
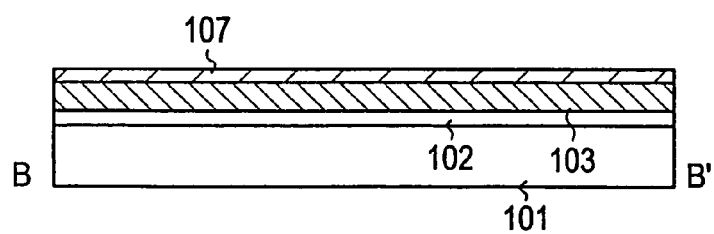
Figure 3D:
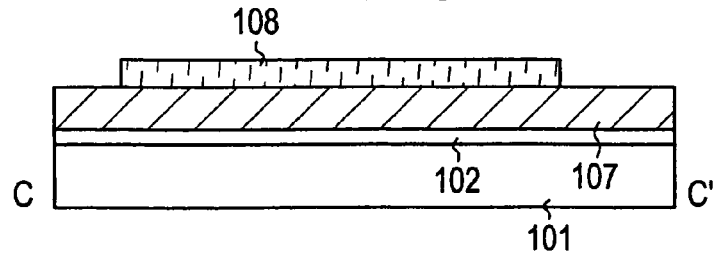

Then, FIGS. 3A to 3D are described below. FIG. 3A is a top view, FIG. 3B is a sectional view taken along the line A–A' in FIG. 3A, FIG. 3C is a sectional view taken along the line B–B' in FIG. 3A, and FIG. 3D is a sectional view taken along the line C–C' in FIG. 3A. FIGS. 3A to 3D show states of applying patterning for demarcating a semiconductor region serving as the active layer of a thin-film transistor onto a crystalline semiconductor film 107.

In FIG. 3A, a resist mask 108 is formed so as to cover concave and convex portions of a second insulating film 103. This is because it is not a problem to practically use even a crystalline semiconductor film inferior in crystallinity formed on a convex portion of the second insulating film 103 as an electrode. That is, by positively using the source region or drain region of a thin-film transistor as an electrode, it is possible to secure the design margin of a contact portion between the source region or drain region and an electrode connected to each region (source electrode or drain electrode). Moreover, by securing the design margin, it is possible to improve the integration degree of a thin-film transistor.

Figure 4A:
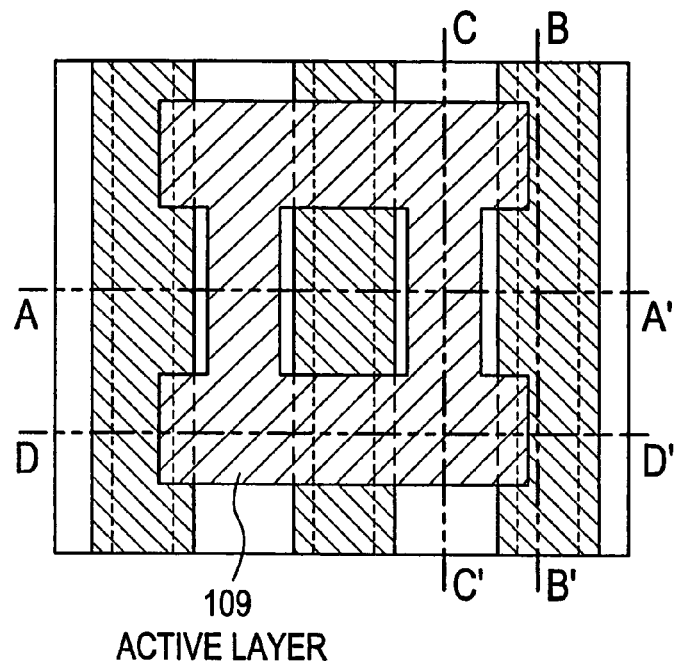
FIGS. 4A to 4E are a top view and longitudinal sectional views for explaining fabrication steps of a transistor of the present invention.
Figure 4B:
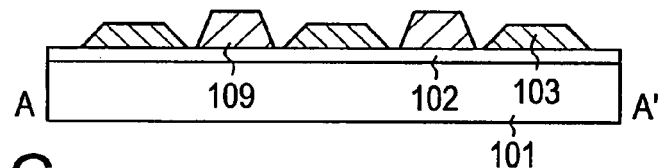
Figure 4C:
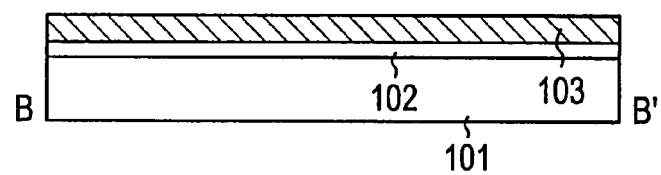
Figure 4D:
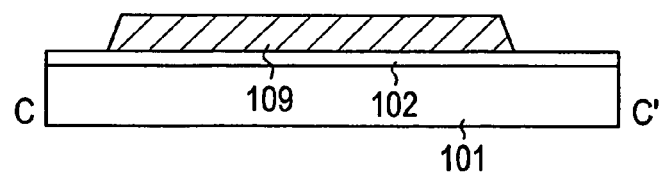
Figure 4E:
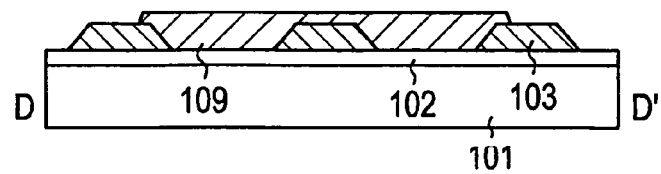

Then, FIGS. 4A to 4E are described below. FIG. 4A is a top view, FIG. 4B is a sectional view taken along the line A–A' in FIG. 1A, FIG. 4C is a sectional view taken along the line B–B' in FIG. 4A, FIG. 4D is a sectional view taken along the line C–C' in FIG. 4A, and FIG. 4E is a sectional view taken along the line D–D' in FIG. 4A. FIGS. 4A to 4E show states in which the active layer 109 of a thin-film transistor is formed through dry etching or wet etching after patterning the crystalline semiconductor film 107.

It is possible to selectively etch the crystalline semiconductor film 107 and a buffer film 104 by using a fluorine-based gas and oxygen as etching gases. It is a matter of course that there is no problem when only the selectivity with a first insulating film 102 below the buffer film 104 can be secured even if the buffer film 104 is etched. It is allowed to etch the crystalline semiconductor film 107 or buffer film 104 by the plasma etching method using a mixed gas of $CF_4$ and $O_2$ as an etching gas or apply the plasmaless gas etching to the film 107 or 104 by using a halogen-fluoride gas such as $ClF_3$ gas without exciting it. The plasmaless gas etching is a more effective technique for preventing a crystal defect because it does not give any plasma damage to a crystalline semiconductor film.

Moreover, when forming the active layer 109, it is preferable to taper an end (edge) of the active layer. It is allowed to set a taper angle to 20 to 85° (more preferably, 40 to 60°). Thereby, it is possible to improve the coverage of a gate insulating film to be formed later and prevent a gate electrode from being disconnected or shorted.

The present invention has a feature of selectively using the first crystalline semiconductor region 107a having a high crystallinity as the channel-forming region of a thin-film transistor. The present invention has another feature that any crystalline interface is not substantially formed on the first crystalline semiconductor region though the region has a plurality of crystal orientations.

A crystalline interface or defect to be found through secoetching is not actualized on a crystalline semiconductor film obtained by executing the present invention. In other words, it is not substantially present. The secoetching is an etching technique using a secosolution (chemicals obtained by mixing $K_2Cr_2O_7$ in $HF:H_2O=2:1$ as an additive) generally known in order to actualize a crystalline interface on the surface of a crystalline semiconductor film. In this specification, secosolution denotes a solution obtained by dissolving 2.2 g of potassium dichromate ($K_2Cr_2O_7$) in 50 cc of water to prepare a solution of 0.15 mol/l, adding 100 cc of hydrofluoric-acid aqueous solution to the former solution, and diluting the former solution with water up to ⅕ concentration while secoetching denotes performing etching for 75 sec at room temperature (at 10 to 30° C.) by using the above secosolution.

Though any crystalline interface to be found through secoetching is not specified at present, it is well known that a stacking fault and a crystalline interface are preferentially etched through secoetching. It is a matter of course that there can be a grain boundary or defect not actualized through secoetching because it is not single crystal. However, because the grain boundary or defect does not influence electrical characteristic when fabricating a semiconductor element, it is estimated that the grain boundary or defect is electrically inactive. In general, an electrically-inactive grain boundary is referred to as a planar grain boundary (low-order or high-order twin crystal or corresponding grain boundary) and a grain boundary not actualized through secoetching is estimated as a planar grain boundary. From this viewpoint, it can be said that the fact that a crystalline interface or defect is not substantially present represents that any crystalline interface other than a planar grain boundary is not present.

Moreover, it is allowed to use a result obtained by an electron backscatter diffraction pattern (EBSP) for what a predominant crystal plane is. The EBSP measures the micro crystallinity of a crystal plane not only on surface orientations but also on all directions of crystal by using a detector dedicated to scanning electron microscopy (SEM), thereby irradiating the crystal plane with an electron beam, and identifying a crystal orientation by computer image-recognition in accordance with the Kikuchi line of the crystal plane (hereafter, this technique is referred to as EBSP method for convenience).

In this specification, the predominant crystal plane denotes a crystal plane which most frequently appears on a surface when performing an analysis by the EBSP method. The crystal plane includes a slight fluctuation (displacement vertical to crystal plane) in no small numbers and an angle of up to ±15° is allowed as the fluctuation in this specification. As described above, when analyzing a crystalline semiconductor film obtained by executing the present invention in accordance with the EBSP method, the plane {110} appears as a predominant crystal plane and planes {100}, {111}, and {311} appear at random as other crystal planes.

Figure 5A:
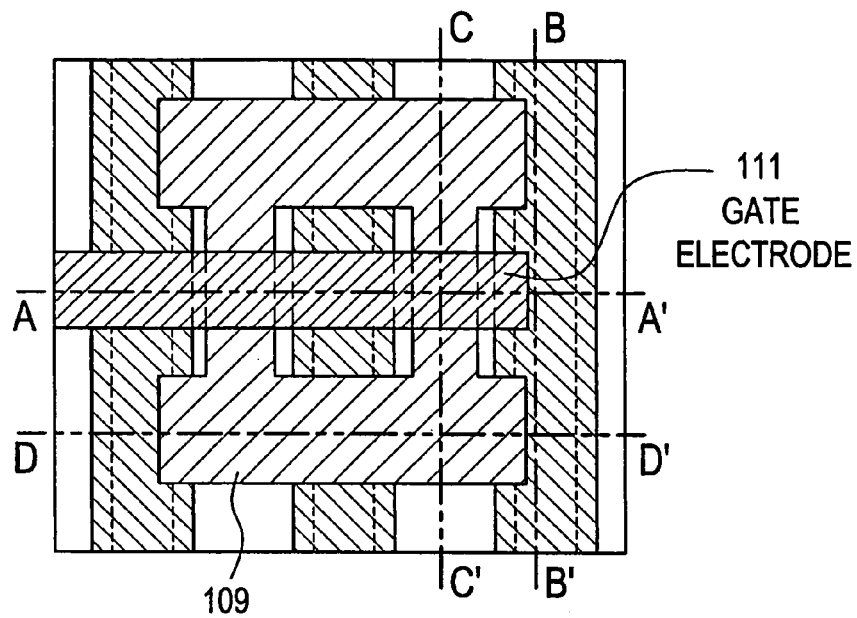
FIGS. 5A to 5E are a top view and longitudinal sectional views for explaining fabrication steps of a transistor of the present invention.
Figure 5B:
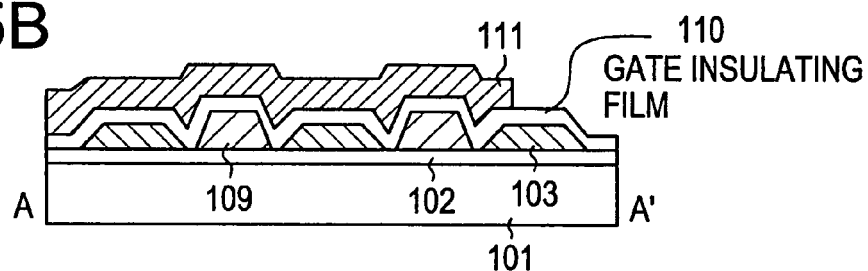
Figure 5C:
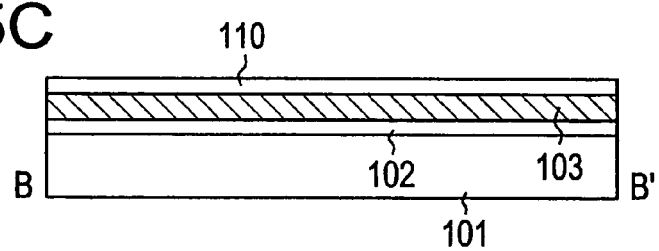
Figure 5D:
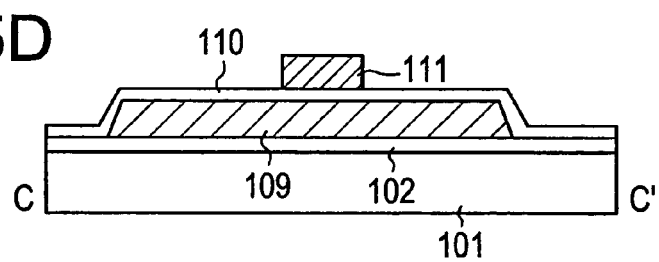
Figure 5E:
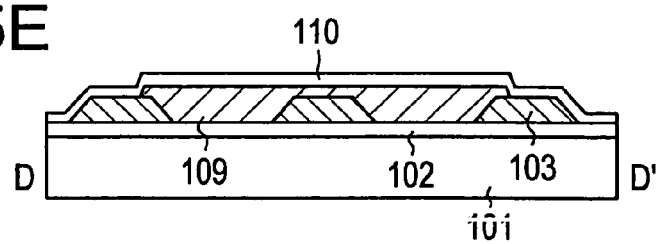

Then, FIGS. 5A to 5E are described below. FIG. 5A is a top view, FIG. 5B is a sectional view taken along the line A–A' in FIG. 5A, FIG. 5C is a sectional view taken along the line B–B' in FIG. 5A, FIG. 5D is a sectional view taken along the line C–C' in FIG. 5A, and FIG. 5E is a sectional view taken along the line D–D' in FIG. 5A. FIGS. 5A to 5E show states in which after an active layer 109 is formed, a gate insulating film 110 and a gate electrode 111 are formed.

The gate insulating film 110 can use any one of the silicon oxide film, silicon nitride film, silicon oxide nitride film, silicon nitride oxide film, aluminum nitride film, aluminum nitride oxide film, aluminum oxide nitride film, and aluminum oxide film or a laminated film obtained by properly combining these films. To improve the coverage of a gate insulating film, it is preferable to use a silicon oxide film using TEOS, an aluminum nitride oxide film formed by the RF sputtering method, or a laminated film of the aluminum nitride oxide film and silicon oxide film (it is allowed that the silicon oxide film uses a film obtained by oxidizing a semiconductor film serving as an active layer with hydrogen peroxide).

Moreover, it is allowed to form the gate electrode 111 by tungsten or an alloy containing tungsten, tantalum or an alloy containing tantalum, or aluminum or an alloy containing aluminum.

Figure 6A:
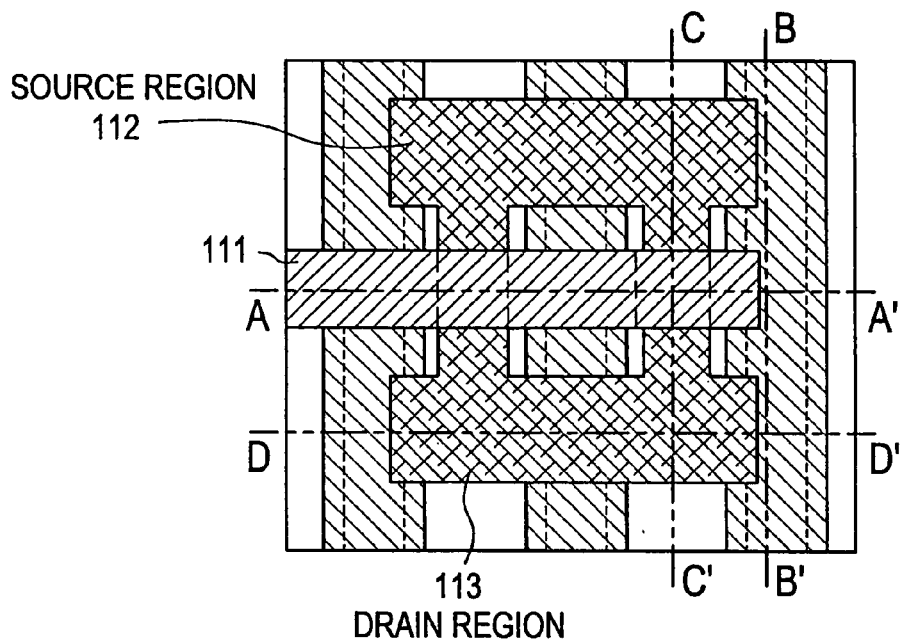
FIGS. 6A to 6E are a top view and longitudinal sectional views for explaining fabrication steps of a transistor of the present invention.
Figure 6B:
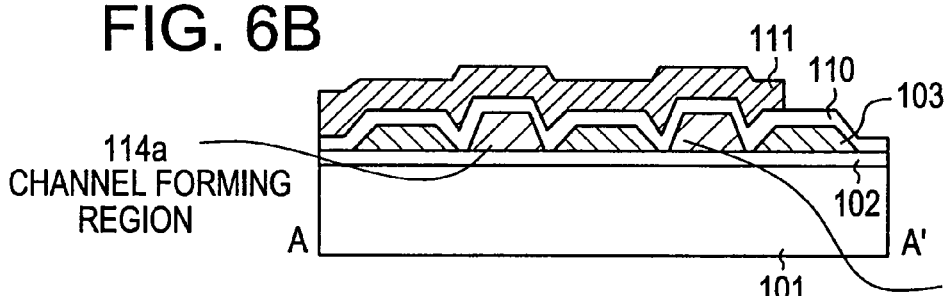
Figure 6C:
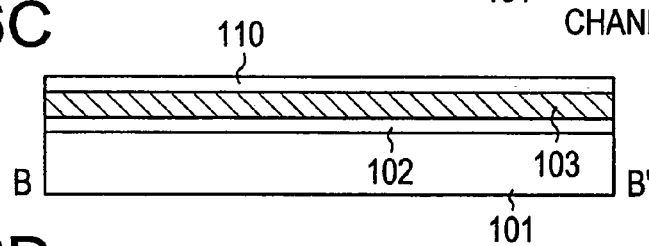
Figure 6D:
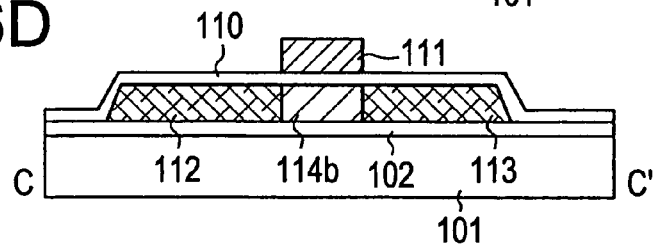
Figure 6E:
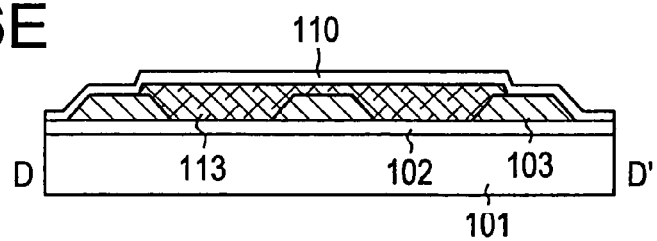

Then, FIGS. 6A to 6E are described below. FIG. 6A is a top view, FIG. 6B is a sectional view taken along the line A–A' in FIG. 6A, FIG. 6C is a sectional view taken along the line B–B' in FIG. 6A, FIG. 6D is a sectional view taken along the line C–C' in FIG. 6A, and FIG. 6E is a sectional view taken along the line D–D' in FIG. 6A. FIGS. 6A to 6E show states in which a source region 112 and a drain region 113 are formed by using the gate electrode 111 as a mask in a self-aligning manner. Moreover, channel-forming regions 114a and 114b are demarcated by the above steps.

In the case of this embodiment, an element included in the group 13 of the periodic table (typically, boron is used) is added to the source region 112 and drain region 113 in order to provide p type. However, it is also allowed to add an element included in the group 15 of the periodic table (typically, phosphor or arsenic is used) to the regions 112 and 113 in order to provide n type. It is allowed to use a publicly known method as the addition method. Moreover, it is allowed to form a low-concentration drain region (generally referred to as LDD region) when necessary.

Furthermore, after the source region 112 and drain region 113 are formed, the regions 112 and 113 are activated through furnace annealing, laser annealing, or rapid thermal annealing (RTA). It is allowed that the RTA uses annealing by infrared or ultraviolet light using a lamp light source or annealing by heated gas.

Figure 7A:
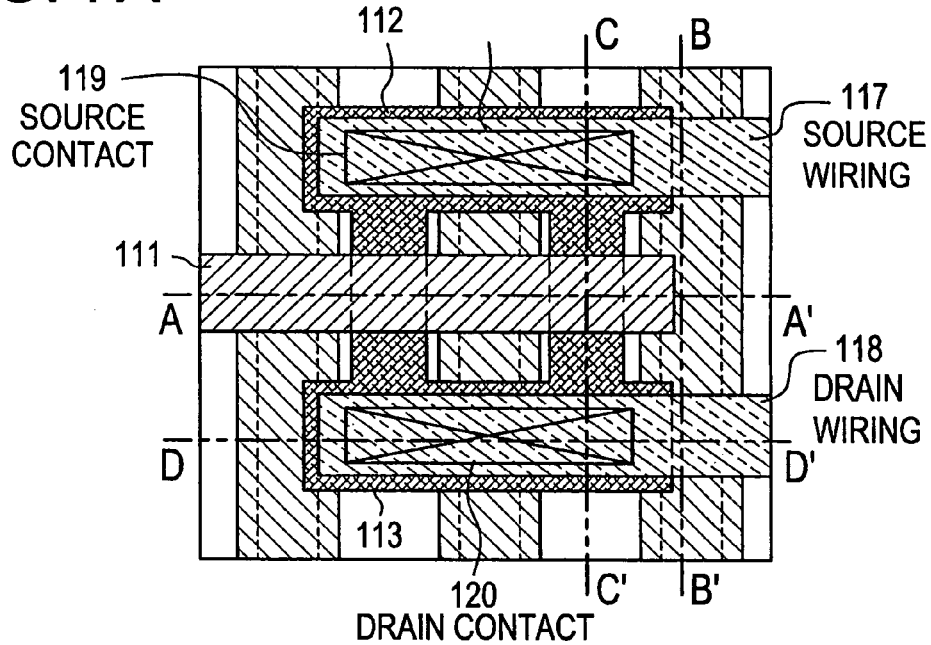
FIGS. 7A to 7E are a top view and longitudinal sectional views for explaining fabrication steps of a transistor of the present invention.
Figure 7B:
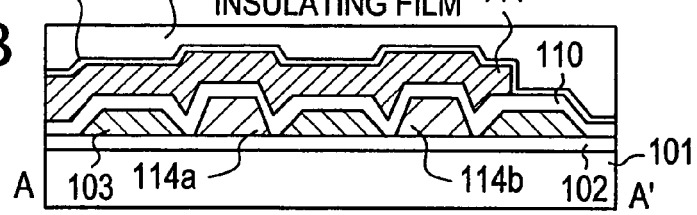
Figure 7C:
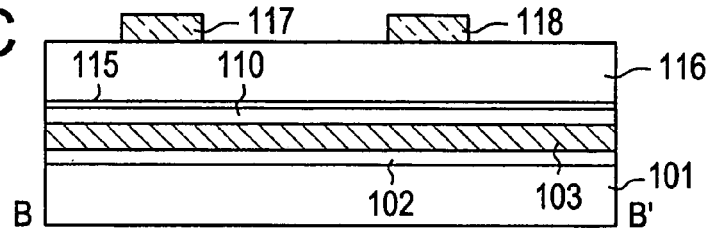
Figure 7D:
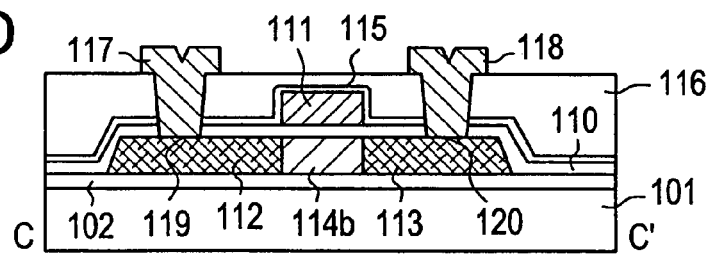
Figure 7E:
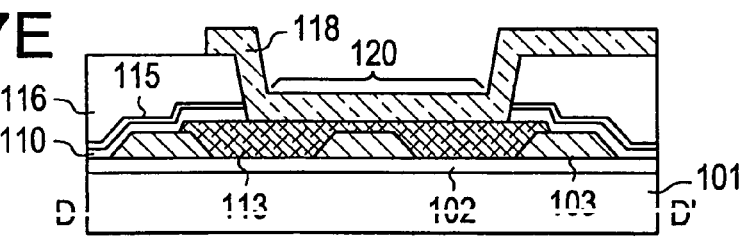

Then, FIGS. 7A to 7E are described below. FIG. 7A is a top view, FIG. 7B is a sectional view taken along the line A–A' in FIG. 7A, FIG. 7C is a sectional view taken along the line B–B' in FIG. 7A, FIG. 7D is a sectional view taken along the line C–C' in FIG. 7A, and FIG. 7E is a sectional view taken along the line D–D' in FIG. 7A. FIGS. 7A to 7E show states in which up to a source wiring 117 and a drain wiring 118 are formed and a p-channel type thin-film transistor is completed.

When the above activation step is completed, a protective film (passivation film) 115 is formed so as to cover a gate electrode 111 and the like. It is preferable to use an insulating film having high nitrogen content such as a silicon nitride film, silicon nitride oxide film, aluminum nitride film, or aluminum nitride oxide film as the protective film 115 in order to exclude influences of alkali metals and moisture.

In the case of this embodiment, the protective film 115 uses a silicon nitride oxide film (SiNxOy) and after the film 115 is formed, it is heat-treated at 400 to 450° C. Because the protective film 115 contains 15 to 25 atomic % of hydrogen, hydrogen is diffused by heat treatment and it is possible to effectively terminate dangling bonds with hydrogen even if there is any dangling bond in channel-forming regions 114a and 114b.

After the protective film 115 is formed, any one of a silicon oxide film, silicon nitride film, silicon nitride oxide film, or silicon oxide nitride film or laminated film to the above films is formed as an inter-layer film (Interlayer insulating film) 116. It is a matter of course to use a resin film as long as the film has a sufficient heat resistance. Though a film thickness is not restricted, it is preferable to use a film thickness capable of sufficiently flattening the surface of the interlayer film 116. After the interlayer film 116 is formed, it is also allowed to flatten the surface of the film 116 by publicly-known means such as CMP (chemical mechanical polishing).

Then, a contact hole is formed on the interlayer film 116 and the like to form the source wiring 117 and drain wiring 118 by an aluminum film or a laminated film of an aluminum film and other metallic film. It is a matter of course to use copper or any other low-resistance conductor instead of aluminum. Symbol 119 denotes a region in which the source region 112 and source wiring 117 are connected and which is referred to as source contact. Symbol 120 denotes a region in which the drain region 113 and the drain wiring 118 are connected and which is referred to as drain contact. In the case of this embodiment, because a source region and drain region are formed over a concave portion and convex portion formed by a second insulating film, it is possible to take a large design margin for forming a source contact 119 and a drain contact 120.

The p-channel transistor shown in FIG. 7 is a transistor having a structure in which a plurality of channel-forming regions (two channel-forming regions 114a and 114b in the case of this embodiment) are formed in parallel and which is formed in junctural manner between a pair of impurity regions (between the source region 112 and drain region 113 in the case of this embodiment), that is, having a multi-channel structure.

According to this embodiment, because a crystalline semiconductor region can be used in which any crystalline interface is not substantially present as the channel-forming region of the p-channel type transistor shown in FIG. 7, it is possible to realize a transistor capable of performing high-speed operations and having a high current driving capacity and a small fluctuation between a plurality of elements.

Embodiment 2

Then, a fabrication method of a semiconductor display of the present invention is described below.

Figure 19A:
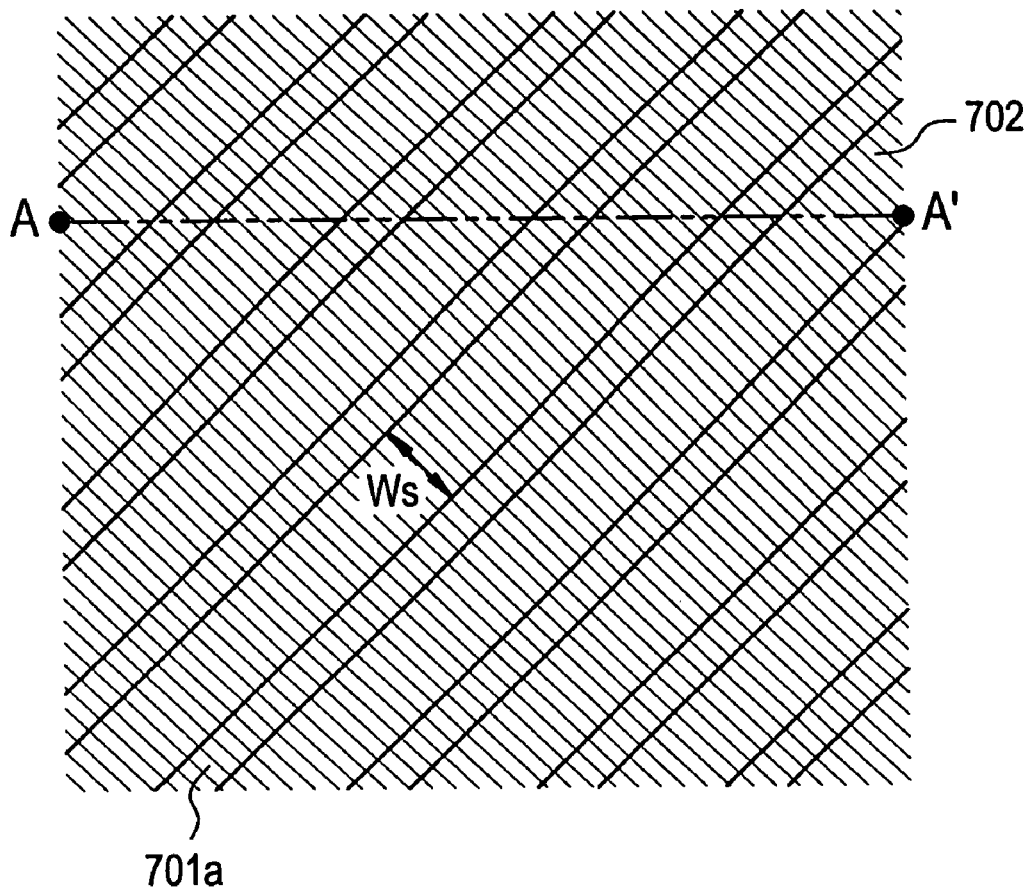
FIGS. 19A and 19B are illustrations showing fabrication steps of a semiconductor display of the present invention.
Figure 19B:
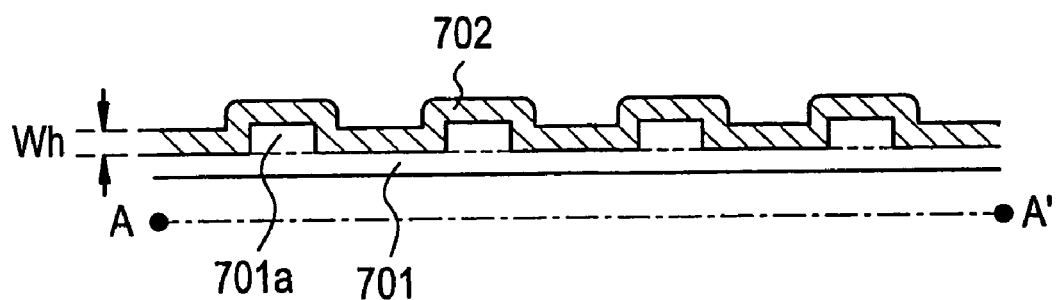

First, as shown in FIG. 19A, a ground film 701 having a rectangular or stripe-shaped convex portion 701a is formed on a substrate. The sectional view taken along the line A–A' in FIG. 19A corresponds to FIG. 19B.

A substrate (not illustrated) is allowed as long as it is made of a material capable of withstanding treatment temperatures in subsequent steps. For example, it is possible to use any one of such substrates as a quartz substrate, silicon substrate, glass substrate made of barium borosilicate glass or alumino-borosilicate glass, and substrate obtained by forming an insulating film on a metallic substrate or stainless-steel substrate. Moreover, it is allowed to use a plastic substrate having a heat resistance capable of withstanding treatment temperatures. Furthermore, it is allowed to use a flexible substrate other than a plastic substrate.

Moreover, this embodiment uses a silicon oxide film as the ground film 701. However, the material of the ground film 701 is not restricted to the silicon oxide film. It is allowed to use any material as long as it is able to withstand treatment temperatures in subsequent steps or use an insulating film capable of preventing an alkali metal affecting characteristics of a TFT from entering a semiconductor, film to be formed later and allowing concave and convex portions to be formed on the film. How to form the concave and convex portions will be described later in detail. It is also allowed to use another insulating film or an insulating film having a laminated structure of two or more layers instead of an insulating film formed by a single layer.

Then, a semiconductor film 702 is formed so as to cover the ground film 701. The semiconductor film 702 can be formed by publicly-known means (sputtering method, LPCVD method, or plasma CVD method). It is allowed that the semiconductor film uses an amorphous semiconductor film, microcrystal semiconductor film, or crystalline semiconductor film. Not only silicon, but also silicon germanium can be used. When using silicon germanium, it is preferable that the concentration of germanium ranges between 0.01 and 4.5 atomic %. Moreover, by forming the ground film 701 and thereafter continuously forming it without releasing it to atmospheric air, it is possible to prevent an impurity from entering between the semiconductor film and the ground film.

When an interval between convex portions is too large or too small, advantages of the present invention cannot be obtained. Moreover, even if a convex portion is too low, advantages of the present invention cannot be obtained. If a convex portion is too high, a semiconductor film causes film shortage in the vicinity of the edge of the convex portion. Therefore, it is important to change shapes of concave and convex portions in accordance with a purposed TFT structure. A designer can properly set the sectional shape and size of the convex portion 701a by considering the even balance with the thickness of a semiconductor film. It is preferable to set an interval between convex portions (width of concave portion) Ws to 0.01 to 2 μm, more preferably to 0.1 to 1 μm. Moreover, it is preferable to set a height Wh of a convex portion to 0.01 to 3 μm, more preferably to 0.1 to 2 μm. Furthermore, it is allowed to decrease the height of a convex portion and set Wh to 0.01 to 1 μm, more preferably to 0.05 to 0.2 μm.

Figure 20A:
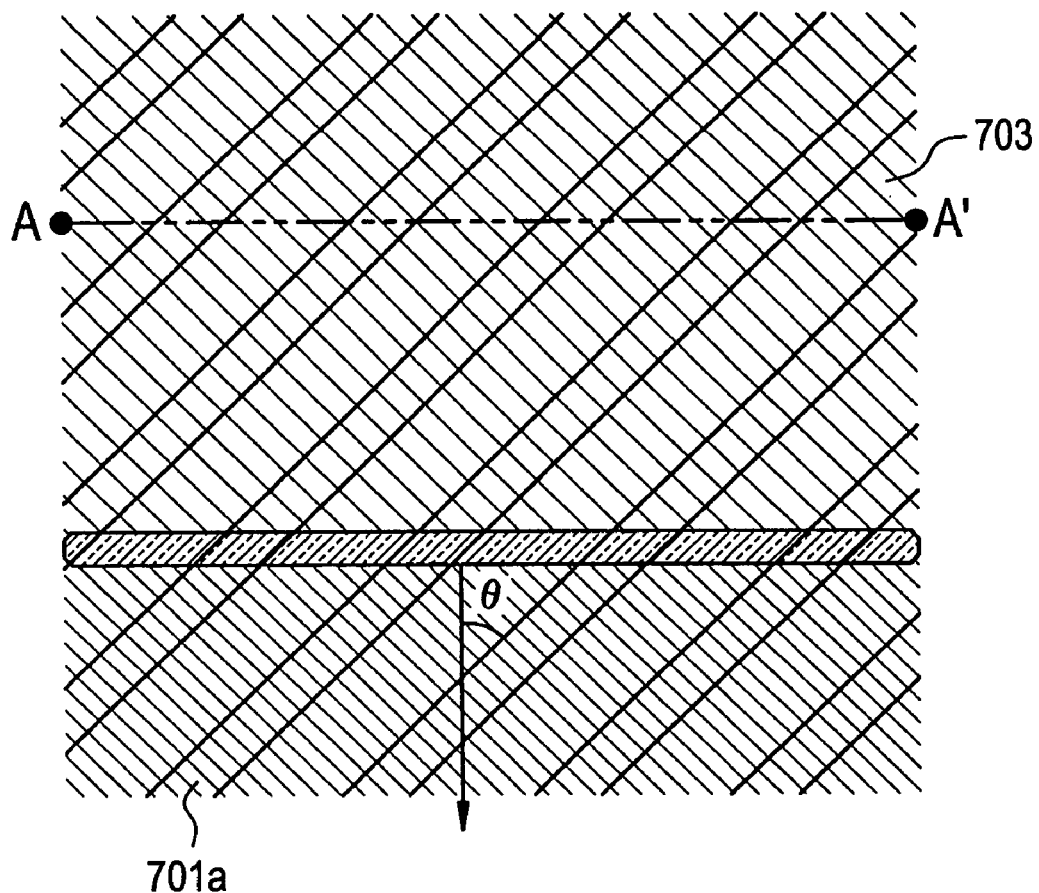
FIGS. 20A and 20B are illustrations showing fabrication steps of a semiconductor display of the present invention.
Figure 20B:
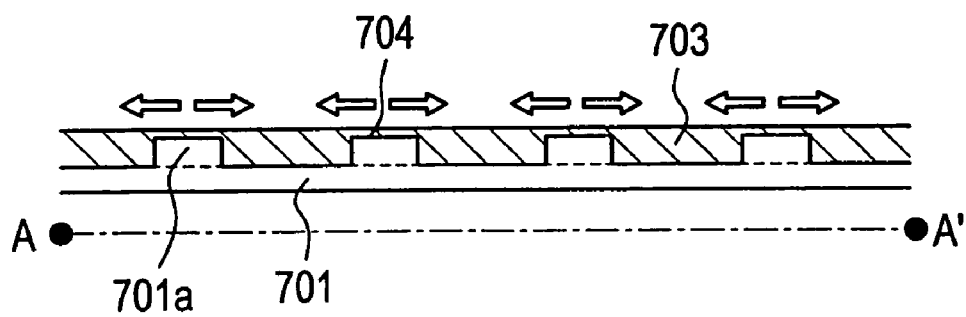

Then, as shown in FIG. 20A, a laser beam is applied to the semiconductor film 702. FIG. 20B corresponds to a sectional view taken along the broken line A–A' in FIG. 20A.

In the case of this embodiment, the scanning direction of a laser beam tilts from longitudinal directions of concave and convex portions by an angle θ=45°.

The semiconductor film 702 is temporarily melted due to irradiation with a laser beam and the volume of the film 702 moves from the upper side of a convex portion toward a concave portion as shown by white arrows in FIG. 20B. Then, a semiconductor film 703 is formed whose surface is flattened and whose crystallinity is improved. The energy density of the laser beam lowers in the vicinity of the edge of the laser beam and therefore, crystal grains are small in the vicinity of the edge and a portion (ridge) protruded along a crystalline interface appears. Therefore, the laser beam is applied so that the edge of the trace of the laser beam does not overlap with a portion serving as a channel-forming region or a portion located on a concave portion of the semiconductor film 702.

The present invention can use a publicly-known laser. It is preferable that a laser beam is continuously oscillated. However, it is estimated that some of advantages of the present invention can be obtained even if a pulse-oscillation laser beam is used. A laser can use a gas laser or solid laser. The gas laser can use any one of an excimer laser, Ar laser, Kr laser and the solid laser can use any one of a YAG laser, $YVO_4$ laser, YLF laser, $YAlO_3$ laser, glass laser, ruby laser, alexandrite laser, Ti:sapphire laser, and $Y_2O_3$ laser. The solid laser can use a laser using crystal such as YAG, $YVO_4$, YLF, or $YAlO_3$ doped with Cr, Nd, Er, Ho, Ce, Co, Ti, Yb, or Tm. The basic wave of the laser depends on a material to be doped and a laser beam having a basic wave of approx. 1 μm is obtained. A harmonic to the basic wave can be obtained by using a nonlinear optical element.

Moreover, an infrared laser beam emitted from the solid laser is converted into a green laser beam by a nonlinear optical element and then, it is possible to use an ultraviolet laser beam obtained by another nonlinear optical element.

The thickness of the semiconductor film 703 increases on a concave portion of the ground film 701 due to volume movement by irradiation with a laser beam, but the thickness of the film 703 decreases on the convex portion 701a. Therefore, a grain boundary 704 is easily formed on a convex portion due to a stress but a preferable-crystallinity state is obtained on a concave portion. The semiconductor film 703 does not always exclude a grain boundary on a concave portion. However, even if a grain boundary is present, the crystallinity becomes comparatively superior because crystal grains are large.

It is estimated that the semiconductor film on the convex portion 701a completely moves to a concave portion depending on the thickness of the semiconductor film 702. Also in this case, the advantage that a grain boundary is not easily formed on a concave portion of semiconductor film is not changed.

To crystallize a semiconductor film, it is allowed to combine the step of applying a laser beam with the step of crystallizing a semiconductor film by a catalyst. When using a catalyst element, it is possible to use the arts disclosed in official gazettes of Japanese Patent Laid-Open Nos. 130652/1995 and 78329/1996.

Figure 21A:
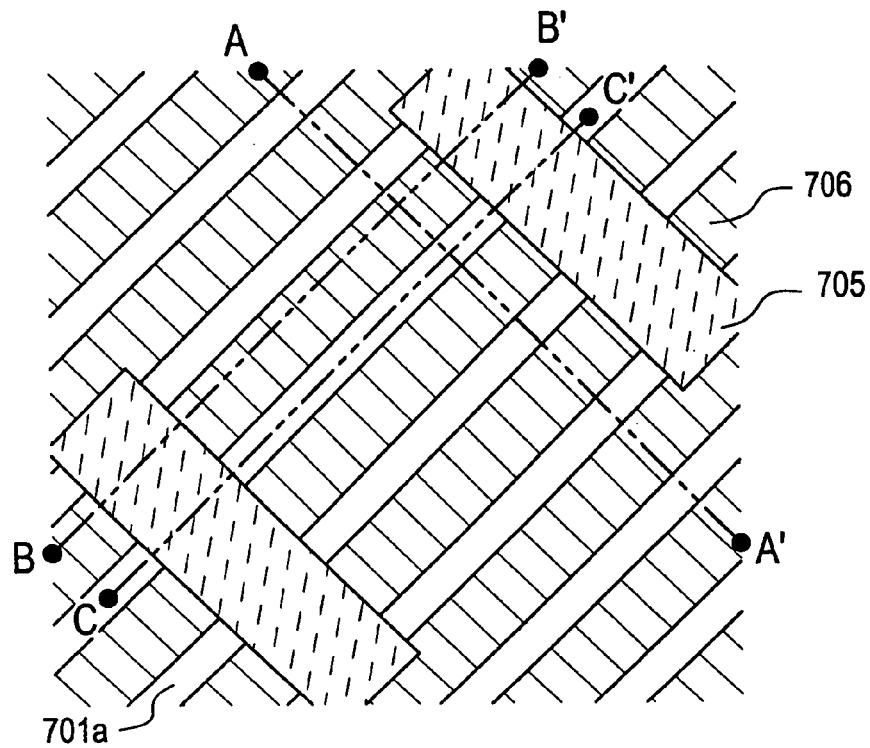
FIGS. 21A to 21D are illustrations showing fabrication steps of a semiconductor display of the present invention.

Then, as shown in FIG. 21A, the surface of the semiconductor film 703 is etched to expose the upper face of the convex portion 701a of the ground film 701. In the case of this embodiment, a semiconductor film is etched by covering a portion serving as the source region or drain region of a TFT with a mask 705 so as not to etch the portion.

Figure 21B:
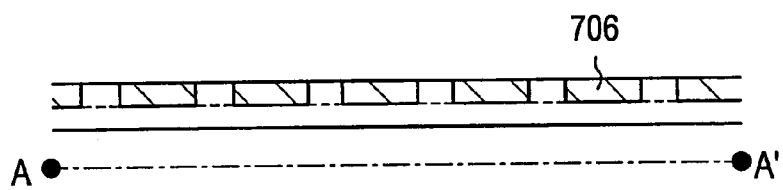
Figure 21C:
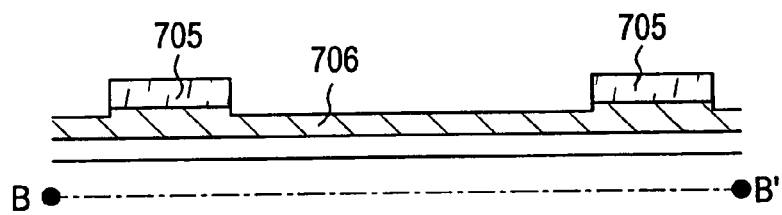
Figure 21D:
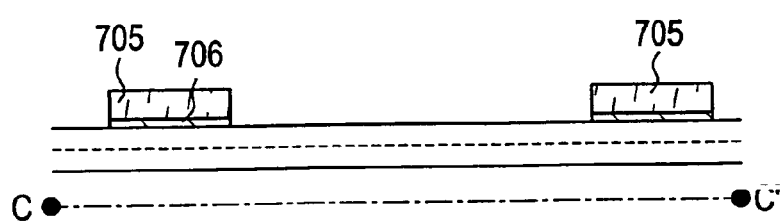

FIG. 21B corresponds to a sectional view taken along the broken line A–A' in FIG. 21A. FIG. 21C corresponds to a sectional view taken along the broken line B–B' in FIG. 21A and FIG. 21D corresponds to a sectional view taken along the broken line C–C' in FIG. 21A. Because the upper face of the convex portion 701a is exposed though the above step, the semiconductor film 706 locally separated on concave portions is formed.

A portion where a grain boundary is present on the concave portion 701a is removed from the upper face and a semiconductor film having a preferable crystallinity to serve as a channel-forming region later is left on a concave portion corresponding to the region between the convex portions 701a.

Figure 22A:
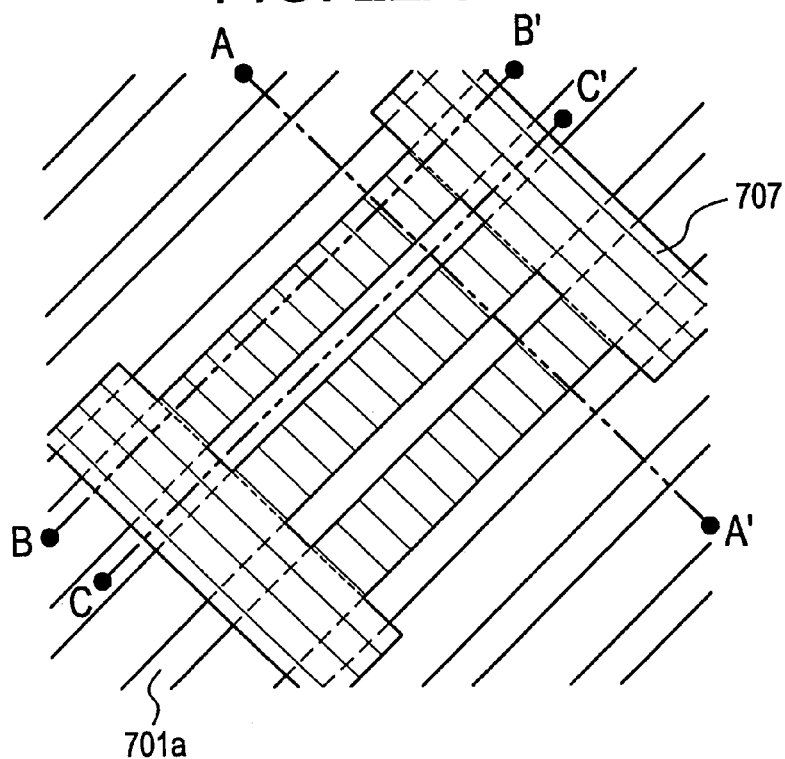
FIGS. 22A to 22D are illustrations showing fabrication steps of a semiconductor display of the present invention.
Figure 22B:
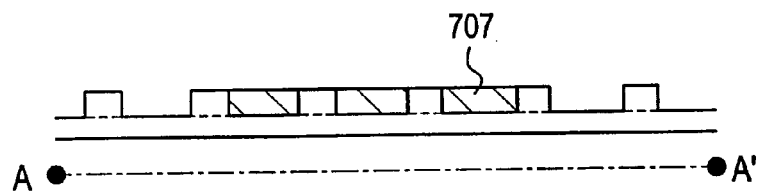
Figure 22C:
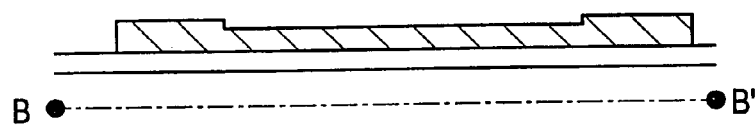
Figure 22D:
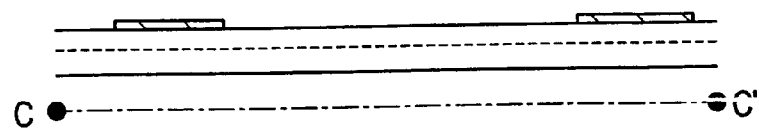

Then, as shown in FIG. 22A, by patterning the semiconductor film 706, an island-shaped semiconductor film 707 serving as an active layer is formed. FIG. 22B corresponds to a sectional view taken along the broken line A–A' in FIG. 22A. Moreover, FIG. 22C corresponds to a sectional view taken along the broken line B–B' in FIG. 22A and FIG. 22D corresponds to a sectional view taken along the broken line C–C' in FIG. 22A. A TFT formed in this embodiment is the so-called multichannel type and the slit-like island-shaped semiconductor film 707 is formed in which only a channel-forming region is separated. Specifically, a portion serving as the source or drain region of the island-shaped semiconductor film 707 uses a portion covered with the mask 705 but not etched and is superimposed on the convex portion 701a. Moreover, the film 707 has a plurality of channel-forming regions separated from each other and a source region and a drain region at the both sides of all channel-forming regions and all channel-forming regions are present on a concave portion without overlapping with the convex portion 701a. A portion serving as a source region or drain region does not have a large influence of the crystallinity of a semiconductor film on characteristics of a TFT compared to the case of a channel-forming region. Therefore, it is not a large problem that a portion serving as a source or drain region is not superior to a portion serving as a channel-forming region in crystallinity.

Though a multichannel TFT is described for this embodiment, the present invention is not restricted to the above configuration. It is allowed to use a single-channel TFT having only one channel-forming region.

It is preferable to decide the layout of the convex portion 701a by considering the channel length and channel width of the channel-forming region of a TFT.

A TFT is fabricated, by using an island-shaped semiconductor film obtained from a series of steps above described as an active layer. There are various fabrication steps and specific structures of a TFT having a plurality of channel-forming regions separated from each other. Typically, the following steps are executed: the step of adding an impurity to an island-shaped semiconductor film and forming a source region and a drain region, the step of forming a gate insulating film, and the step of forming a gate electrode.

Figure 23A:
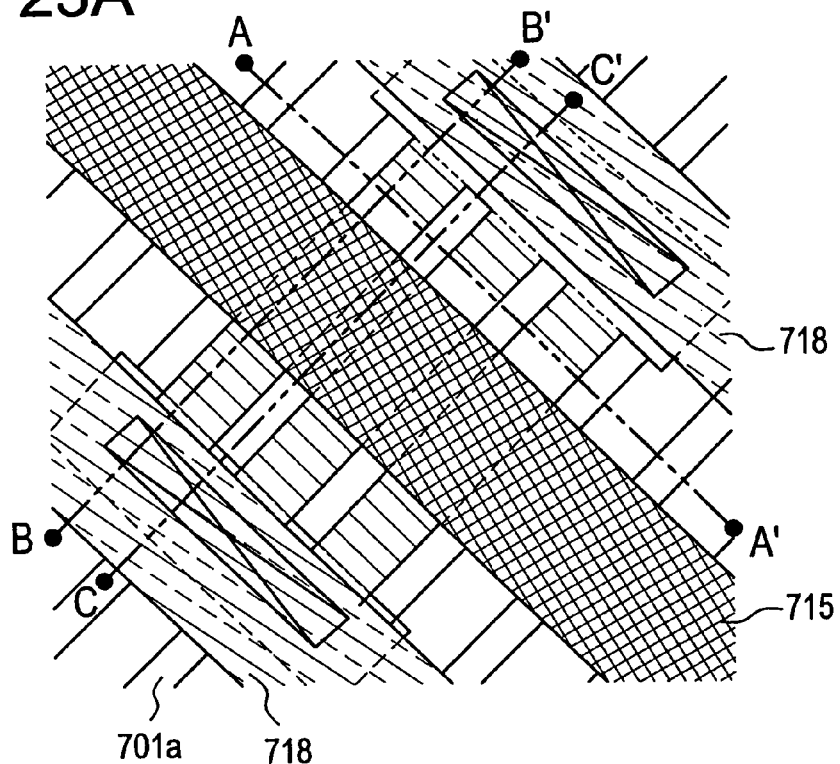
FIGS. 23A to 23D are illustrations showing fabrication steps of a semiconductor display of the present invention.
Figure 23B:
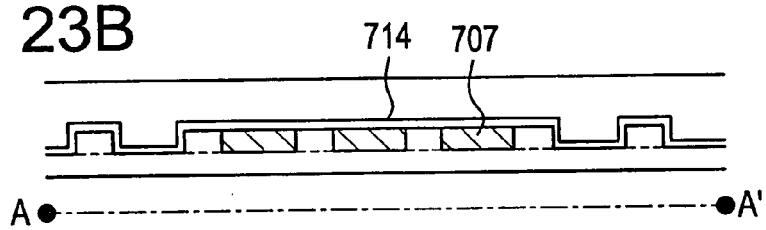
Figure 23C:
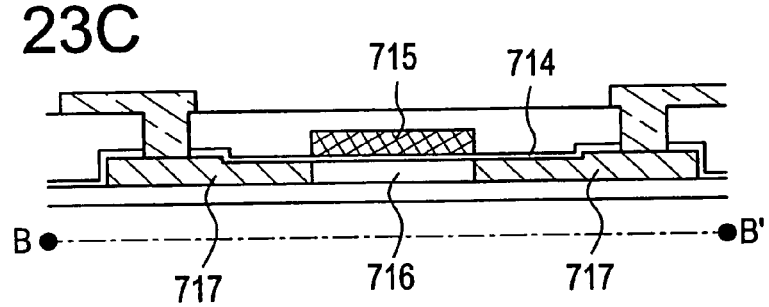
Figure 23D:
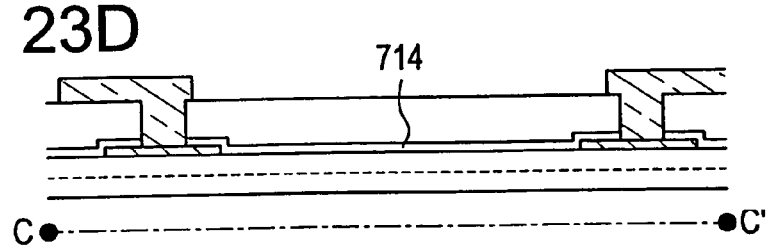

FIG. 23A shows a top view of a TFT formed by using the island-shaped semiconductor film 707 shown in FIG. 22. FIG. 23B corresponds to a sectional view taken along the broken line A–A' in FIG. 23A. FIG. 23C corresponds to a sectional view taken along the broken line B–B' in FIG. 23A and FIG. 23D corresponds to a sectional view taken along the broken line C–C' in FIG. 23A.

This embodiment has at least a gate insulating film 714 and a gate electrode 715 on the island-shaped semiconductor film 707. Moreover, at least a channel-forming region 716 and a source region and drain region 717 which hold the channel-forming region 716 between them are formed on the island-shaped semiconductor film 707. Furthermore, a wiring 718 is connected to the source and drain regions 717.

The TFT shown in FIG. 23 is only one of TFTs respectively using a semiconductor film obtained from a series of the above steps and a TFT of a semiconductor device of the present invention is not restricted to the configuration shown in FIG. 23.

Though the convex portion 701a is not removed to the last in the case of this embodiment, it is allowed to remove the convex portion 701a after crystallization. Though the convex portion can be removed through dry etching or wet etching, it is preferable to use a method suitable for the configuration of a ground film so that only the convex portion can be removed. In the case of etching, a part of an island-shaped semiconductor film may be removed or a part of a convex portion may be left.

It is important that the convex portion of the ground film and the island-shaped semiconductor film respectively use a material for which a selection ratio can be taken for etching. For example, when a ground film is formed by three ground films, in which a rectangular second ground film made of silicon oxide is formed on a first ground film made of silicon nitride and a third ground film formed by a silicon oxide film is formed so as to cover the first and second ground films, it is preferable to use dry etching using $CHF_3$ or $CF_3$ gas or wet etching using a hydrofluoric-acid-based etchant in order to remove the second and third ground films. When using dry etching, it is possible to taper the lateral face of the island-shaped semiconductor film without etching a ground film below the semiconductor film due to wraparound. When the lateral face of the island-shaped semiconductor film is tapered, it is possible to prevent an insulating film and gate electrode to be formed in subsequent steps from causing a film shortage. Moreover, when using wet etching, it is possible to remove convex portions from a ground film without etching the upper face of the island-shaped semiconductor film.

When removing convex portions, a multichannel TFT can use only a portion superior in crystallinity on a concave portion as a channel-forming region and it is possible to take large regions of the channel-forming region overlapping with a gate electrode at both sides of a gate insulating film. Therefore, it is possible to increase a channel width. By increasing the channel width, it is possible to efficiently release the heat produced by driving the TFT, while maintaining on-current.

Moreover, in the case of this embodiment, the step of forming an island-shaped semiconductor film through patterning after the step of removing the surface of a semiconductor film crystallized by a laser beam so that convex portions are exposed. However, the present invention is not restricted to the above configuration. It is also allowed to execute the step of removing the surface of an island-shaped semiconductor film so that convex portions are exposed after the step of forming the semiconductor film through patterning. Moreover, it is allowed to pattern a semiconductor film and then crystallize it by a laser.

The present invention makes it possible to prevent a grain boundary from being formed in the channel-forming region of a TFT by positively using a semiconductor film located on a concave portion of an insulating film as an active layer or channel-forming region of the TFT and moreover prevent the mobility of the TFT from being extremely deteriorated due to a grain boundary, on-current from decreasing, and off-current from increasing, and control the fluctuation of characteristic of the TFT.

It is allowed to adjust the angle between longitudinal directions of concave and convex portions and the scanning direction of a laser beam on the basis of longitudinal directions of the concave and convex portions or the scanning direction of the laser beam.

Figure 24A:
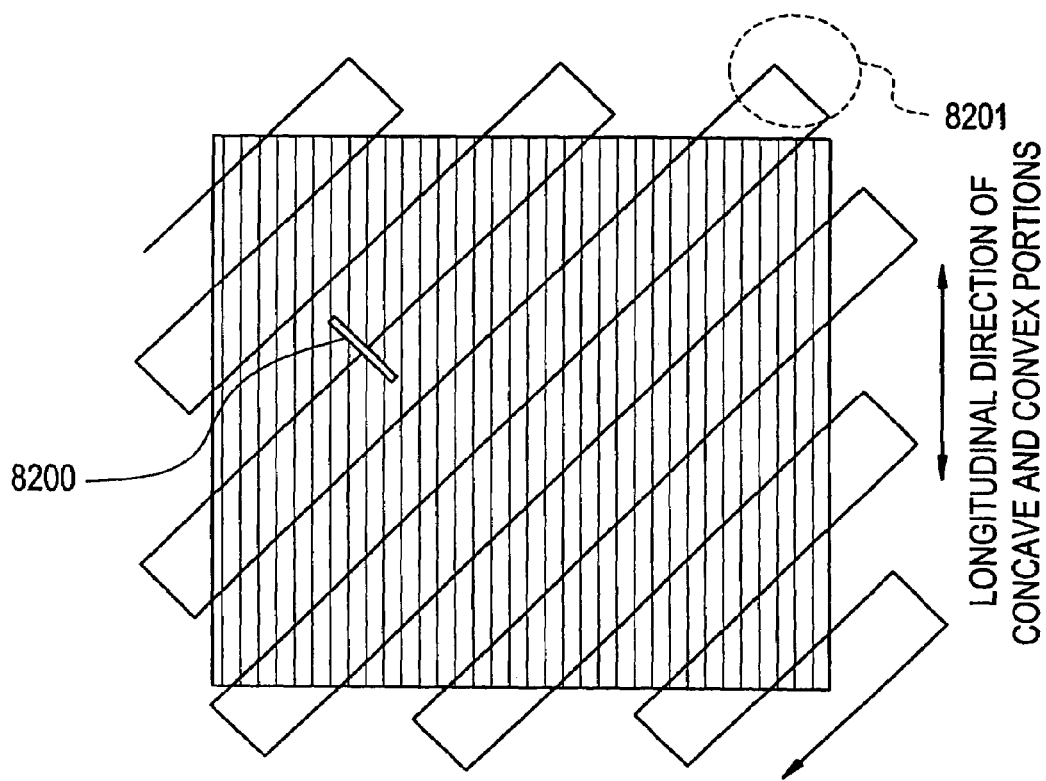
FIGS. 24A and 24B are illustrations showing scanning routes of a laser beam.

FIG. 24A shows the scanning route of a laser beam to a substrate when adjusting the scanning direction of the laser beam on the basis of longitudinal directions of concave and convex portions. In FIG. 24A, it is necessary to adjust the turnover position 8201 of a laser beam in accordance with the shape of a substrate so that the irradiation region 8200 of the laser beam is entirely scanned to the substrate. Moreover, in FIG. 24A, because longitudinal directions of concave and convex portions are kept in parallel with or vertically to one side of the substrate when the substrate is rectangular, it is comparatively easy to lay out the active layer of a TFT with no waste. Furthermore, when adjusting the angle between the longitudinal direction of concave and convex portions and the scanning direction of the laser beam, it is easy to change the scanning direction of the laser beam compared to the case of changing longitudinal directions of concave and convex portions.

Figure 24B:
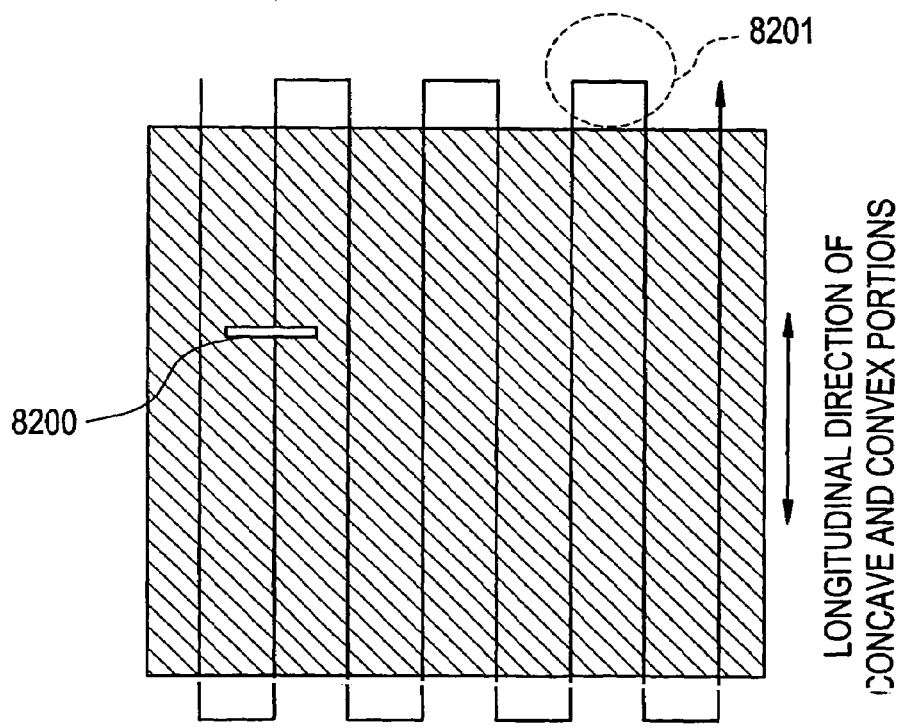

FIG. 24B shows the scanning route of a laser beam to a substrate when adjusting longitudinal directions of concave and convex portions on the basis of the scanning direction of the laser beam. In FIG. 24B, because of entirely scanning the irradiation region 8200 of the laser beam to the substrate, it is allowed to set the turnover position 8201 of the laser beam at constant intervals. Therefore, irradiation with the laser beam is comparatively easy.

When the irradiation region with a laser beam is linear or rectangular, it is not always necessary that the longitudinal direction of the irradiation region is vertical to the scanning direction with the laser beam.

Moreover, in the above steps, by etching a semiconductor film after irradiated with a laser beam or crystallized so that convex portions of a ground film are exposed and then heating the semiconductor film for 1 to 60 min at 500 to 600° C., it is possible to moderate the stress produced in the semiconductor film.

A fabrication method of the present invention makes it possible to form not only the pixel section and driving circuit of a semiconductor display but also a CPU using an LSI, memories (e.g. SRAM) of various logic circuits, a counter circuit, and a frequency-division-circuit logic. The present invention can be applied to various semiconductor devices.

An island-shaped semiconductor film of the present invention is not restricted to the configuration shown in FIG. 22. It is allowed that an island-shaped semiconductor film is present only between convex portions or locally contacts or does not contact a convex portion. Moreover, after forming an island-shaped semiconductor film so as to be present only between convex portions, it is allowed to remove only convex portions from a ground film.

Moreover, it is allowed to crystallize a semiconductor film by the thermal crystallization method using an electrically-heated oven or the lamp annealing crystallization method using infrared light and then crystallize the semiconductor film by a laser beam so that the crystallinity is further improved. Moreover, it is allowed to crystallize a semiconductor film by irradiating the semiconductor film with a laser beam having a low energy of not completely melting the semiconductor film in the film-thickness direction and then irradiate the semiconductor film with a laser beam having a high energy of completely melting the semiconductor film in the film-thickness direction.

Embodiment 3

To form a crystalline semiconductor film of the present invention, it is allowed to crystallize an amorphous semiconductor film in accordance with solid-phase growth and then moreover melt and recrystallize the amorphous semiconductor film through irradiation with a laser beam in addition to the method of crystallizing the amorphous semiconductor film through irradiation with a laser beam as shown for the embodiment 1. For example, in FIG. 2, after forming the amorphous semiconductor film 105, it is possible to crystallize the amorphous semiconductor film 105 by applying the furnace annealing treatment at 450 to 650° C. or RTA treatment (including a treatment by convected high heat gas) at 700 to 1,100° C. to the film 105, using the recystallization acceleration effect of nickel, and thereby solid-phase-growing the amorphous semiconductor film 105.

When executing this embodiment, steps of irradiating a solid-phase-grown crystalline semiconductor film with a laser beam in accordance with the embodiment 1, and thereby melting and recrystallizing the film are executed. In this case, though the crystalline semiconductor film is melted due to irradiation with the laser beam, a light absorption coefficient is hardly fluctuated. This point is greatly different from the case of directly irradiating an amorphous semiconductor film with a laser beam. That is, the fact that the fluctuation of a light absorption coefficient is small represents that the film quality is not influenced by a slight fluctuation of the irradiation energy of a laser beam. In fact, a solid-phase-grown crystalline semiconductor film has advantages that the margin for the energy density of a laser beam is wide and the productivity is high compared to the case of an amorphous semiconductor film.

The crystalline semiconductor film obtained by this embodiment also has features that the surface of the film is flattened and the predominant crystal plane is the plane {110}. Moreover, after forming the crystalline semiconductor film, it is allowed to form a thin-film transistor using the crystalline semiconductor film of a concave portion as a channel-forming region as in the case of the embodiment 1. Thus, it is possible to form a transistor capable of performing high-speed operations, having a high current-driving capacity, and having a small fluctuation between a plurality of elements.

Embodiment 4

For the embodiment 1, a case is described in which the second insulating film 103 is tapered. However, it is not always necessary to taper the film 103 but it is allowed to form a second insulating film whose lateral face is vertical as described for this embodiment.

Figure 8A:
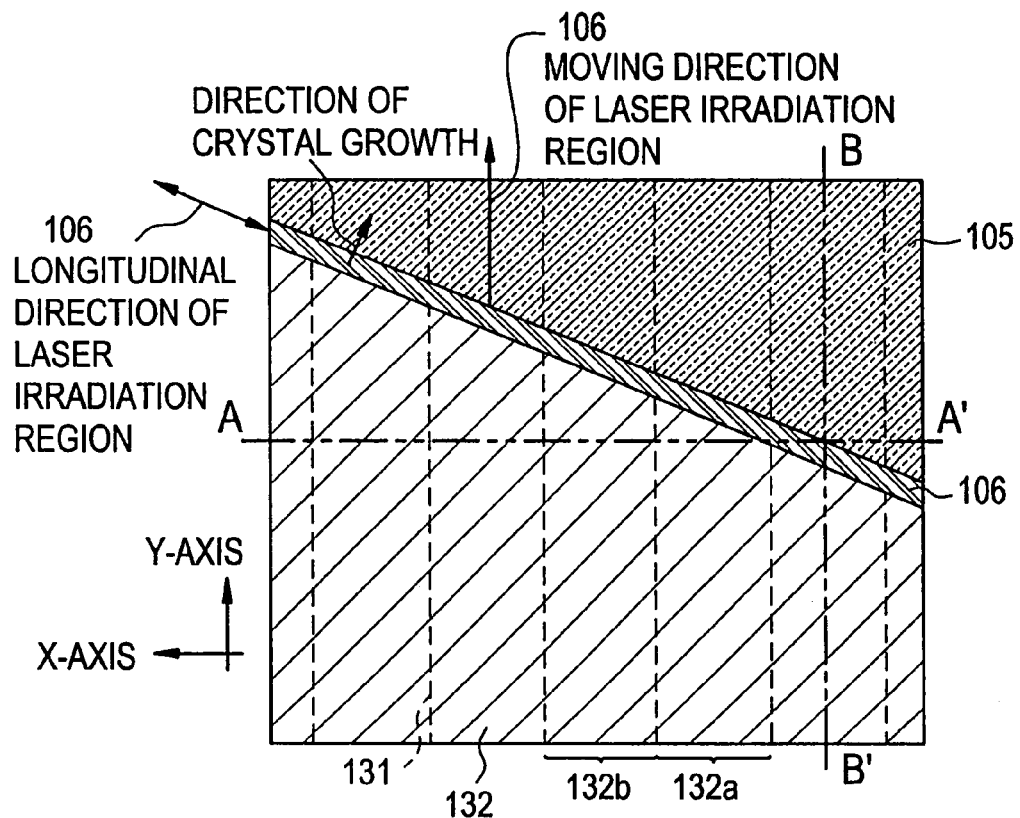
FIGS. 8A to 8C are a top view and longitudinal sectional views for explaining fabrication steps of a transistor of the present invention.
Figure 8B:
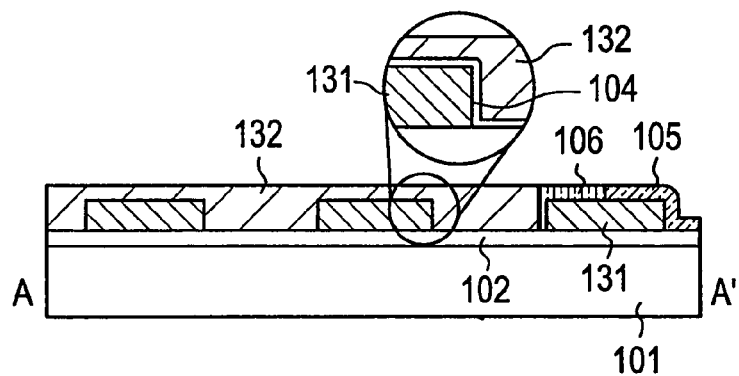
Figure 8C:
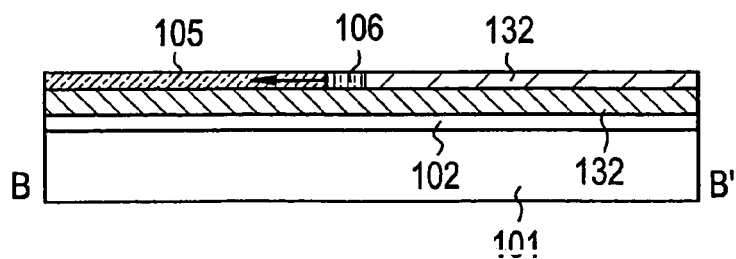

FIGS. 8A to 8C show this embodiment. For a symbol same as that in FIG. 2, it is only necessary to refer to the description of the symbol used for the embodiment 1. In FIG. 8, because the lateral face of a second insulating film 131 is vertical, the lateral face of a concave portion 132a also becomes vertical. Also in this case, it is possible to flatten a crystalline semiconductor film 132 with no problem and form a first crystalline semiconductor region on the concave portion 132a.

It is allowed to combine the configuration of this embodiment with any one of configurations of the embodiments 1 to 3.

Embodiment 5

For this embodiment, a case is described in which the moving direction of a carrier is made to coincide with the direction of crystal growth by improving the shape of a gate electrode in the embodiment 1. Though FIG. 9 is used for description, symbols same as those used for the embodiment 1 are properly used.

Figure 9A:
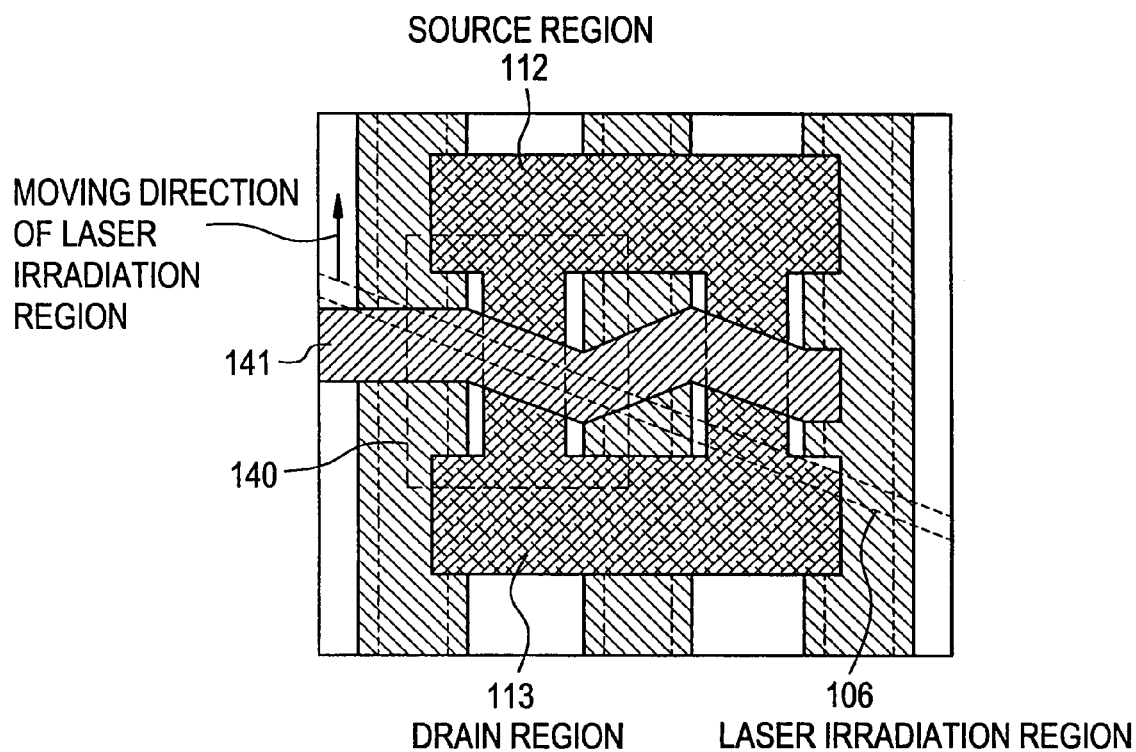
FIGS. 9A and 9B are top views for explaining fabrication steps of a transistor of the present invention.
Figure 9B:
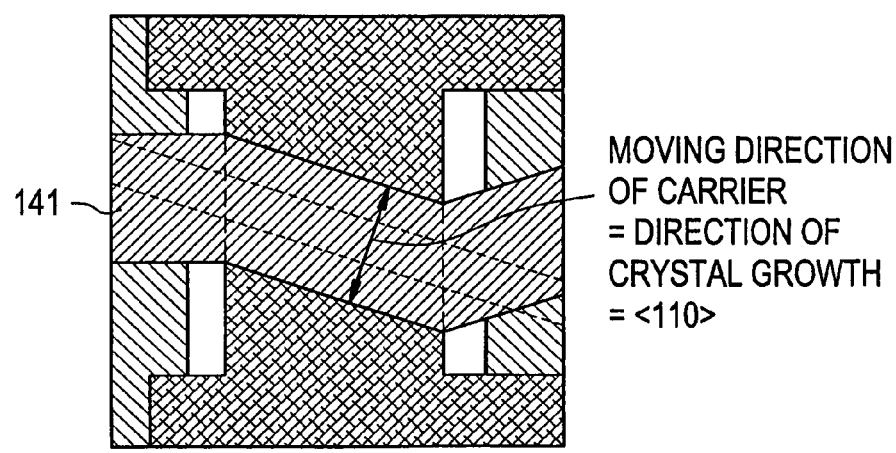

FIG. 9A is a top view corresponding to FIG. 6 of the embodiment 1 and FIG. 9B is an enlarged view of the region shown by symbol 140 in FIG. 9A. A feature of this embodiment lies in the shape of a gate electrode 141. That is, as shown in FIG. 9B, a laser irradiation region 106 and the gate electrode 141 are arranged so that the longitudinal direction of the region 106 coincides with the direction parallel with the lateral face in a part (portion constituting a channel-forming region by overlapping with a semiconductor region) of the gate electrode 141.

In this case, as shown in FIG. 9B, the gate electrode 141 is formed so as to diagonally cross a crystalline semiconductor region and the direction for connecting the minimum distance between a source region 112 and a drain region 113 (directions shown by arrows in FIG. 9B) coincides with the direction vertical to the longitudinal direction of the laser irradiation region 106, that is, the direction of crystal growth of a semiconductor film.

As described above, according to the knowledge of the present inventor et al., it is clarified that the crystal orientation in the direction of crystal growth is <110> {fluctuation of ±15° is included in the <110> axis}. Therefore, the direction shown by the arrow resultantly becomes <110>. Moreover, the direction shown by the arrow is a direction for connecting the minimum distance between the source region 112 and drain region 113, in which an electric-field intensity is maximized between the source region 112 and drain region 113. Therefore, it is estimated that the direction shown by the arrow in FIG. 9B becomes predominant as the moving direction of a carrier (electron or hole).

From the above consideration, when executing this embodiment, the moving direction of a carrier coincides with the direction <110>. That is, it is possible to obtain a p-channel thin-film transistor having the plane {110} as a predominant crystal plane and the direction <110> as a carrier moving direction.

Various studies are made on the crystal plane of single-crystal silicon and it is generally known that the plane {110} has a high hole mobility. For example, "Physics of VLSI Device; co-authored by Masatake Kishino and Mitsumasa Koyanagi, Maruzen Co., Ltd. (1995) p. 145" describes that the maximum field-effect mobility (μFE=approx. 225 cm$^2$/Vs) is obtained when a crystal plane has the plane (011) and the moving direction of a hole is parallel with <01-1>. That is, it is suggested that in a silicon substrate having the crystal plane {110}, it is possible to maximize the field-effect mobility of a p-channel transistor by forming a transistor so that the moving direction of a hole coincides with <110>.

Therefore, in the case of the p-channel thin-film transistor described for this embodiment, the hole moving direction coincides with the axis <110> and the predominant crystal plane becomes the plane {110}. Therefore, as suggested in the above document, a structure is obtained which is able to effectively improve the field-effect mobility of the p-channel thin-film transistor.

As described above, according to this embodiment, it is possible to form a thin-film transistor capable of performing high-speed operations, having a high current driving capacity, and having a small fluctuation between a plurality of elements and particularly improve characteristics of a p-channel thin-film transistor. Therefore, it is possible to fabricate a circuit having a preferable characteristic balance when constituting a CMOS circuit.

Embodiment 6

Figure 10A:
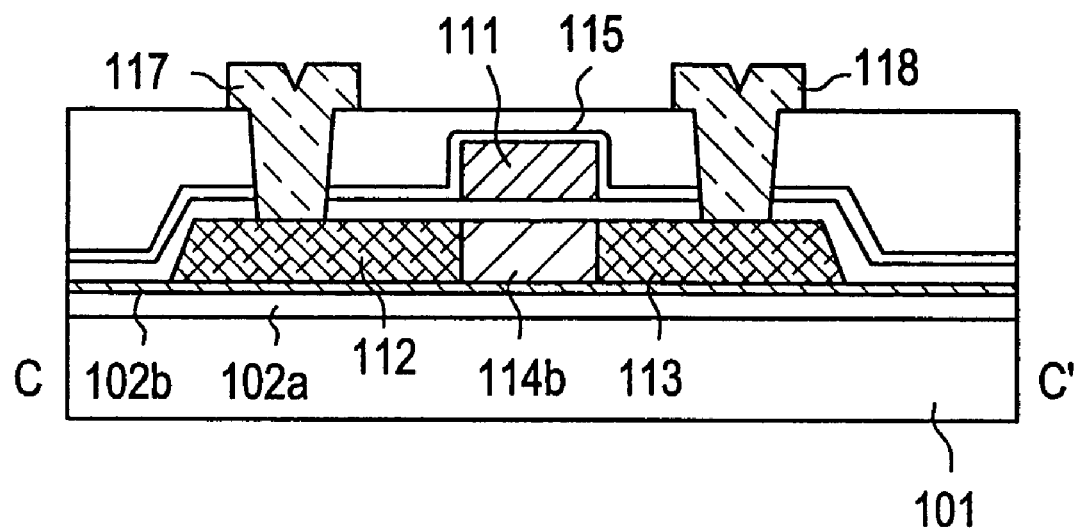
FIGS. 10A and 10B are longitudinal sectional views for explaining fabrication steps of a transistor of the present invention.
Figure 10B:
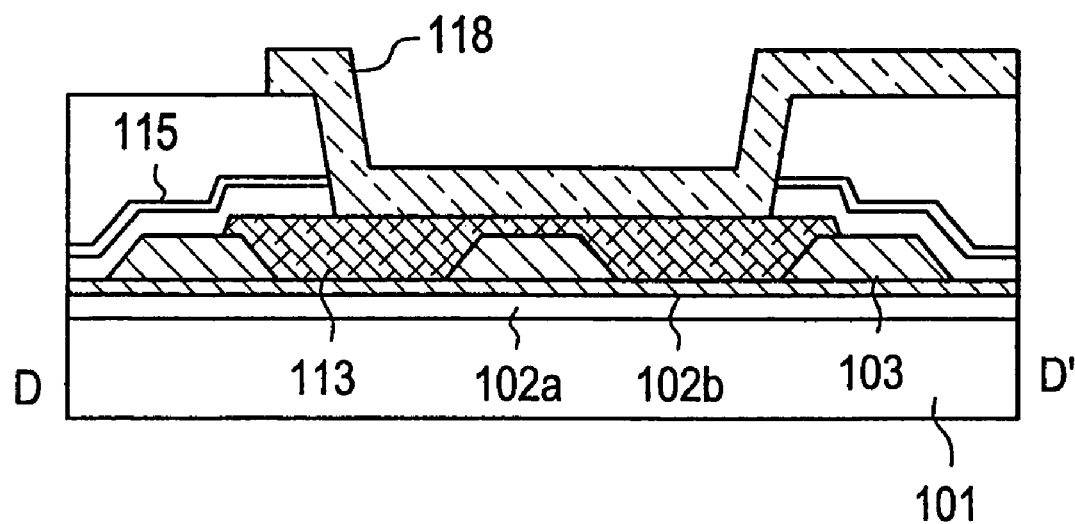

For this embodiment, a case is described in which the first insulating film 102 of the embodiment 1 is formed as a laminated film. FIG. 10A is an illustration corresponding. to a sectional view taken along the line C–C' in FIG. 7A and FIG. 10B is an illustration corresponding to a sectional view taken along the line D–D' in FIG. 7A.

In the case of this embodiment, an insulating film 102a uses one of a silicon oxide film, silicon nitride film, silicon oxide nitride film, and silicon nitride oxide film and is formed at a thickness of 20 to 30 nm. An insulating film 102b uses one of a aluminum oxide film, aluminum nitride film, aluminum oxide nitride film, and aluminum nitride oxide film and is formed at a thickness of 10 to 50 nm (more preferably, 20 to 30 nm). Particularly, because the blocking effect to sodium (Na) can be expected in the case of an aluminum oxide film, the film is effective to prevent contamination by a glass substrate.

Any combination of the insulating film 102a with the insulating film 102b is allowed. However, it is preferable that at least the insulating film 102b uses a material capable of taking a large selection ratio with a second insulating film 103 to be formed on the film 102b. Moreover, it is preferable to use a material which does not extremely release heat in a crystallization step using a laser beam. Also from this point of view, it is considered that an aluminum oxide film is preferable at present.

For this embodiment, a case of using two layers is described. However, it is needless to say that three or more layers can be used. Moreover, this embodiment can be combined with the configuration of any one of the embodiments 1 to 5.

Embodiment 7

In the embodiment 1, a transistor is shown by a single drain structure. However, it is allowed to use a low-concentration drain (LDD). FIG. 11 shows an n-channel thin-film transistor having an LDD structure.

Figure 11A:
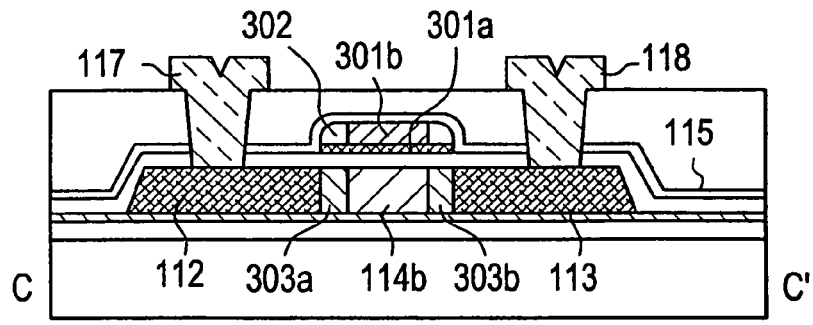
FIGS. 11A to 11C are longitudinal sectional views showing a gate structure which can be applied to a transistor of the present invention.

The structure of the transistor shown in FIG. 11A is an example of forming a gate electrode by a nitride metal 301a such as titanium nitride or tantalum nitride and a high-melting-point metal 301b such as tungsten or a tungsten alloy and a spacer 302 is set to the lateral face of the gate electrode 301b. It is allowed to form the spacer 302 by an insulator such as silicon oxide or n-type polysilicon for providing conductivity through anisotropic dry etching. By forming LDD regions 303a and 303b before forming the spacer, it is possible to form the regions 303a and 303b on the gate electrode 301b in a self-aligning manner. When forming a spacer by a conductive material, it is possible to realize a gate-overlapped LDD structure in which the LDD regions 303a and 303b are substantially superimposed on a gate electrode.

Figure 11B:
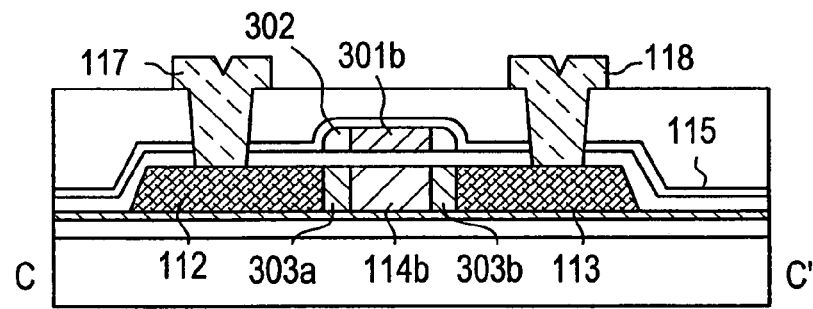

FIG. 11B shows a structure not provided with the gate electrode 301a. In this case, an LDD structure is realized.

Figure 11C:
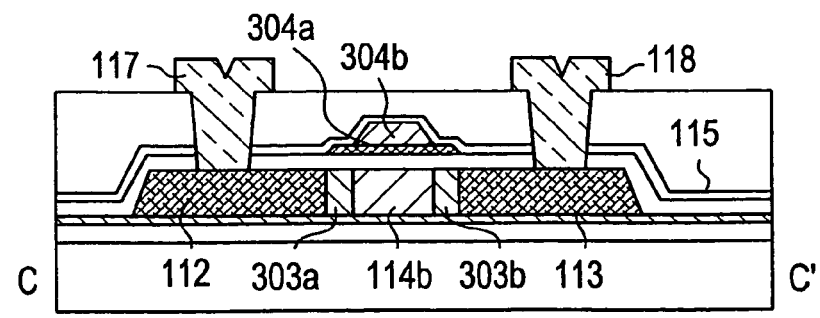

In FIG. 11C, LDD regions 303a and 303b are formed adjacently to a source region 112 and a drain region 113. In this case, a gate electrode is constituted by a double layer structure of a lower gate electrode 304a and an upper gate electrode 304b and it is possible to form the source region 112, drain region 113, and LDD regions 303a and 303b in a self-aligning manner. For the gate electrode, impurity region, and a method for forming the electrode and impurity region, refer to the official gazette of Japanese Patent Laid-Open No. 2002-014337 or 2002-324808.

A structure for forming an LDD region in a self-aligning manner by using the gate structure shown for this embodiment is particularly effective when fining a design rule. Though a single-pole transistor structure is shown above, it is also possible to form a CMOS circuit by separately forming an n-channel transistor and a p-channel transistor and combining them into the complementary type. Moreover, it is possible to combine the CMOS circuit with the configuration of any one of the embodiments 1 to 6.

Embodiment 8

Figure 12A:
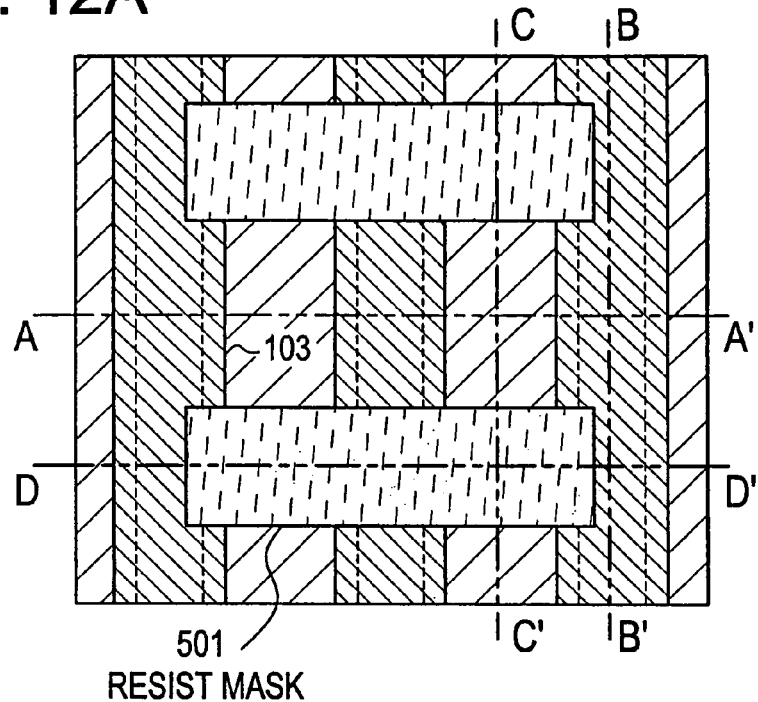
FIGS. 12A to 12E are a top view and longitudinal sectional views for explaining fabrication steps of a transistor of the present invention.
Figure 12B:
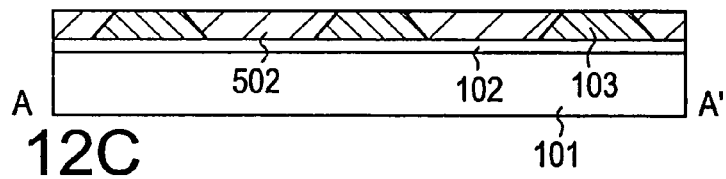
Figure 12C:
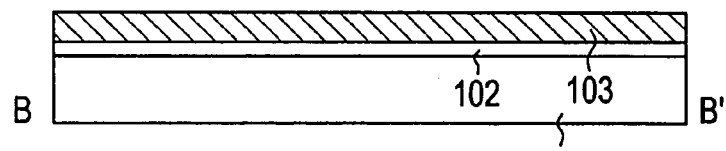
Figure 12D:
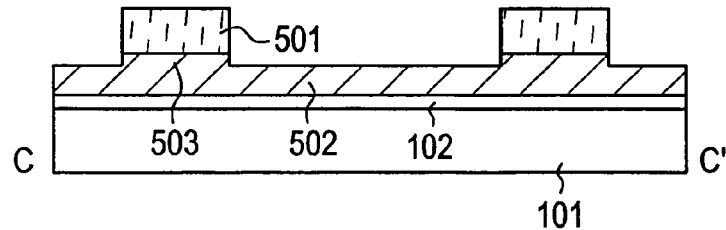
Figure 12E:
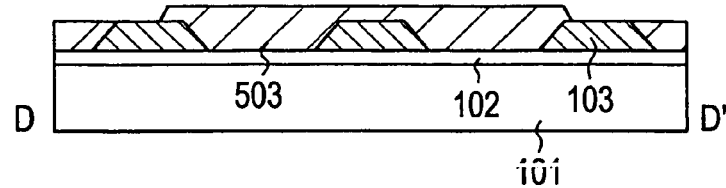

For this embodiment, a case is described in which a part of the crystalline semiconductor film 107 (portion to serve as a channel-forming region later) of the embodiment 1 is etched and formed into a thin film before the step of forming the active layer 109 of the thin-film transistor of the embodiment 1. FIG. 12A is a top view of the crystalline semiconductor film 107 after formed into a thin film and FIGS. 12B to 12E are sectional views taken along the lines A–A', B–B', C–C', and D–D' in FIG. 12A.

First, the crystalline semiconductor film 107 is formed as shown in FIG. 2 in accordance with the fabrication method described for the embodiment 1. Then, a resist mask 501 is formed on a semiconductor region of the crystalline semiconductor film 107 to serve as a source region or drain region later (FIG. 12A).

Then, the crystalline semiconductor film 107 is etched by the dry etching method or wet etching method by using the resist mask 501 as a mask to expose a second insulating film 103 (or a buffer film 104 on the film 103). This step makes it possible to selectively leave a crystalline semiconductor film 502 only on a concave portion. Moreover, a crystalline semiconductor film 503 remains at the original film thickness below the resist mask 501. This embodiment has a feature of using the crystalline semiconductor film 502 as the channel-forming region of a thin-film transistor and the crystalline semiconductor film 503 remaining at the original film thickness as the source region or drain region of the thin-film transistor.

It is allowed to use not only a chemical technique but also a mechanical polishing method such as CMP (chemical polishing) for the above etching step. Moreover, it is allowed to use both a chemical technique and mechanical technique.

According to this embodiment, it is possible to form a channel-forming region in a self-aligning manner by the second insulating film 103. Therefore, it is possible to prevent a channel-forming region from being erroneously formed on a convex portion of the second insulating film due to a pattern displacement and decrease the number of cases in which a crystalline interface is included in a channel-forming region.

For the subsequent steps, it is allowed to refer to the steps described for the embodiment 1. Therefore, descriptions for this embodiment are omitted. It is possible to freely combine this embodiment with any one of the embodiments 1 to 7.

Embodiment 9

Figure 13:
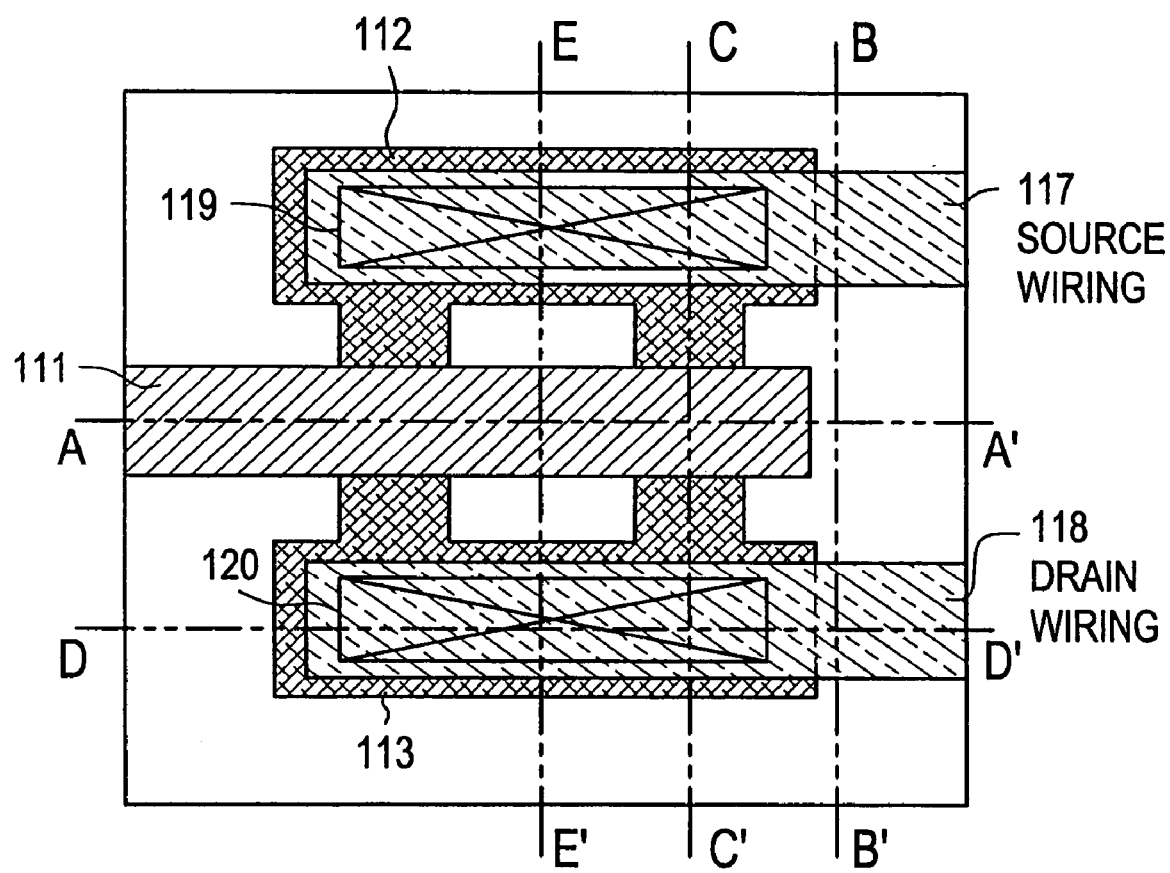
FIG. 13 is a top view for explaining fabrication steps of a transistor of the present invention.
Figure 14A:
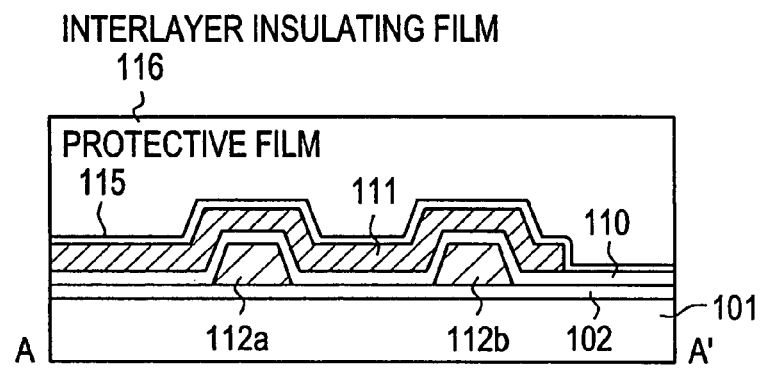
FIGS. 14A to 14E are longitudinal sectional-views for explaining fabrication steps of a transistor of the present invention.
Figure 14B:
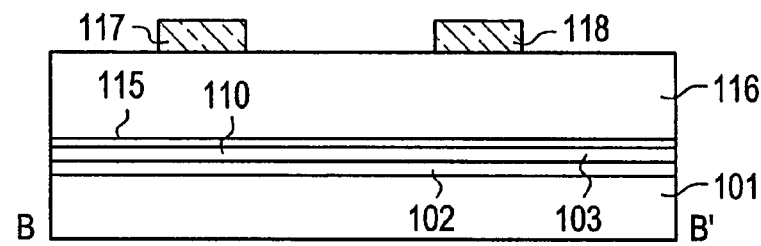
Figure 14C:
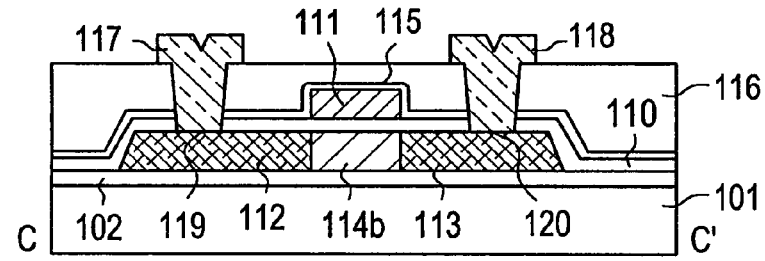
Figure 14D:
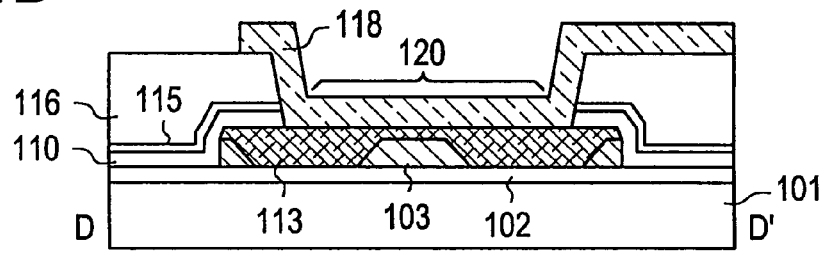
Figure 14E:
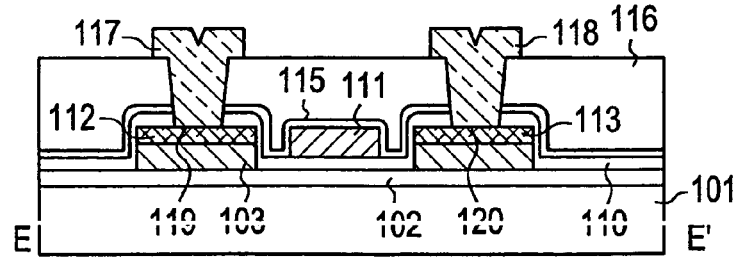

For this embodiment, a case is described in which the active layer 109 is formed and then the second insulating film 103 is removed in the embodiment 1. FIG. 13A is a top view of a thin-film transistor when executing this embodiment and FIGS. 14A to 14E are sectional views taken along the lines A–A', B–B', C–C', D–D', and E–E' in FIG. 13. Moreover, for symbols in FIGS. 14A to 14E, it is allowed to refer to symbols in drawings used for the embodiment 1.

This embodiment has features that the second insulating film 103 is removed in regions other than the region below the active layer 109 and thereby, the number of unnecessary steps is decreased on the substrate surface. That is, the frequency for guidance wirings such as a gate wiring, source wiring and drain wiring to get over steps can be decreased, it is possible to prevent a disconnection due to imperfect getting-over.

It is possible to freely combine this embodiment with any one of the embodiments 1 to 8.

Embodiment 10

Because the present invention can be applied to various semiconductor devices, the configuration of a display panel fabricated in accordance with the embodiments 1 to 9 is described below. A specific display panel described for this embodiment can use one of a display panel using a transistor as a semiconductor element such as a liquid-crystal display panel, EL (electroluminescence) display panel, and display panel for FED (field emission display). It is a matter of course that a display panel marketed as a module is included in the above display panels.

Figure 15:
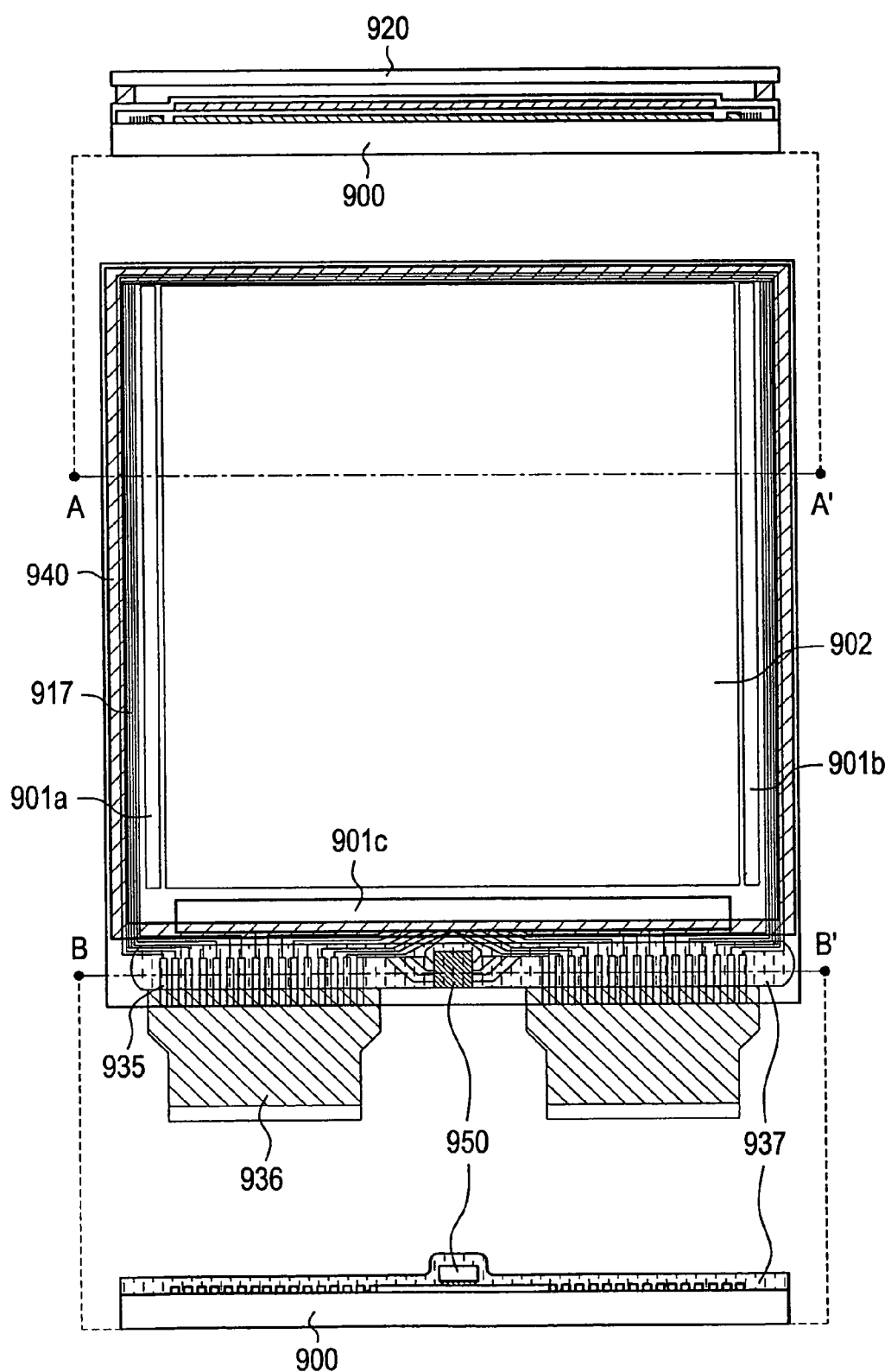
FIG. 15 is an illustration showing an outline view of a semiconductor device of the present invention.

In FIG. 15, a substrate 900 is provided with a pixel section 902, scanning-line driving circuits 901a and 901b, a signal-line driving circuit 901c, an input/output terminal section 935, and a wiring or a wiring group 917.

A seal pattern 940 is a pattern for forming an enclosed space between an opposite substrate 920 and the substrate 900. A liquid-crystal panel is filled with liquid crystal and an EL panel has a function for protecting an EL material (particularly, organic EL material) from outside air. It is allowed that the scanning-line driving circuits 901a and 901b, signal-line driving circuit 901c, and wiring or wiring group 917 for connecting the driving circuit 901c with an input terminal are overlapped each other. Thus, it is possible to decrease the area of the frame region (region around pixel portion) of a display panel. An FPC (flexible print circuit) 936 is fixed to an external input terminal.

Moreover, it is allowed that a chip 950 is mounted in which various logic circuits, high-frequency circuits, memories, microprocessors, media processors/DSP (Digital Signal Processor), LSIs for graphics, cipher LSIs, and amplifiers are formed. These functional circuits are formed in accordance with design rules different from those of the pixel section 902, scanning-line driving circuits 901a and 901b, and signal-line driving circuit 901c. Specifically, design rules of 1 µm or less are applied. It is preferable to protect the above external input terminal and chip 950 by a resin (mole resin or the like) 937. Moreover, because a mounting method is not restricted, it is possible to apply a method of using a TAB tape or COG (on-chip glass) method.

For this embodiment, FIG. 11A or 11B is suitable as the gate structure of a transistor. For example, it is possible to use the gate structure as a switching element of the pixel section 902 and moreover, as an active element for constituting the scanning-line driving circuit 901a or 901b or the signal-line driving circuit 901c. It is a matter of course that this embodiment is not restricted to the configuration in FIG. 15 because the embodiment shows a display panel obtained by executing the present invention.

Embodiment 11

For this embodiment, a case is described in which a flexible substrate (typically, plastic substrate or plastic film) is used as a support substrate to fabricate a semiconductor device by executing the present invention. A semiconductor device using a flexible substrate is small in thickness and weight and moreover, it can be applied to a display having a curved surface and show window. Therefore, purpose of the semiconductor device is not restricted to portable devices but it covers a wide application range.

However, when a substrate is not flat, a problem is how the curvature can be raised. When raising the curvature, a trouble occurs that a desired characteristic of a semiconductor elements formed on an insulating film cannot be obtained due to a stress produced on the insulating film. Particularly, the above trend becomes stronger as the thickness of the insulating film increases.

Therefore, when the present invention is applied to a flexible substrate like the case of this embodiment, it is preferable to make the longitudinal direction of an insulating film extending in the form of a linear stripe pattern (Y-axis direction in FIG. 2A) equal to the longitudinal direction of the bus bar on the curved surface of the substrate. It is undoubtedly preferable to use a semiconductor device by considering the above points when the semiconductor device is built in an electronic device or attached to a show window because the longitudinal direction of the bus bar on the curved surface of a substrate depends on the purpose.

Figure 16:
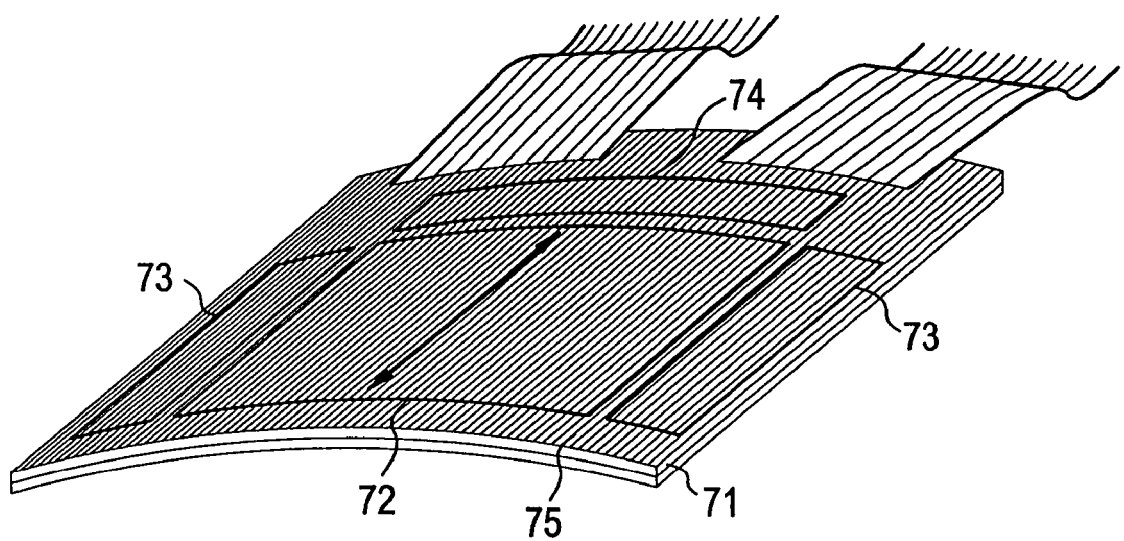
FIG. 16 is an illustration showing an outline view of a semiconductor device of the present invention.

FIG. 16 shows a state of curving a semiconductor device fabricated by using a flexible substrate obtained by executing the present invention. A pixel section 72, scanning-line driving circuit 73, and signal-line driving circuit 74 are formed on a substrate 71. The substrate 71 uses a material capable of withstanding treatment temperatures in the subsequent steps. Typically, it is allowed to use PET (polyethylene terephthalate), PES (polyethylene sulfite), PC (polycarbonate), or PEN (polyethylene naphthalate). Particularly, PC is effective because it has a high heat resistance.

In the case of the scanning-line driving circuit 73 and signal-line driving circuit 74, a thin-film transistor having a channel-forming region using a first crystalline semiconductor region obtained by executing the present invention is formed on a concave portion provided between the insulating films 75 extending in the form of linear stripe patterns. Moreover, the longitudinal direction of the insulating films 75 extending in the form of stripe patterns coincides with the longitudinal direction of the bus bar on the curved surface of the substrate 71 in the direction shown by the arrow. Thus, it is possible to disperse the above stress and reduce the influence of the stress on the thin-film transistor.

This embodiment is a semiconductor device, which can be executed by freely combining it with any one of the embodiments 1 to 9. However, when using a plastic substrate as a substrate, it is substantially impossible to apply furnace annealing to the plastic substrate because it has a low heat resistance. Moreover, when performing an RTA treatment, it is necessary to pay close attention to the treatment time and treatment temperature.

This embodiment does not lose its advantages by combining it with other embodiment and it has a large technical significance for executing the present invention on a flexible substrate on which it is difficult to form a semiconductor film having a high crystallinity.

Embodiment 12

It is possible to complete various electronic devices by the present invention. For example, the electronic devices include mobile information terminals (electronic databook, mobile computer, and cellular telephone), a video camera, a digital camera, a personal computer, a TV receiver, and a cellular telephone. FIGS. 17A to 17G show some of electronic devices. Because the electronic devices shown in FIG. 17 are only some of electronic devices, the present invention is not restricted to these purposes.

Figure 17A:
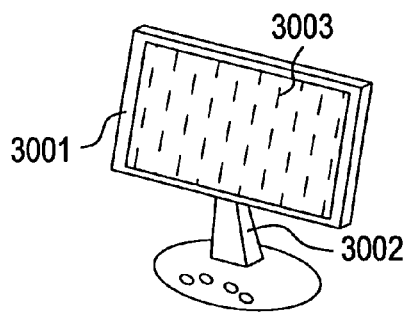
FIGS. 17A to 17G are illustrations showing specific electronic devices of the present invention.

FIG. 17A shows an example of completing a TV receiver by applying the present invention, which is constituted by a housing 3001, a support 3002, and a display section 3003. It is possible to set a transistor fabricated by the present invention by forming various integrated circuits such as various logic circuits, high-frequency circuits, memories, microprocessors, media processors, graphic LSIs, in addition to the display section 3003 on glass and therefore, it is possible to complete a TV receiver by the present invention.

Figure 17B:
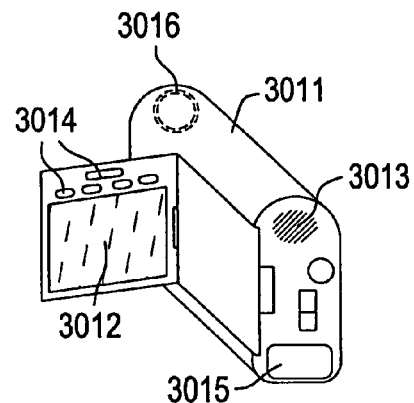

FIG. 17B shows an example of completing a video camera by applying the present invention, which is constituted by a body 3011, display section 3012, voice input section 3013, operation switch 3014, battery 3015, and image-receiving section 3016. It is possible to set a transistor fabricated by the present invention by forming various integrated circuits such as various logic circuits, high-frequency circuits, memories, microprocessors, media processors, graphic LSIs, in addition to the display section 3012 on glass and therefore, it is possible to complete a video camera by the present invention.

Figure 17C:
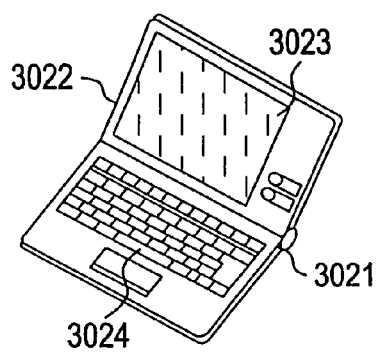

FIG. 17C shows an example of completing a notebook-size personal computer by applying the present invention, which is constituted by a body 3021, housing 3022, display section 3023, and keyboard 3024. It is possible to set a transistor fabricated by the present invention by forming various integrated circuits such as various logic circuits, high-frequency circuits, memories, microprocessors, media processors, graphic LSIs, and cipher LSIs in addition to the display section 3023 on glass and therefore, it is possible to complete a personal computer by the present invention.

Figure 17D:
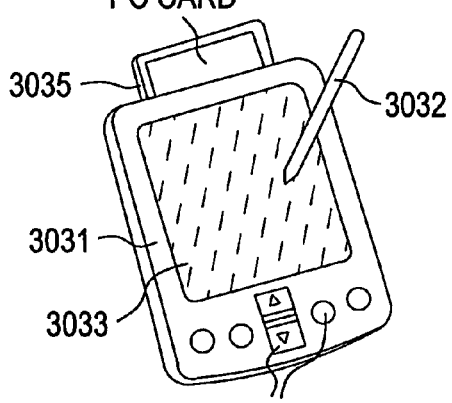

FIG. 17D shows an example of completing a PDA (Personal Digital Assistant) by applying the present invention, which is constituted by a body 3031, stylus 3032, display section 3033, operation button 3034, and external interface 3035. It is possible to set a transistor fabricated by the present invention by forming various integrated circuits such as various logic circuits, high-frequency circuits, memories, microprocessors, media processors, graphic LSIs, and cipher LSIs in addition to the display section 3033 on glass and therefore, it is possible to complete a PDA by the present invention.

Figure 17E:
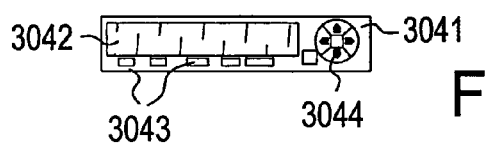

FIG. 17E shows an example of completing an acoustic reproducer by applying the present invention. Specifically, the acoustic reproducer is an on-vehicle audio device which is constituted by a body 3041, display section 3042, and operation switches 3043 and 3044. It is possible to set a transistor fabricated by the present invention by forming various integrated circuits such as various logic circuits, high-frequency circuits, memories, microprocessors, media processors, graphic LSIs, and amplifier circuit in addition to the display section 3042 on glass and therefore, it is possible to complete an audio device by the present invention.

Figure 17F:
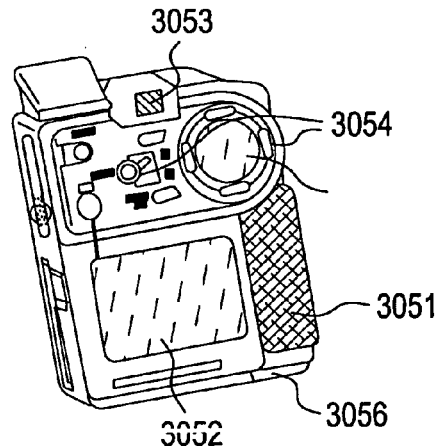

FIG. 17F shows an example of completing a digital camera by applying the present invention, which is constituted by a body 3051, display section (A) 3052, eye-piece section 3053, operation switch 3054, display section (B) 3055, and battery 3056. It is possible to set a transistor fabricated by the present invention by forming various integrated circuits such as various logic circuits, high-frequency circuits, memories, microprocessors, media processors, graphic LSIs, and cipher LSIs in addition to the display section (A) 3052 and display section (B) 3055 on glass and therefore, it is possible to complete a digital camera by the present invention.

Figure 17G:
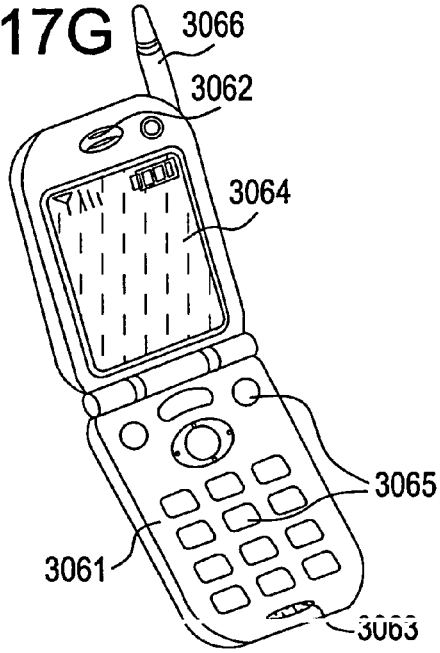

FIG. 17G shows an example of completing a cellular telephone by applying the present invention, which is constituted by a body 3061, voice output section 3062, voice input section 3063, display section 3064, operation switch 3065, and antenna 3066. It is possible to set a transistor fabricated by the present invention by forming various integrated circuits such as various logic circuits, high-frequency circuits, memories, microprocessors, media processors, graphic LSIs, and cipher LSIs, LSIs for cellular telephones in addition to the display section 3064 on glass and therefore, it is possible to complete a cellular telephone by the present invention.

EXAMPLES

Example 1

Figure 18A:
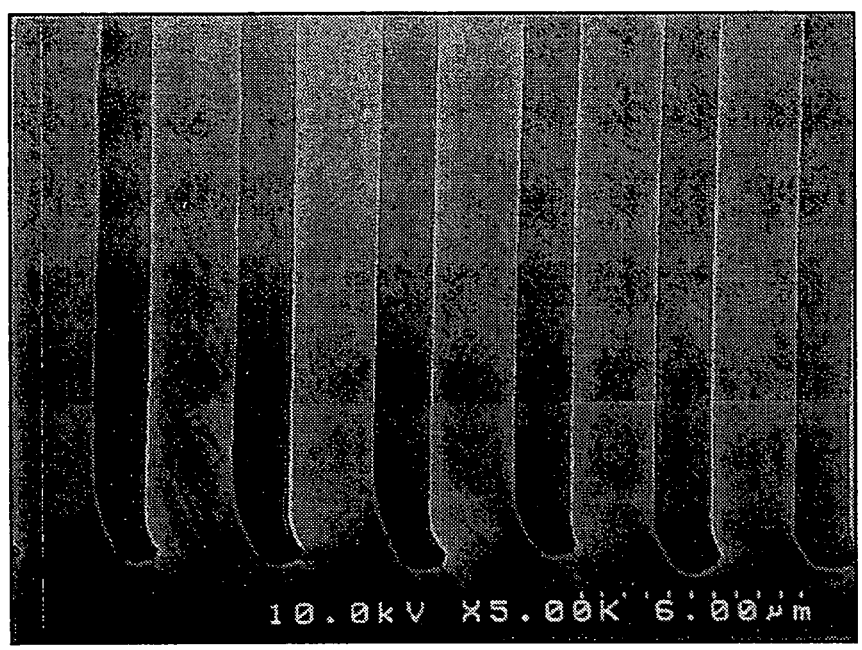
FIGS. 18A and 18B are SEM photograph and a schematic view of a crystalline silicon film obtained by executing the present invention.
Figure 18B:
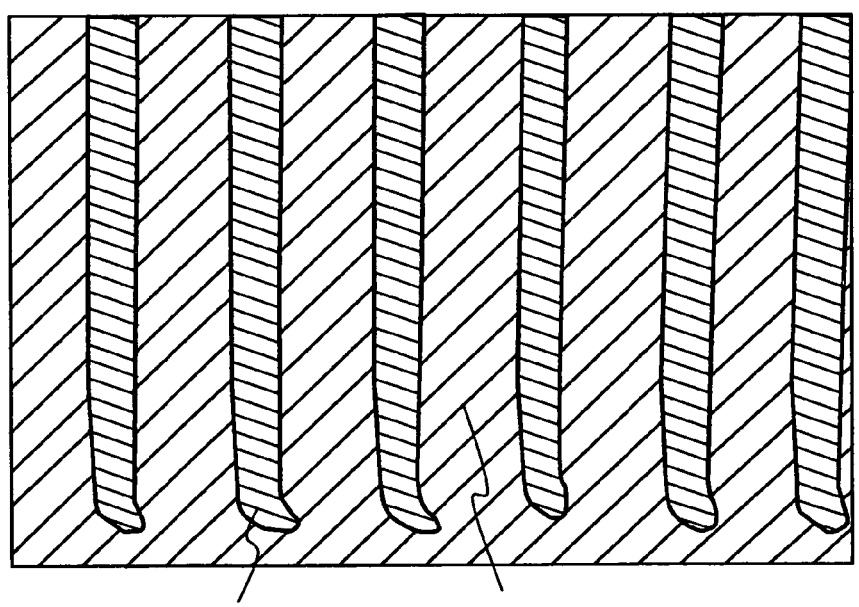

This example is described on a crystalline semiconductor film formed by the art of the embodiment 3 by referring to FIGS. 18A and 18B. FIG. 18A shows an SEM photograph obtained by observing a secoetched state of a crystalline semiconductor film according to this embodiment from the upper side and FIG. 18B shows a schematic view of the crystalline semiconductor film.

As conditions of this embodiment, a silicon nitride oxide film with a thickness of 50 nm is used as a first insulating film and a silicon oxide nitride film with a thickness of 200 nm is used as a second-insulating film. In this case, the width (W1) of the second insulating film is set to 2 μm and the width (W2) between second insulating films is also set to 2 μm. Moreover, a silicon oxide nitride film with a thickness of 20 nm is formed on the second insulating film as a third insulating film and then, an amorphous silicon film with a thickness of 150 nm is continuously formed as an amorphous semiconductor film without releasing it to the atmospheric air. The amorphous silicon film is crystallized by the crystallization art of the embodiment 3. Specifically, the amorphous silicon film is crystallized by heating it at 550° C. for 4 hr while holding 100 ppm of a nickel-acetate aqueous solution on the amorphous silicon film and then irradiated with a linear laser beam. A YVO$_4$ laser oscillator in the continuous oscillation mode is used for the linear laser beam and an output of 5.5 W of. the second harmonic (wavelength of 532 nm) of the oscillator is condensed to a linear laser beam by an optical system to scan the crystallized silicon film at a scanning rate of 50 cm/sec at room temperature.

In FIG. 18A, the crystalline semiconductor film formed on an convex portion of the second insulating film disappears when it is secoetched and even the second insulating film below the former second insulating film disappears when it is secoetched. It is estimated that the crystalline semiconductor film formed on the convex portion is almost etched through secoetching because crystalline interfaces are concentrated on the second insulating film. However, any remarkable crystalline interface is not observed in the first crystalline semiconductor region even after secoetching is performed and therefore, a crystalline semiconductor film having a very high crystallinity is obtained.

Example 2

For this example, a case is described in which all island-shaped semiconductor films are present only on concave portions.

First, up to the state shown in FIGS. 20A and 20B of the embodiment is formed.

Then, the entire surface of the semiconductor film 703 is etched to expose the upper face of the convex portion 701a of the ground film 701. According to the above step, a semiconductor film present only on a concave portion of the ground film 701 is formed. For removal from the upper face of the semiconductor film 703, it is allowed to use any method such as etching or CMP method.

According to the removal from the upper face, a portion at which a grain boundary is present on the convex portion 701a is removed and a semiconductor film having a high crystallinity which will serve as a channel-forming region later is left on a concave portion between the convex portions 701a.

Figure 25A:
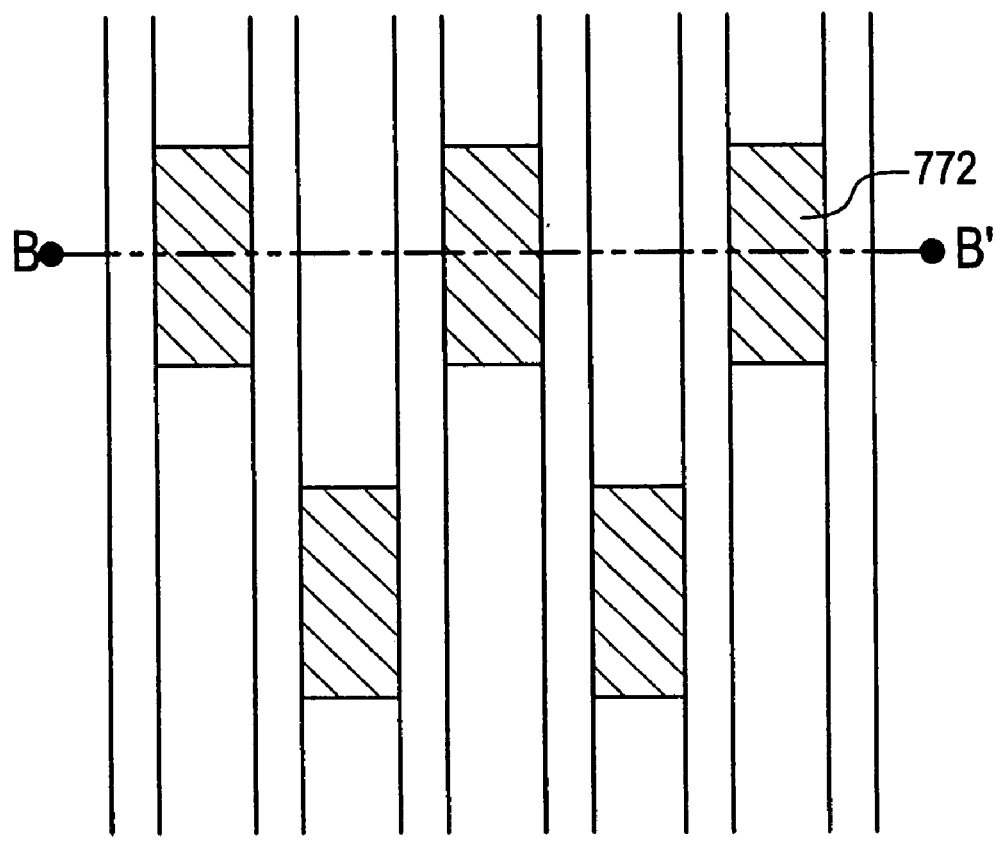
FIGS. 25A and 25B are illustrations showing fabrication steps of a TFT of the present invention.
Figure 25B:
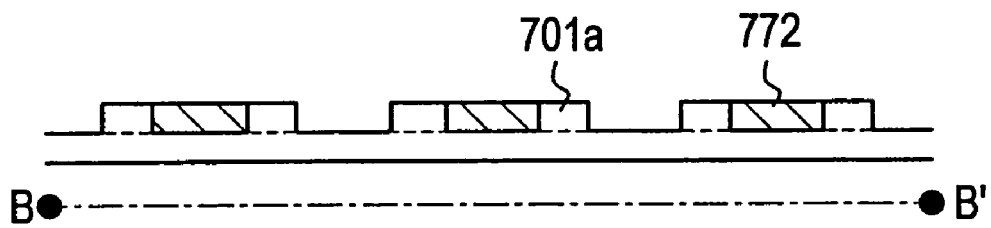

Then, as shown in FIG. 25A, an island-shaped semiconductor film 772 serving as an active layer is formed by patterning a semiconductor film whose surface is etched. FIG. 25B corresponds to a sectional view taken along the line A–A' in FIG. 25A. The island-shaped semiconductor film 772 is present only on a concave portion and a part of the film 772 contacts the convex portion 701a. It is preferable to decide the layout of the convex portion 701a by considering the channel length and channel width of a TFT. Moreover, it is possible to decrease resistances of a source region and drain region by forming even portions serving as the source and drain regions by a semiconductor film present on a concave portion.

It is possible to fabricate a TFT by the island-shaped semiconductor film 772.

When forming an island-shaped semiconductor film on a flat ground film and forming a contact hole on an insulating film formed on the island-shaped semiconductor film, if the mask of the contact hole is displaced, the ground film located below the island-shaped semiconductor film is etched and an electrode so as to contact the island-shaped semiconductor film may cause a disconnection. In the case of the present invention, it is possible to prevent a disconnection of wiring contacting a source region or drain region, because particularly portions serving as a source region and a drain region of an island-shaped semiconductor film of the present invention are made to contact convex portions and thereby some of convex portions are etched instead of a ground film located below the island-shaped semiconductor film. Therefore, a design rule for forming a wiring becomes moderate and moreover, it is possible to decrease the resistance at the connective portion between the island-shaped semiconductor film and the wiring.

Figure 26A:
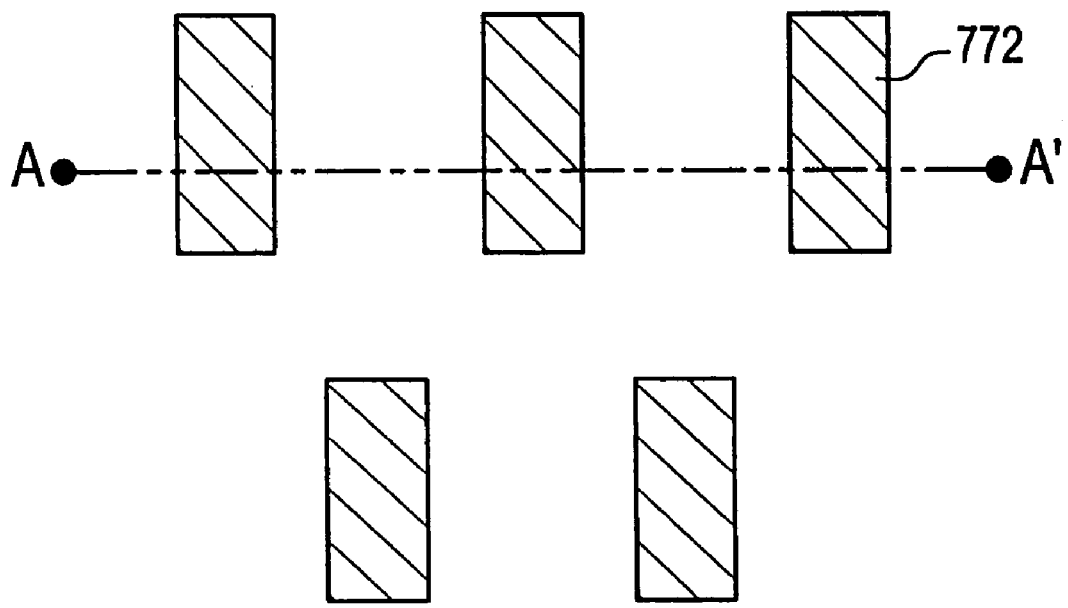
FIGS. 26A and 26B are illustrations showing fabrication steps of a TFT of the present invention.
Figure 26B:
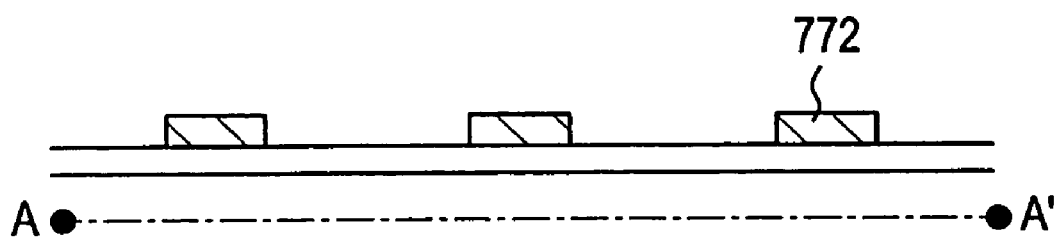

It is allowed to remove the convex portion 701a from the state shown in FIG. 25. FIG. 26A shows a state in which the convex portion 701a is removed from the state shown in FIG. 25. FIG. 26B corresponds to a sectional view taken along the line A–A' in FIG. 26A. By removing the convex portion 701a, it is possible to decrease the thickness of an insulating film for flattening a surface later and prevent a wiring or pixel electrode formed like a flattening insulating film from being swelled or disconnected due to concave and convex portions.

Example 3

A method of forming a base film having unevenness is explained in Example 3. Incidentally, the base film described in this example is only one example and the base film used in the present invention is not limited to this.

Figure 27A:
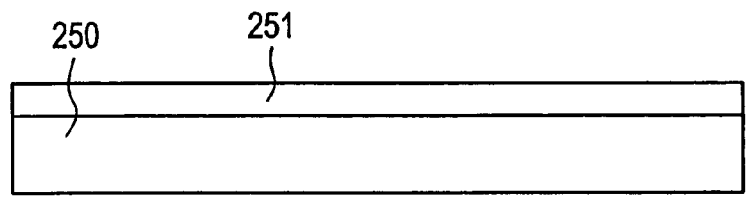
FIGS. 27A to 27D are illustrations showing a forming method of a ground film having convex portions.

A first base film 251 made form an insulating film is first formed on a substrate 250 as shown in FIG. 27A. The first base film 251 uses silicon oxynitride in this example but is not limited to this material, and insulating films having a large selectivity in etching with a second base film may be used. The first base film 251 is formed by a CVD apparatus using $SiH_4$ and $N_2O$ so that its thickness is from 50 to 200 nm. Note that the first base film may be a single layer, and may also be a laminate structure of a plurality of insulating films.

Figure 27B:
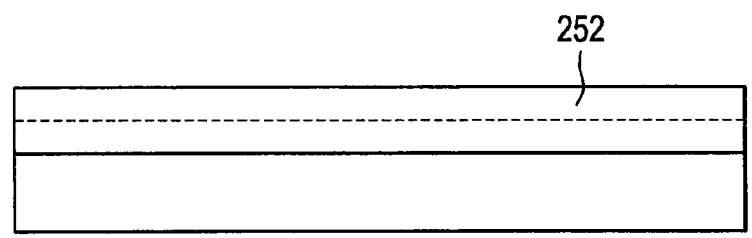

A second base film 252 is formed next from an insulating material that contacts the first base film 251, as shown in FIG. 27B. It is necessary that the film thickness of the second base film 252 be of an order such that unevenness appears in the surface of a semiconductor film formed subsequently when patterning is performed in a later step, forming unevenness. A 30 nm to 300 nm silicon oxide film is formed as the second base film 252 by using plasma CVD in this example.

Figure 27C:
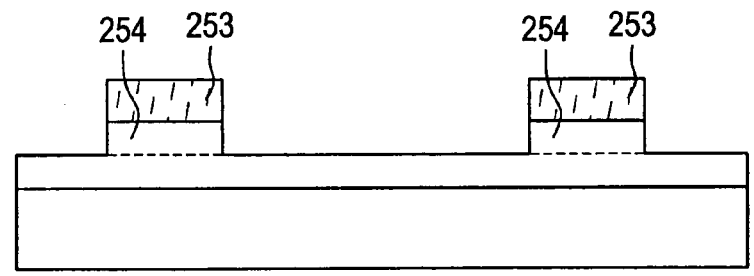
Figure 27D:
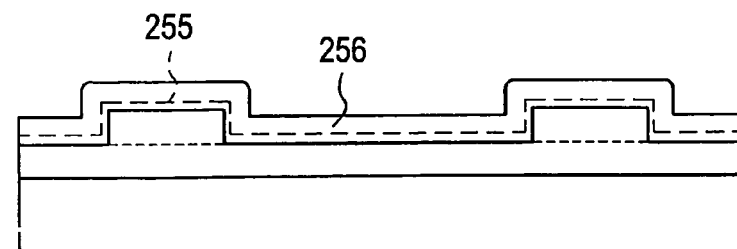

A mask 253 is formed next as shown in FIG. 27C, and the second base film 252 is etched. Note that wet etching is performed at 20° C. in this example, using a mixed solution containing 7.13% ammonium hydrogen fluoride ($NH_4HF_2$) and 15.4% ammonium fluoride ($NH_4F$) (Stella Chemifa Corporation, product name LAL500) as an etchant. Rectangular shape convex portions 254 are formed by this etching. The first base film 251 and the convex portions 253 are taken as one base film in this specification.

Note that it is preferable to pattern the second base film 252 by using RF sputtering in the case where aluminum nitride, aluminum oxynitride, or silicon nitride is used as the first base film 251 and a silicon oxide film is used as the second base film 252. The thermal conductivity of aluminum nitride, aluminum oxynitride, and silicon nitride is high as the first base film 251, and therefore generated heat can quickly diffuse, and TFT deterioration can be prevented.

A semiconductor film is formed next so as to cover the first base film 251 and the convex portions 254. The thickness of the convex portions is from 30 nm to 300 nm in this example, and therefore it is preferable to set the film thickness of the semiconductor film from 50 to 200 nm, and it is set to 60 nm here. Note that adverse influences are imparted to the semiconductor film crystallinity if impurities mix in between the semiconductor film and the base film. There is a possibility that dispersions in the characteristics of the manufactured TFTs, and that variations in the threshold values may increase, and therefore it is preferable to form the base film and the semiconductor film in succession. A silicon oxide film 255 forms thinly on the base film in Example 3 after forming the first base film 251 and the convex portions 254, and the semiconductor film 256 is then formed without exposure to the outside atmosphere. The thickness of the silicon oxide film can be suitably set by a designer, and is set on the order of 5 nm to 30 nm in this example.

Figure 28A:
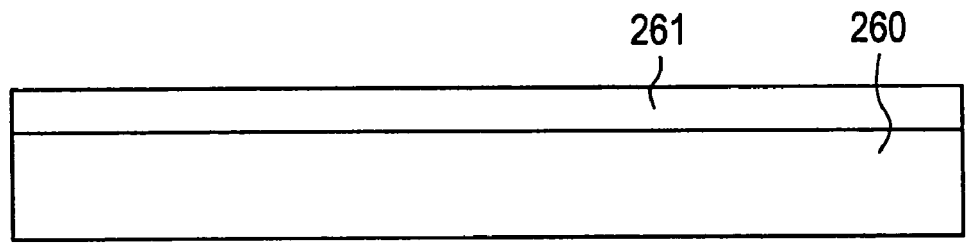
FIGS. 28A to 28C are illustrations showing a forming method of a ground film having convex portions.

A method of forming a base film that differs from that of FIG. 27 is explained next. A first base film 261 made from an insulating film is first formed on a substrate 260 as shown in FIG. 28A. The first base film 261 is formed by a silicon oxide film, a silicon nitride film, a silicon oxynitride film, or the like.

If a silicon oxide film is used, it can be formed by plasma CVD by mixing tetraethyl orthosilicate (TEOS) and $O_2$, at a reaction pressure of 40 Pa, at a substrate temperature of 300 to 400° C., and by discharging at a high frequency (13.56 MHz) electric power density of 0.5 to 0.8 W/cm$^2$. If a silicon oxynitride film is used, it may be formed by a silicon oxynitride film manufactured by plasma CVD from $SiH_4$, $N_2O$, and $NH_3$, or by a silicon oxynitride film manufactured by plasma CVD from $SiH_4$ and $N_2O$. The manufacturing conditions in this case are that formation can occur at a reaction pressure of 20 to 200 Pa, a substrate temperature of 300 to 400° C., and a high frequency (60 MHz) electric power density of 0.1 to 1.0 W/cm$^2$. Further, a hydrogen silicon oxynitride film manufactured from $SiH_4$, $N_2O$, and $H_2$ may also be applied. It is possible to manufacture silicon nitride films similarly by plasma CVD using $SiH_4$ and $NH_3$.

Figure 28B:
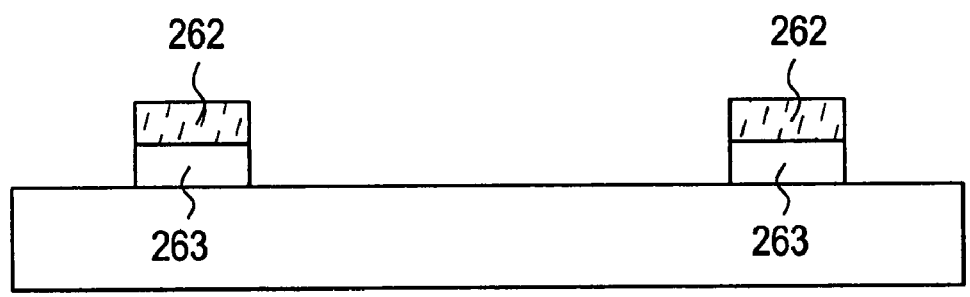
Figure 28C:
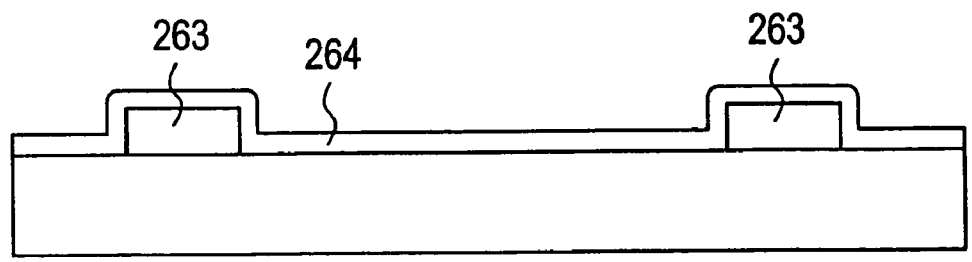

After forming the first base film over the entire substrate to have a thickness of 20 to 200 nm (preferably between 30 and 60 nm), a mask 262 is then formed as shown in FIG. 28B by using a photolithography technique. Unnecessary portions are then removed by etching, thus forming rectangular shape convex portions 263. A dry etching method that uses a fluorine-based gas with respect to the first base film 261 may be used, and a wet etching method that uses an aqueous solution of a fluorine-base gas may be used. In the case where the latter method is selected, etching may be performed by a mixed solution (Stella Chemifa Corporation, product name LAL500) containing 7.13% ammonium hydrogen fluoride ($NH_4HF_2$) and 15.4% ammonium fluoride ($NH_4F$).

A second base film 264 made from an insulating film is formed next so as to cover the convex portions 263 and the substrate 260. This film is formed by using a silicon oxide film, a silicon nitride film, a silicon oxynitride film, or the like at a thickness from 50 to 300 nm (preferably from 100 to 200 nm), similar to the first base film 261.

A base film composed of the convex portions 263 and the second base film 264 is formed in accordance with the above manufacturing processes. Note that impurities can be prevented from mixing in between the semiconductor film and the base film by forming the semiconductor film in succession, without exposure to the atmosphere, after forming the second base film 264.

It is possible to implement Example 3 by being freely combined with Example 2.

Example 4

Figure 29A:
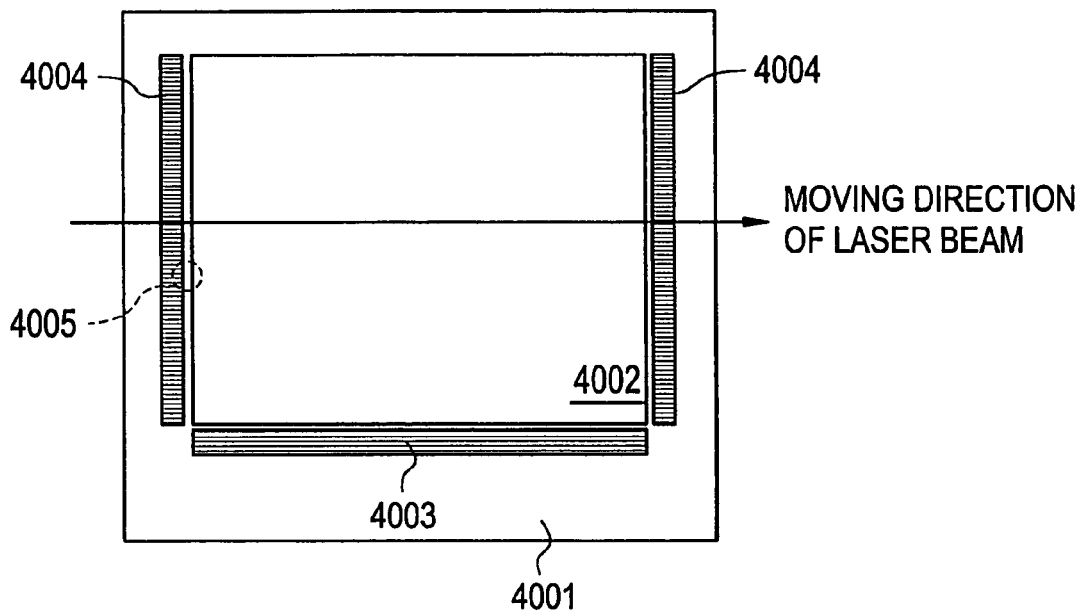
FIGS. 29A and 29B are a top view of the element substrate of a semiconductor display of the present invention and an enlarged view of the pixel section and scanning-line driving circuit of the semiconductor display.

Then, a configuration of a semiconductor display of the present invention is described below. FIG. 29A shows a top view of the substrate of a semiconductor display of the present invention. In FIG. 29A, a pixel section 4002 and driving circuits 4003 and 4004 for supplying a video signal or other signal or power to the pixel section are formed on a substrate 4001. Moreover, FIG. 29A shows a state when an island-shaped semiconductor film is formed.

The driving circuit 4003 is a scanning-line driving circuit for, successively selecting a plurality of pixels formed in the pixel section 4002. The driving circuit 4004 is a signal-line driving circuit for supplying a video signal to a pixel selected by the scanning-line driving circuit 4003 at a predetermined timing. FIG. 29A shows a typical configuration of the substrate of a semiconductor display but a semiconductor display of the present invention is not restricted to this configuration.

Moreover, in the case of the present invention, an island-shaped semiconductor film obtained through a series of the above steps is formed in the pixel section 4002 and driving circuits 4003 and 4004.

Figure 29B:
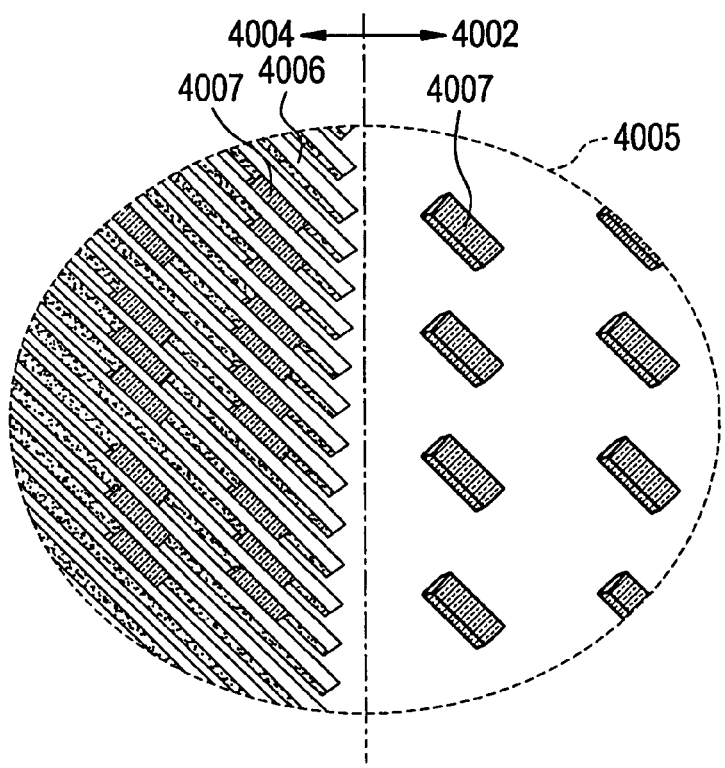

FIG. 29B shows an enlarged view of a part of the signal-line driving circuit 4004 and a region 4005 including the pixel section 4002. In the case of this embodiment, longitudinal directions of a plurality of striped or rectangular convex portions 4006 are kept at 30° to 60° or 120° to 150° from the scanning direction. Moreover, In the case of the signal-line driving circuit 4004, an island-shaped semiconductor film 4007 is formed between the convex portions 4006. The island-shaped semiconductor film 4007 is formed by a series of the above forming methods.

In the case of this embodiment, convex portions are intentionally removed in order to prevent swells from occurring on the surface of a pixel electrode to be formed by concave and convex portions later. However, it is not always necessary to remove convex portions from a pixel section. Moreover, it is allowed to remove convex portions from a driving circuit.

Though not illustrated, it is also allowed that a plurality of striped or rectangular convex portions are formed in the scanning-line driving circuit 4003 and an island-shaped semiconductor film is formed between the convex portions. However, when the scanning direction of a laser beam is constant, it is more preferable to properly arrange longitudinal directions of all convex portions formed on a substrate in order to control the fluctuation of characteristics of a TFT.

Figure 40:
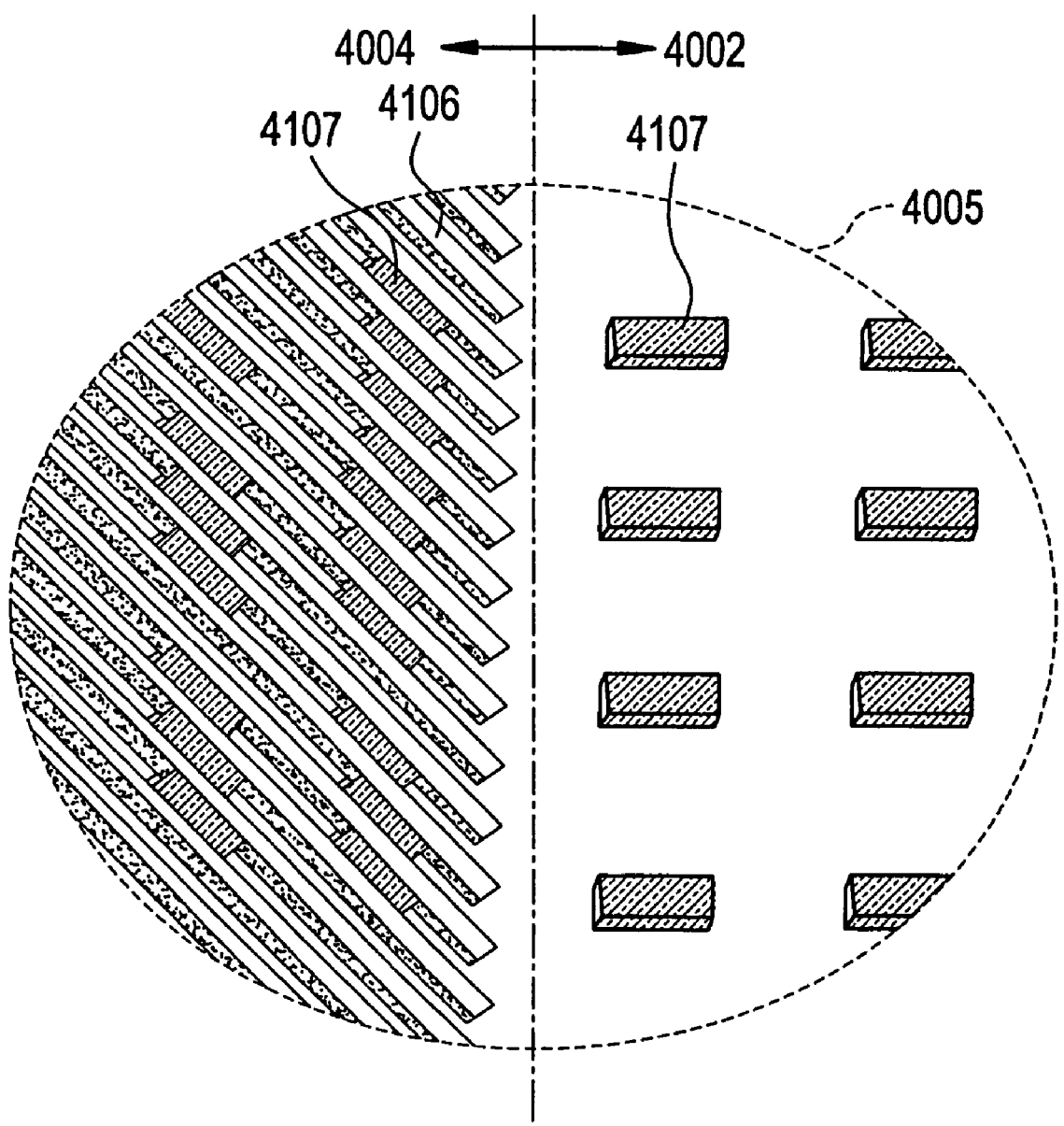
FIG. 40 is an enlarged view of the pixel section and scanning-line driving circuit of a semiconductor display of the present invention.

Moreover, FIG. 40 shows an enlarged view of the configuration of a part of the signal-line driving circuit 4004 and the region 4005 including the pixel section 4002 in FIG. 29A which are different from FIG. 29B. In FIG. 40, an island-shaped semiconductor film 4107 is formed between the convex portions 4106 in the signal-line driving circuit 4004. Moreover, the island-shaped semiconductor-film 4107 is formed on a flat ground film in the pixel section 4002. Furthermore, in FIG. 40, the signal-line driving circuit 4004 and pixel section 4002 are different from each other in channel longitudinal direction of the island-shaped semiconductor film 4107. Thus, in the case of the present invention, because it is possible to freely set the direction of an island-shaped semiconductor film by changing the direction of a convex potion and the scanning direction of a laser beam, layout can be done relatively freely.

It is possible to execute this embodiment by combining it with the example 2 or 3.

Example 5

For this example, a case is described in which a step of irradiating a semiconductor film with a laser beam to crystallize the semiconductor film is combined with a step of crystallizing the semiconductor film by a catalyst. To use a catalyst element, it is possible to use the art disclosed in the official gazette of Japanese Patent Laid-Open No. 349735/1994.

Figure 30A:
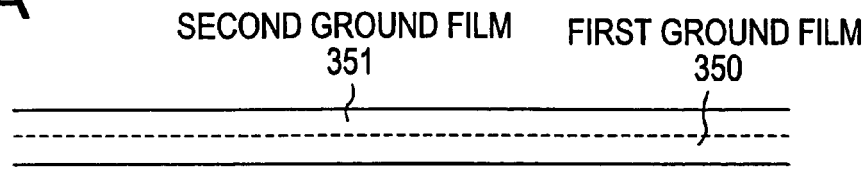
FIGS. 30A to 30G are illustrations showing a flow of crystallization of a semiconductor film of the present invention using a catalyst element.

First, as shown in FIG. 30A, a first ground film 350 made of an insulating film is formed on a substrate. The first ground film 350 uses silicon oxide nitride in the case of this example. However, a material of the film 350 is not restricted to the above material. It is allowed to use an insulating film as long as the film has a large selection ratio in etching with a second ground film 351 to be formed later. In the case of this example, the first ground film 350 is formed so as to have a thickness of 50 to 200 nm by using a CVD system and $SiH_4$ and $N_2O$. However, it is allowed that the first ground film is a single layer or has a structure obtained by laminating a plurality of insulating film.

Then, a second ground film 351 made of an insulating film is formed so as to contact the first ground film 350. In the case of this example, a silicon oxide film of 30 to 300 nm is formed as the second ground film 351 by the plasma CVD method.

Figure 30B:
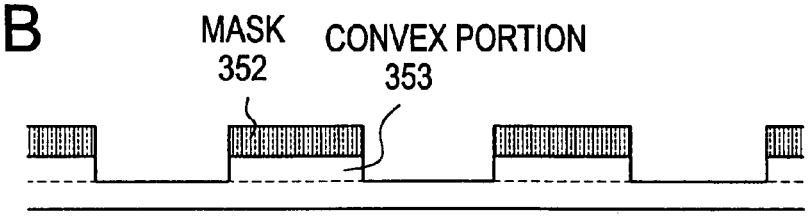

Then, as shown in FIG. 30B, a mask 352 is formed to etch the second ground film 351. In the case of this example, wet etching is performed at 20° C. by using a mixed solution containing 7.13% of ammonium hydrogen fluoride ($NH_4HF_2$) and 15.4% of ammonium fluoride {trade name LAL500 made by Stella Chemifa Corp.} as an etchant. A rectangular convex portion 353 is formed through the above etching. In the case of this specification, the first ground film 350 and convex portion 353 are put together and regarded as one ground film.

When using aluminum nitride, aluminum nitride oxide, or silicon nitride for the first ground film 350 and a silicon oxide film as the second ground film 351, it is preferable to pattern the second ground film 351 through the RF sputtering method. Because aluminum nitride, aluminum nitride oxide, or silicon nitride used for the first ground film 350 has a high heat conductivity, it is possible to quickly diffuse produced heat and prevent a TFT from deteriorating.

Figure 30C:
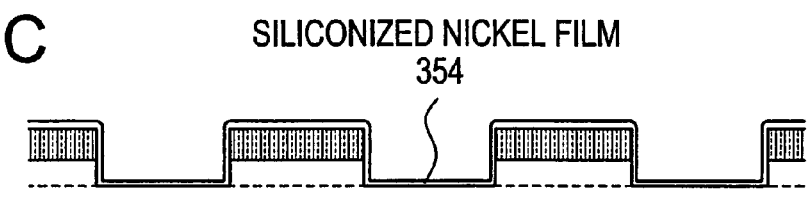

Then, as shown in FIG. 30C, a siliconized nickel film 354 with a thickness of 5 to 200 Å, for example, 20 Å (chemical formula of NiSix, $0.4 \leq x \leq 2.5$, for example, x=2.0) is formed through the sputtering method while setting the above mask 352. The siliconized nickel film is formed to use nickel which is an element included in group VIII (group 8) as a catalyst element for crystallization.

After the siliconized nickel film 354 is formed, the mask 352 is removed. In this case, a part 362 of the siliconized nickel film 354 formed around the mask 352 is removed and the remaining film 354 is left between the convex portions 353.

Figure 30D:
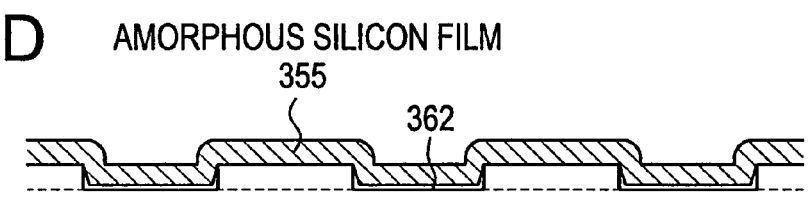

Under the above state, a semiconductor film is formed so as to cover the first ground film 350, convex portion 353, and a part of a siliconized nickel film 362 as shown in FIG. 30D. In this case, however, an amorphous silicon film 355 is formed. Because a convex portion has a thickness of 30 to 300 nm in the case of this example, it is preferable to set the thickness of the amorphous silicon film 355 to 50 to 200 nm. In this case, the thickness of the film 355 is set to 60 nm.

Figure 30E:
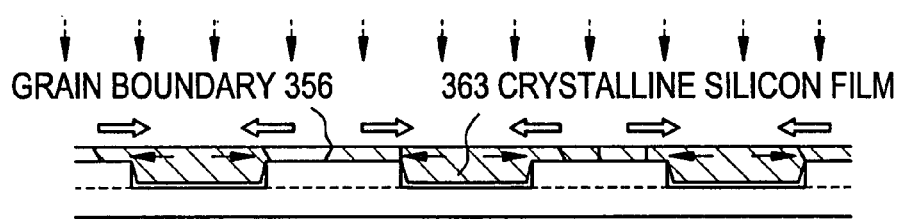

Then, the amorphous silicon film 355 is crystallized through irradiation with a laser beam to form a crystalline silicon film 363 (FIG. 30E). The crystalline semiconductor film 363 is temporarily melted at the time of irradiation with the laser beam and volume-moves from the upper side of the convex portion 353 toward a concave portion as shown by a white arrow and the surface of the film 363 is flattened. Thereby, the film thickness is decreased on the convex portion 353. Moreover, because crystallization progresses from the nickel nitride film 354 located at a concave portion toward the convex portion 353 in the direction shown by continuous-line arrows, a nickel element segregates on the convex portion 353. Therefore, a grain boundary 356 is easily produced on the convex portion 353.

Then, a step of gettering a catalyst element in the crystalline semiconductor film 363 is described below. In the case of this embodiment, gettering is performed after irradiation with a laser beam. However, it is also allowed to perform gettering after etching the crystalline semiconductor film 363.

Figure 30F:

A barrier layer 358 mainly containing silicon is formed on the crystalline semiconductor film 363 (FIG. 30F). It is allowed that the barrier layer 358 is a very thin, film, natural oxide film, or oxide film to be oxidized by generating ozone through irradiation with ultraviolet radiation under an atmosphere containing oxygen. Moreover, it is allowed that the barrier layer 358 is an oxide film oxidized by a solution containing ozone used for a surface treatment referred to as hydro-cleaning for removing carbon, that is, an organic matter. The barrier layer 358 is mainly used as an etching stopper. Moreover, it is allowed to form the barrier layer 358 and then apply channel doping to the barrier layer 358, and activate the barrier layer 358 by irradiating it with intensified light.

Then, a first semiconductor film for gettering 359, is formed on the barrier layer 358. It is allowed that the first semiconductor film for gettering 359 is a semiconductor film having an amorphous structure or crystal structure. It is preferable to set the thickness of the first semiconductor film 359 to 5 to 50 nm, more preferably to 10 to 20 nm. It is preferable to improve the gettering efficiency by making the first semiconductor film for gettering 359 contain oxygen (concentration of $5 \times 10^{18}/cm^3$ or more, preferably $1 \times 10^{19}/cm^3$ or more in the SIMS analysis).

Then, a second semiconductor film (gettering site) 360 containing a rare-gas element is formed on the first semiconductor film for gettering 359. It is allowed that the second semiconductor film for gettering 360 uses a semiconductor film having an amorphous structure formed by using the plasma CVD method, decompressed thermal CVD method, or sputtering method or a semiconductor film having a crystal structure. It is allowed that the second semiconductor film uses a semiconductor film containing a rare-gas element at the stage of film formation or a rare-gas element is added after a semiconductor film containing no rare-gas element is formed. For this example, a case is shown in which after the second semiconductor film for gettering 360 containing a rare-gas element at the stage of film formation is formed, the second semiconductor film for gettering 360 is formed by further selectively adding a rare-gas element. Moreover, it is allowed to continuously form the first and second semiconductor films for gettering without contacting atmospheric air. Furthermore, it is allowed to set the sum of thickness of the first and second semiconductor films to 30 to 200 nm, for example, 50 nm.

In the case of this example, a gap is formed between the crystalline semiconductor film 363 and the second semiconductor film 360 by the first semiconductor film for gettering 359. When gettering is performed, impurity elements including a metal present in the crystalline semiconductor film 363 are easily collected in the vicinity of the boundary between gettering sites. Therefore, it is preferable to improve the gettering efficiency by keeping the boundary between gettering sites away from the crystalline semiconductor film 363 by the first semiconductor film for gettering 359. Moreover, the first semiconductor film for gettering 359 also has an effect for blocking impurity elements contained in a gettering site so as to prevent the impurity elements from diffusing and reaching the interface between first semiconductor films. Furthermore, the first semiconductor film for gettering 359 has an effect for protecting the crystalline semiconductor film 363 so as not to damage the film 363 when adding a rare-gas element.

Then, gettering is performed. As a step of performing gettering, it is enough to perform a heat treatment in a nitrogen atmosphere at 450 to 800° C. for 1 to 24 hr, for example, at 550° C. for 14 hr. Moreover, it is allowed to perform irradiation with intensified light instead of the heat treatment. Moreover, it is allowed to heat a substrate by jetting a heated gas. In this case, it is enough to heat the substrate 1 to 60 min at 600° C. to 800° C., more preferably 650° C. to 750° C. and thereby it is possible to save time. By performing the gettering, impurity elements move to the second semiconductor film 360 as shown by continuous-line arrows in FIG. 30F, impurity elements are removed from the crystalline semiconductor film 363 covered with the barrier layer 358 or the concentration of the impurity elements is reduced. After the gettering, a crystalline semiconductor film 357 is formed in which impurity elements are hardly contained, that is, the concentration of impurity elements in the film is $1 \times 10^{18}/cm^3$ or less, more preferably $1 \times 10^{17}/cm^3$ or less.

Then, the first semiconductor film for gettering 359 and second semiconductor film for gettering 360 are selectively removed by using the barrier layer 358 as an etching stopper.

Figure 30G:
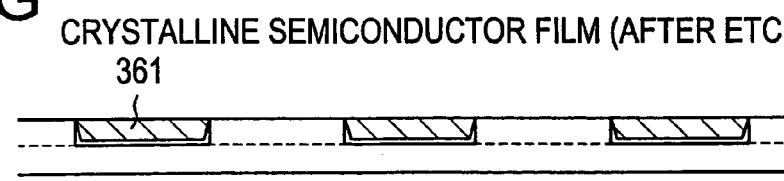

Moreover, after removing the barrier layer 358 by changing etching conditions, the crystalline semiconductor film (after gettering) 357 is etched so as to expose the upper face of the convex portion 353 and the etched crystalline semiconductor film 361 is formed on a concave portion as shown in FIG. 30G.

It is allowed to use the art disclosed in the official gazette of Japanese Patent Laid-Open No. 135468/1998 or 135469/1998 for gettering.

In the case of this embodiment, it is also allowed to accelerate crystallization by a catalyst not through irradiation with a laser beam but through heating and then separately perform irradiation with a laser beam. Moreover, it is allowed to accelerate crystallization by a catalyst through heating and then separately perform irradiation with a laser beam only in a driving circuit. Furthermore, it is allowed to accelerate crystallization by a catalyst through heating only in the driving circuit or accelerate crystallization by a laser beam by adding a catalyst element only in the driving circuit and then separately perform irradiation with a laser beam.

It is possible to execute this embodiment by combining it with any one of the embodiments 2 to 4.

Example 6

A TFT having an island-like semiconductor film formed in between convex portions can be used not only to a driving circuit but also to other circuits of a semiconductor display device. In this example, a description will be made of a structure of a controller using the TFT having the island-like semiconductor film formed in between the convex portions. Note that in this example, a structure of the controller of a light emitting device using an OLED (organic light emitting device) will be described. However, the present invention is not limited to this but may adopt a controller of the liquid crystal display device and those of other semiconductor display devices. Also, it may be a driving circuit other than the controller and a semiconductor display device other than the display device is also possible.

FIG. 31 shows the structure of the controller of this example. The controller includes an interface (I/F) 650, a panel link receiver 651, a phase locked loop (PLL) 652, a signal converting portion (FPGA: field programmable logic device) 653, SDRAMs (synchronous dynamic random access memories) 654 and 655, a ROM, (read only memory) 657, a voltage adjusting circuit 658 and a power supply 659. Note that in this example, the SDRAM is used, but a DRAM (dynamic random access memory) or an SRAM (static random access memory) can be also used instead of the SDRAM provided that high-speed data writing and reading are possible.

Digital video signals inputted in the semiconductor display device through the interface 650 are subjected to parallel/serial conversion at the panel link receiver 651 into digital video signals corresponding to the respective colors of R, G, and B, which are inputted into the signal converting portion 653.

Also, based on the various signals inputted to the semiconductor display device through the interface 650, an Hsync signal, a Vsync signal, a clock signal CLK, and an alternating voltage (AC cont) are generated at the panel link receiver 651 and inputted to the signal converting portion 653.

The phase locked loop 652 has a function of making in-phase the frequencies of various signals inputted to the semiconductor display device and the operating frequency of the signal converting portion 653. The operating frequency of the signal converting portion 653 does not always conform with the frequencies of the various signals inputted to the semiconductor display device. The phase locked loop 652 adjusts the operating frequency of the signal converting portion 653 in synchronism with the frequencies of the various signals.

The ROM 657 stores a program for controlling the operation of the signal converting portion 653 and the signal converting portion 653 operates according to the program.

The digital video signals inputted to the signal converting portion 653 are temporarily written into the SDRAMs 654 and 655 and held. The signal converting portion 653 reads the digital video signals corresponding to all the pixels on a bit basis among the digital video signals of all bits held in the SDRAM 654. The read signals are inputted to the signal-line driving circuit.

The signal converting portion 653 inputs information on the length of the light emission period of the OLED corresponding to each bit into the scanning-line driving circuit.

The voltage adjusting circuit 658 adjusts the voltage applied between the anode and the cathode of the OLED of each pixel in synchronism with the signal inputted from the signal converting portion 653. The power supply 659 supplies the voltage at a given level to the voltage adjusting circuit 658, the signal-line driving circuit, the scanning-line driving circuit, and the pixel portion.

Among the various circuits in a controller, any circuit, if obtained by using the TFT such as a CPU, a memory, and various kinds of processors can be formed according to the manufacturing method of the present invention.

The driving circuit and the controller used in the present invention are not limited to the structures described in this example. This example can be implemented freely in combination with Examples 2 to 5.

Example 7

A semiconductor display mounting a TFT fabricated by the present invention can be applied to various electronic devices. Some of them include a mobile information terminal (electronic databook, mobile computer, or cellular telephone), video camera, digital camera, personal computer, TV receiver, cellular telephone, and projection display. FIGS. 32A to 32H show specific examples of these electronic devices.

Figure 32A:
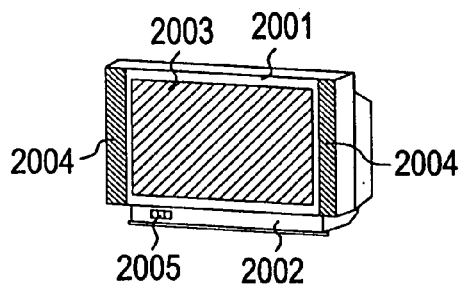
FIGS. 32A to 32H are illustrations of electronic devices respectively using a semiconductor display of the present invention.

FIG. 32A is a display which includes a housing 2001, support 2002, display section 2003, loudspeaker 2004, and video input terminal 2005. By using a semiconductor display of the present invention for the display section 2003, a display of the present invention is completed. The display includes all information displays such as those for personal computer, TV broadcast reception, and advertisement display.

Figure 32B:
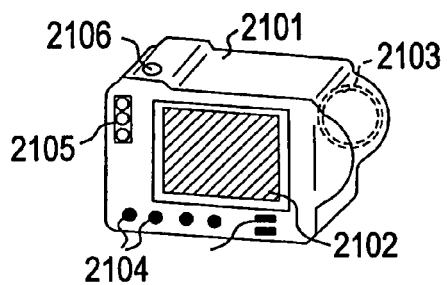

FIG. 32B is a digital still camera which includes a body 2101, display section 2102, image receiving section 2103, operation keys 2104, external connection port 2105, and shutter 2106. By using a semiconductor display of the present invention for the display section 2102, a digital still camera of the present invention is completed.

Figure 32C:
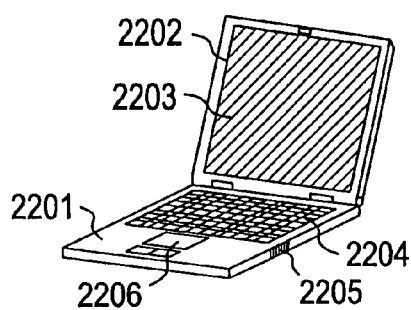

FIG. 32C is a notebook-size personal computer which includes a body 2201, housing 2202, display section 2203, keyboard 2204, external connection port 2205, and pointing mouse 2206. By using a semiconductor display of the present invention for the display section 2203, a mobile computer of the present invention is completed.

Figure 32D:
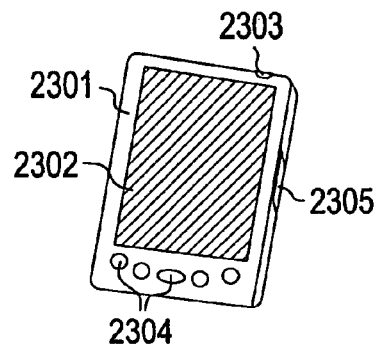

FIG. 32D is a mobile computer which includes a body 2301, display section 2302, switch 2303, operation keys 2304, and infrared-radiation port 2305. By using a semiconductor display of the present invention for the display section 2302, a mobile computer of the present invention is completed.

Figure 32E:
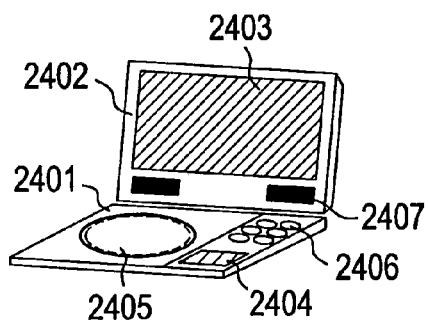

FIG. 32E is a mobile image reproducer (specifically, DVD reproducer) provided with a recording medium, which includes a body 2401, housing 2402, display section A 2403, display section B 2404, recording-medium (such as DVD) reading section 2405, operation keys 2406, and loudspeaker 2407. The display section A 2403 mainly displays image information and the display section B 2404 mainly displays character information. An image reproducer provided with a recording medium includes household game equipment. By using a semiconductor display of the present invention for the display sections A 2403 and B 2403, 2404, an image reproducer of the present invention is completed.

Figure 32F:
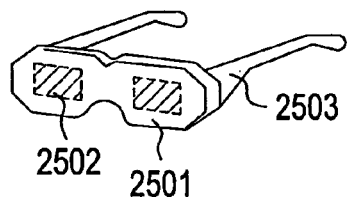

FIG. 32F is a goggle display (head-mount display) which includes a body 2501, display section 2502, and arm section 2503. By using a semiconductor display of the present invention for the display section 2502, a goggle display of the present invention is completed.

Figure 32G:
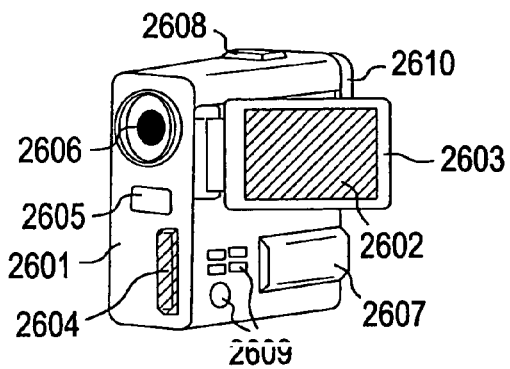

FIG. 32G is a video camera which includes a body 2601, display section 2602, housing 2603, external connection port 2604, remote-control receiving section 2605, image receiving section 2606, battery 2607, voice input section 2608, operation key 2609, and eye-piece section 2610. By using a semiconductor display of the present invention for the display section 2602, a video camera of the present invention is completed.

Figure 32H:
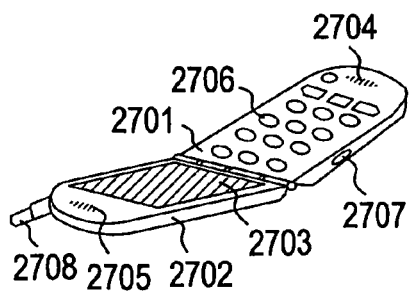

FIG. 32H is a cellular telephone which includes a body 2701, housing 2702, display section 2703, voice input section 2704, voice output section 2705, operation keys 2706, external connection port 2707, and antenna 2708. Because the display section 2703 displays white characters on a black background, it is possible to suppress the current consumption of the cellular telephone. By using a semiconductor display of the present invention for the display section 2703, a cellular telephone of the present invention is completed.

As described above, the applicable range of the present invention is very wide and therefore, the present invention can be applied to electronic devices in every field. Moreover, it is possible to execute this example by combining it with any one of configurations of the examples 2 to 6.

Example 8

The present invention can be applied to various semiconductor display devices. A mode of the semiconductor display devices manufactured in accordance with Examples 2 through 6 will be described with reference to FIGS. 33.

Figure 33:
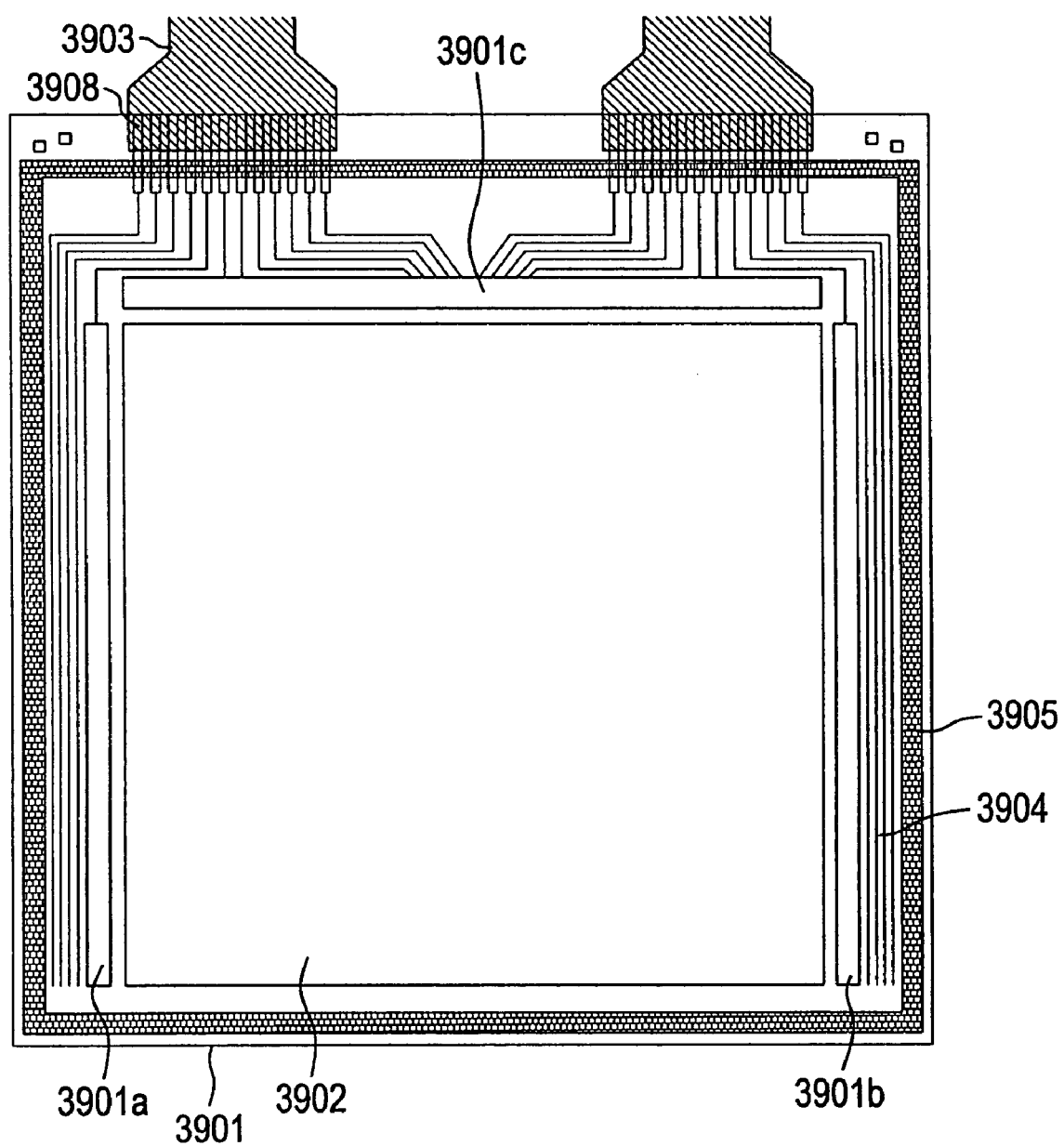
FIG. 33 is a view of a completed semiconductor display of the present invention.
Figure 34A:
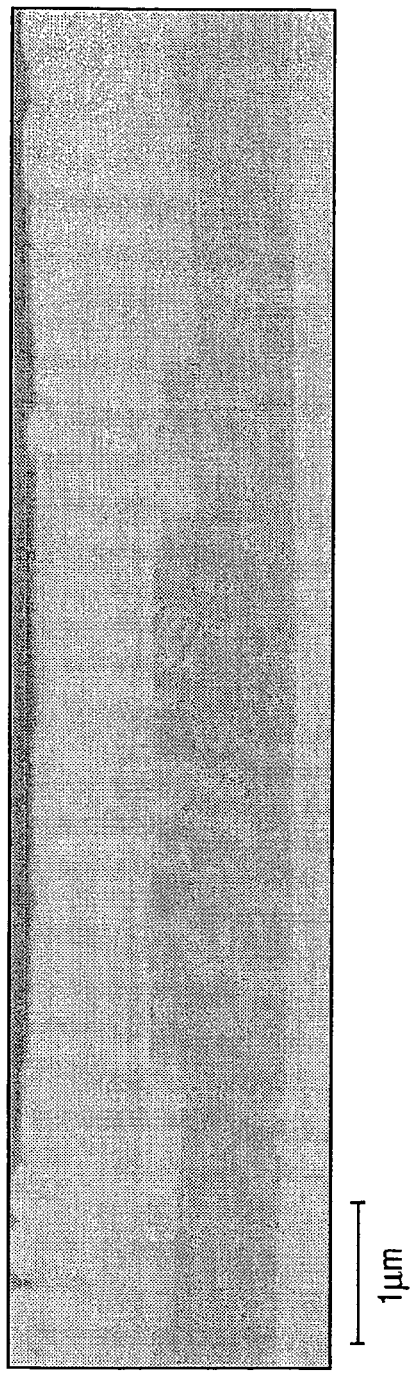
FIGS. 34A and 34B are sectional images of a semiconductor film formed on a ground film having convex portions and crystallized by irradiating the film with a laser beam, which are taken by a TEM.
Figure 34B:
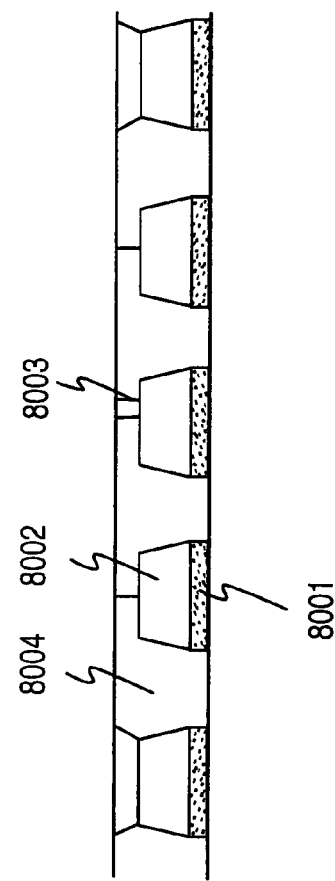
Figure 35A:
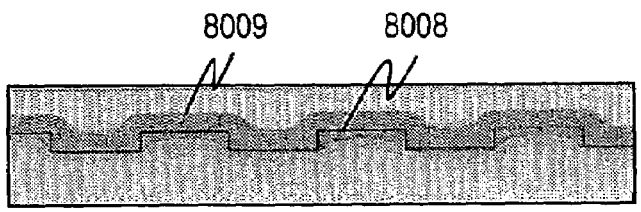
FIGS. 35A to 35F are a change over time of temperature distributions of silicon formed on a ground film having concave and convex portions when irradiating the silicon with a laser beam.
Figure 35B:
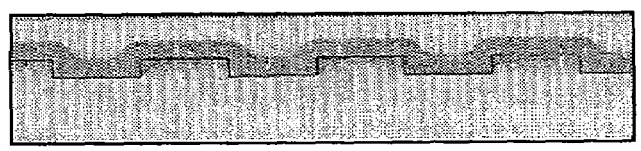
Figure 35C:
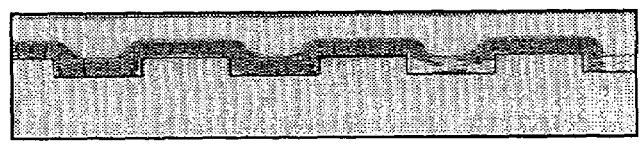
Figure 35D:
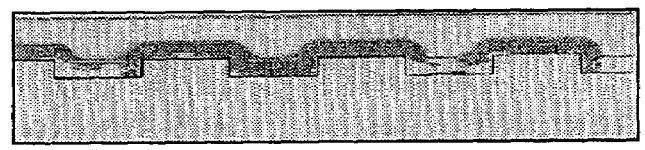
Figure 35E:
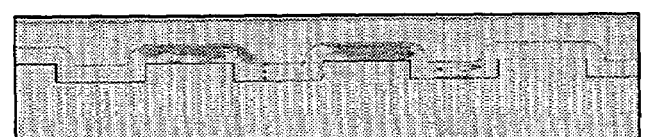
Figure 35F:
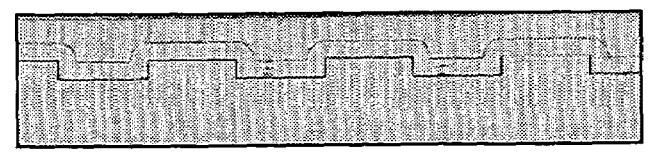
Figure 36:
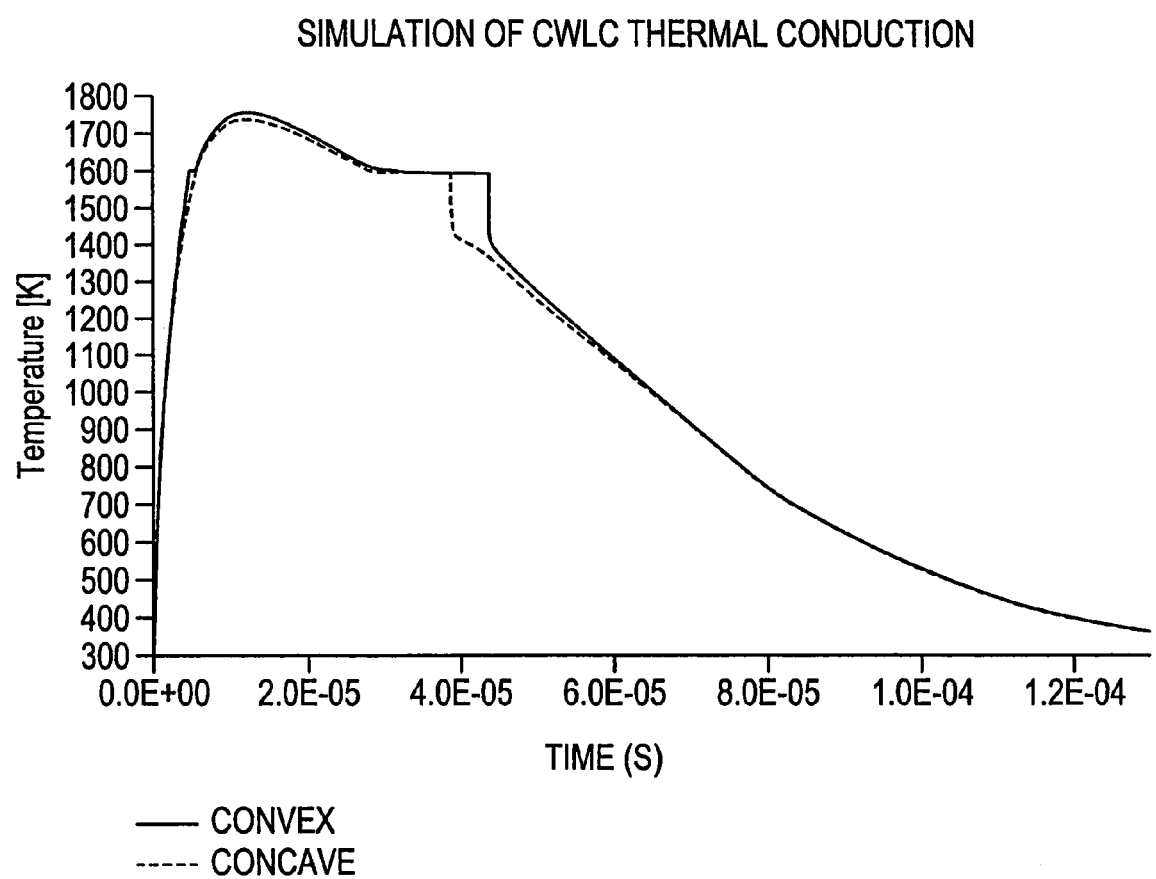
FIG. 36 is a change over time of temperatures of silicon formed on a ground film having concave and convex portions when irradiating the silicon with a laser beam.
Figure 37:
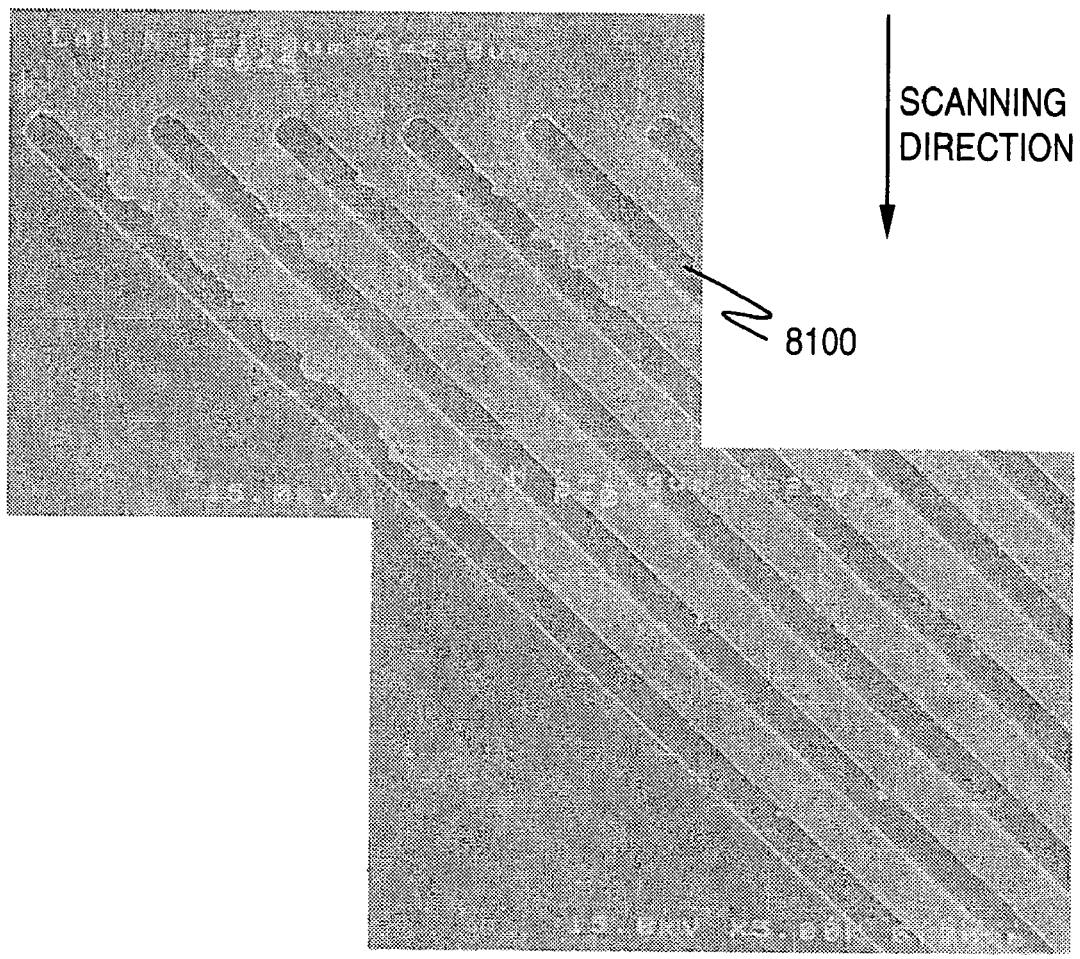
FIG. 37 is an SEM image of a semiconductor film formed on a ground film having convex portions after crystallized by diagonally irradiating the semiconductor film with a laser beam.
Figure 38:
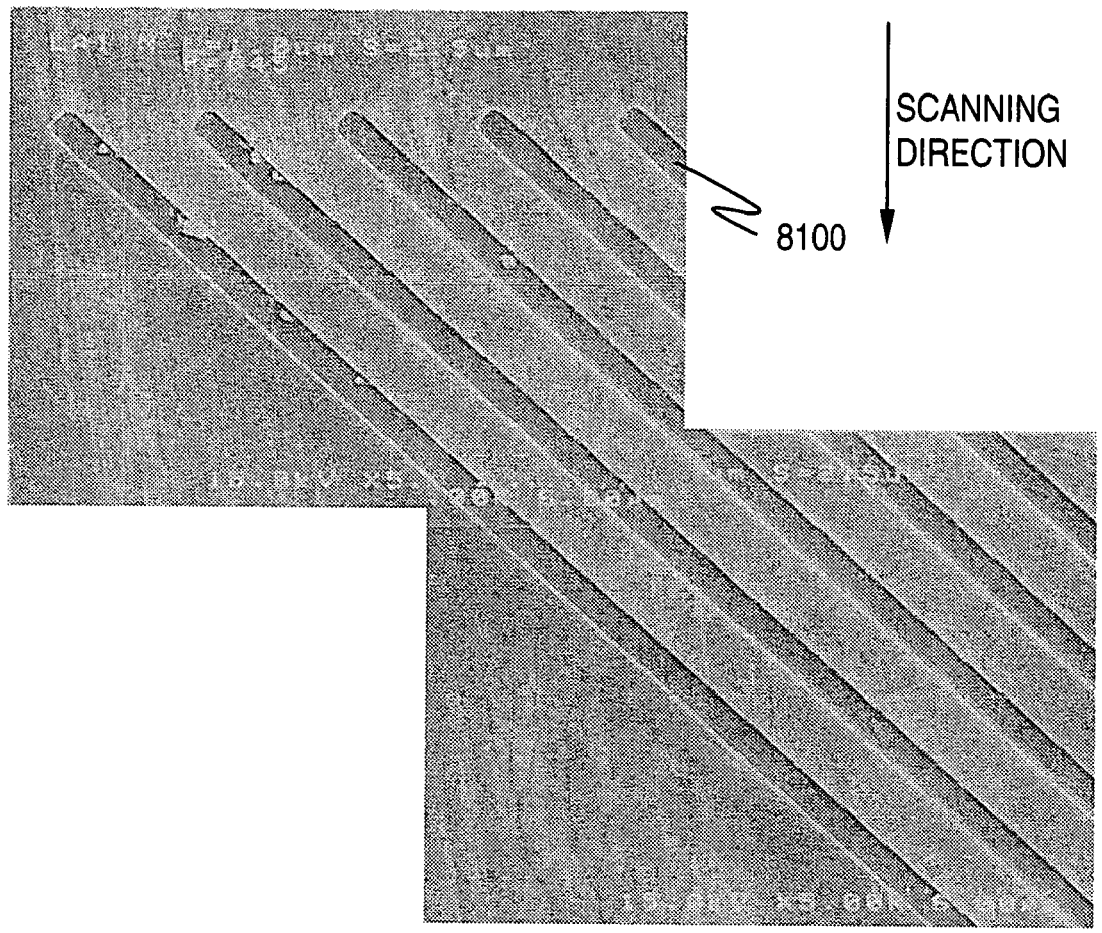
FIG. 38 is an SEM image of a semiconductor film formed on a ground film having convex portions after crystallized by diagonally irradiating the semiconductor film with a laser beam.
Figure 39:
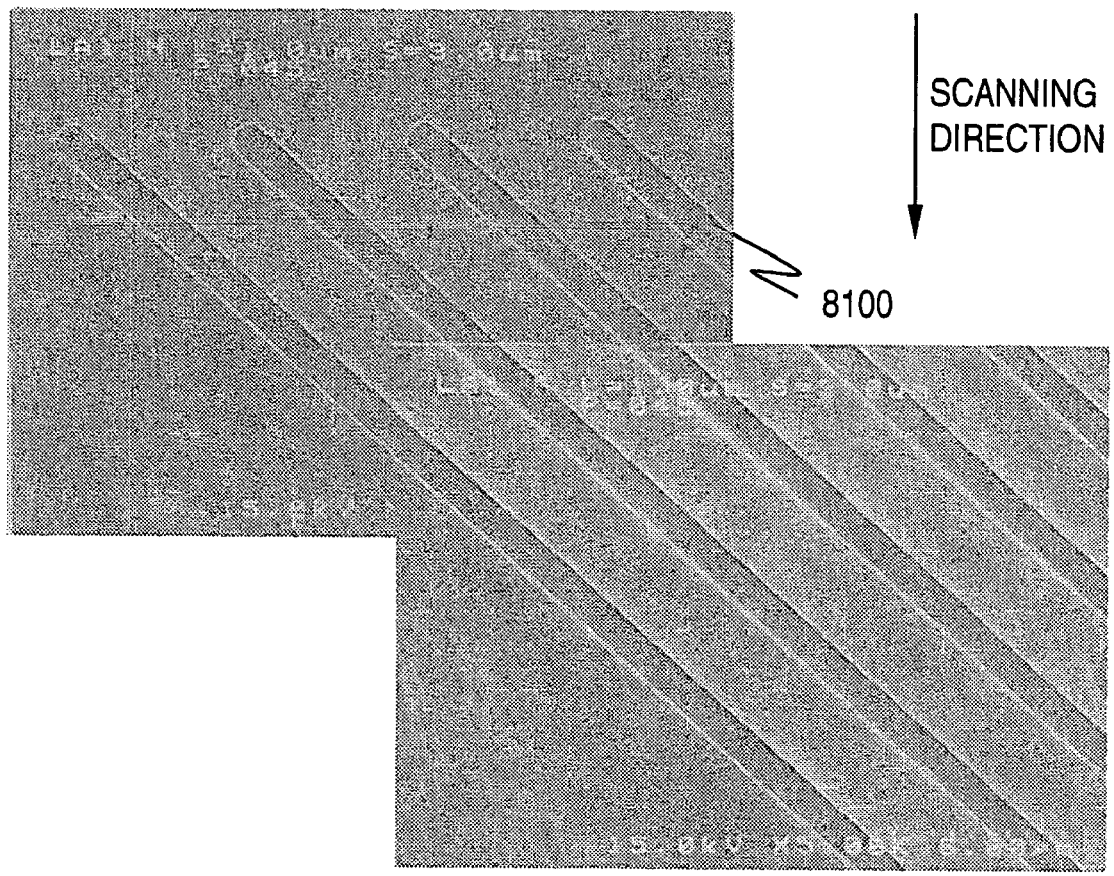
FIG. 39 is an SEM image of a semiconductor film formed on a ground film having convex portions after crystallized by diagonally irradiating the semiconductor film with a laser beam.

In FIG. 33, a substrate 3901 is provided with a pixel portion 3902, scanning-line driving circuits 3901a and 3901b, a signal-line driving circuit 3901c, an input/output terminal portion 3908, and a wiring or group of wirings 3904. A shield pattern 3905 may partially overlap the scanning-line driving circuits 3901a and 3901b and the signal-line driving circuit 3901c, as well as the wiring or group of wirings 3904 for connecting the driving circuits with the input/output terminal portion 3908. In this way, the area of the frame region (the region surrounding the pixel portion) of the display panel can be reduced. An FPC 3903 is fixed to the input/output terminal portion 3908.

In the scanning-line driving circuits 3901a and 3901b and the signal-line driver circuit 3901c of the present invention, a island-like semiconductor film which is crystallized by utilizing an unevenness formed on the base film is formed, thereby forming various kinds of elements by using the island-like semiconductor film.

This example can be implemented by being freely combined with Examples 2 to 7.

Example 9

In the case of this example, characteristics of TFTs fabricated by semiconductor films crystallized in different conditions are described.

Condition 1 forms a semiconductor film on a ground film having concave and convex portions in which a convex portion has a height of 70 nm and a width of 8 μm and a concave portion has a width of 8 μm, applies a beam spot along the longitudinal direction of concave and convex portions, and performs crystallization so that the major axis of the beam spot becomes vertical to a scanning direction.

Condition 2 forms a semiconductor film on a ground film having concave and convex portions in which a convex portion has a height of 70 nm and a width of 8 μm and a concave portion has a width of 8 μm, applies a beam spot along the longitudinal direction of concave and convex portions, and performs crystallization so that the major axis of the beam spot tilts by 45° from a scanning direction.

Condition 3 forms a semiconductor film on a ground film having concave and convex portions in which a convex portion has a height of 100 nm and a width of 8 μm and a concave portion has a width of 8 μm, applies a beam spot along the longitudinal direction of concave and convex portions, and performs crystallization so that the major axis of the beam spot becomes vertical to a scanning direction.

Condition 4 forms a semiconductor film on a ground film having concave and convex portions in which a convex portion has a height of 100 nm and a width of 8 μm and a concave portion has a width of 8 μm, applies a beam spot along the longitudinal direction of concave and convex portions, and performs crystallization so that the major axis of the beam spot tilts by 45° from a scanning direction.

Condition 5 forms a semiconductor film on a flat ground film and performs crystallization so that the major axis of a beam spot becomes vertical to a scanning direction.

Condition 6 forms a semiconductor film on a flat ground film and performs crystallization so that the major axis of a beam spot tilts by 45° from a scanning direction.

The above conditions are shown together in the following Table 1.

TABLE 1

| Condition | Step | Depth of Step | Gradient of Beam |
| --- | --- | --- | --- |
| 1 | present | 70 nm | zero |
| 2 | present | 70 nm | 45° |
| 3 | present | 100 nm | zero |
| 4 | present | 100 nm | 45° |
| 5 | absent | absent | zero |
| 6 | absent | absent | 45° |

Figure 41A:
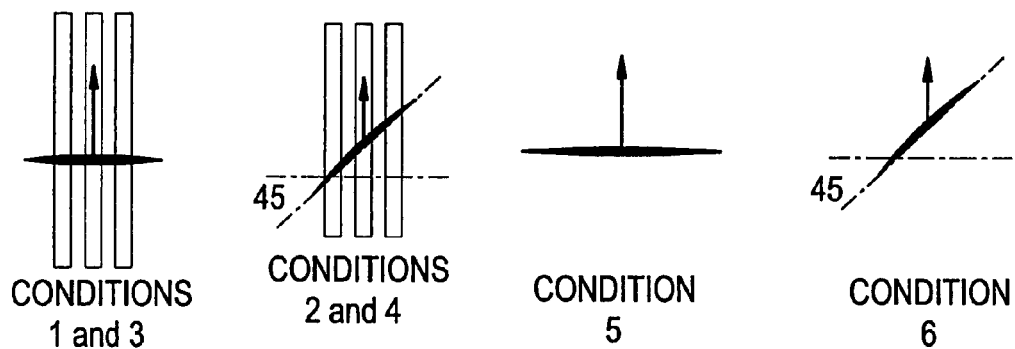
FIGS. 41A to 41C are illustrations showing comparison between characteristics of TFTs fabricated under each condition.

FIG. 41A briefly shows positional relations between the scanning direction of a beam spot, longitudinal direction of concave and convex portions, and major axis of the beam spot under each condition.

Figure 41B:
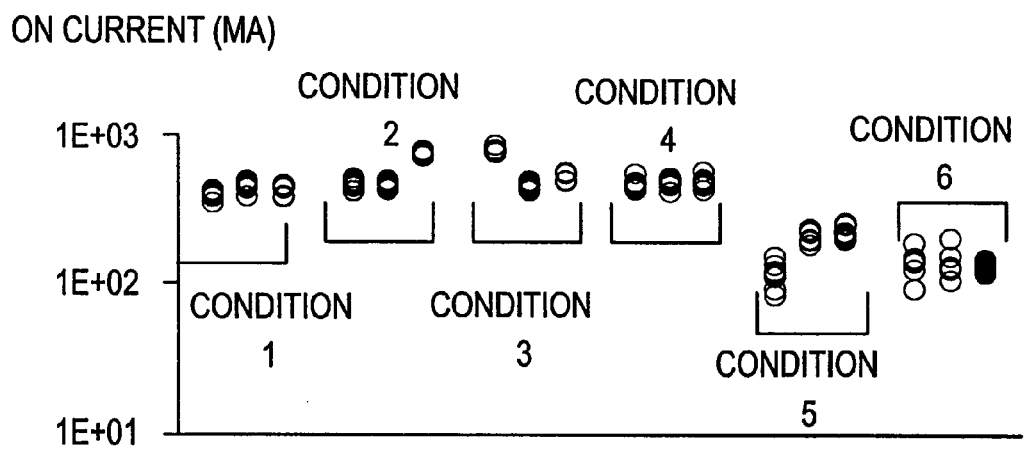

FIG. 41B shows measured values of on-currents of TFTs fabricated under each condition. In all conditions, a drain voltage is set to 5 V. It is found that TFTs formed on ground films having concave and convex portions under conditions 1 to 4 have a higher on-current and smaller fluctuation on the average than TFTs formed on flat ground films under conditions 5 and 6.

Figure 41C:
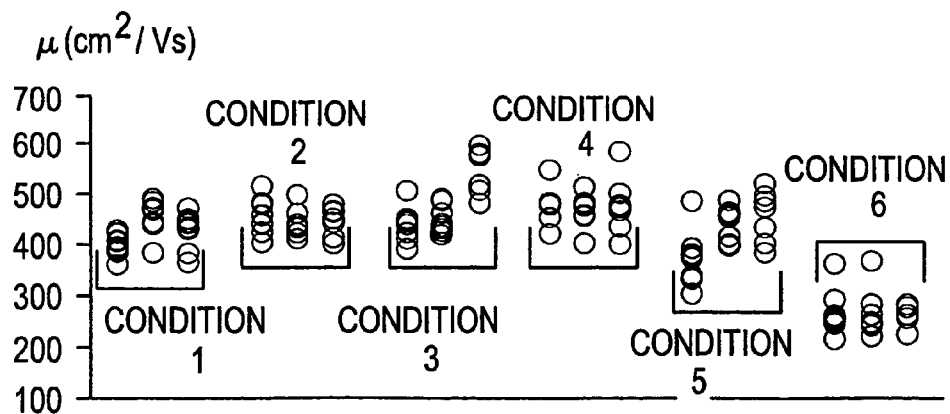

FIG. 41C shows measured values of mobility of TFTs fabricated under each condition. It is found that TFTs formed on flat ground films having concave and convex portions under conditions 1 to 4 have a smaller mobility than TFTs formed under condition 6.

As described above, by forming a linear stripe pattern having concave and convex portions by an insulating film, depositing an amorphous semiconductor film on the stripe pattern, and moving a linear laser beam along the stripe pattern while diagonally applying the laser beam to the stripe pattern, it is possible to pour a semiconductor into concave portions on the stripe pattern and coagulate the semiconductor, make contortions or stresses due to crystallization concentrate on regions other than the concave portions, and selectively form a region having a low crystallinity such as a crystalline interface. Moreover, it is possible to specify a semiconductor element such as a transistor, particularly the channel-forming region of the semiconductor element and form a crystalline semiconductor film in which no crystalline interface is present. Thereby, it is possible to eliminate a factor for fluctuation of characteristics due to a crystalline interface or crystal defect, which is present improperly and forms a transistor or a transistor-element group having a small characteristic fluctuation.

As described above, the present invention makes it possible to provide a semiconductor element capable of performing high-speed operations and having a high current-driving capacity and a small fluctuation between elements or a semiconductor device constituted by integrating a group of these semiconductor elements. Moreover, by setting the predominant crystal plane of the carrier moving route of the semiconductor element (typically, channel-forming region of a thin-film transistor) to plane {110}, it is possible to further improve electrical characteristics of semiconductor elements.

Moreover, the present invention makes it possible to prevent a grain boundary from being formed in the channel-forming region of a TFT by positively using an island-shaped semiconductor film located on a concave portion of a ground film as the active layer of the TFT and moreover prevent the mobility of the TFT from being extremely deteriorated due to a grain boundary, on-current from decreasing, and off-current from increasing. A designer can properly decide a portion to be removed through patterning as the vicinity of the edge of a convex or concave portion.

Moreover, it is possible to expand the tolerance of the width of a concave portion which can be determined as a width from which an effect that a grain boundary is not easily formed on a concave portion is obtained compared to the case of making the scanning direction of a laser beam coincide with the longitudinal direction of a convex portion only by tilting the scanning direction of the laser beam from the longitudinal direction of the convex portion by a predetermined angle.

What is claimed is:

1. A method for fabricating a semiconductor device comprising:
    forming a plurality of insulating films extending in a form of linear stripe patterns;
    forming a semiconductor film for covering the plurality of the insulating films; and
    improving crystallinity of at least a part of the semiconductor film to become a channel region by irradiating the semiconductor film with a linear laser beam, the channel region provided over a concave portion formed between at least two of the plurality of the insulating films,
    wherein a linear-laser-beam irradiation region is formed so that the longitudinal direction of the irradiation region becomes diagonal to the plurality of the insulating films.

2. A method according to claim 1, wherein
    the semiconductor film comprises a material selected from the group consisting of silicon, silicon germanium, and silicon carbide.

3. A method according to claim 1, wherein
    the linear laser beam is a continuous-oscillation linear laser beam.

4. A method according to claim 1, wherein a width of the concave portion is set in a range between 0.01 µm and 5 µm (both included) and a depth of the concave portion is set in a range between 0.01 µm and 3 µm (both included).

5. A method according to claim 1 wherein said semiconductor device is incorporated, into one selected from the group consisting of a TV receiver, a video camera, a personal computer, a personal digital assistant, an acoustic reproducer, a digital camera, a cellular telephone, a mobile computer, a mobile image reproducer, and a goggle display.

6. A method for fabricating a semiconductor device comprising:
    forming a plurality of insulating films extending in a form of linear stripe patterns;
    forming a semiconductor film for covering the plurality of the insulating films; and
    improving crystallinity of at least a part of the semiconductor film to become a channel region by irradiating the semiconductor film with a linear laser beam, the channel region provided over a concave portion formed between at least two of the plurality of the insulating films,
    wherein a linear-laser-beam irradiation region is formed so that an angle formed between the longitudinal direction and the moving direction of the irradiation region ranges between 45±25°.

7. A method according to claim 6, wherein
    the semiconductor film comprises a material selected from the group consisting of silicon, silicon germanium, and silicon carbide.

8. A method according to claim 6, wherein
    the linear laser beam is a continuous-oscillation linear laser beam.

9. A method according to claim 6, wherein a width of the concave portion is set in a range between 0.01 µm and 5 µm (both included) and a depth of the concave portion is set in a range between 0.01 µm and 3 µm (both included).

10. A method according to claim 6 wherein said semiconductor device is incorporated into one selected from the group consisting of a TV receiver, a video camera, a personal computer, a personal digital assistant, an acoustic reproducer, a digital camera, a cellular telephone, a mobile computer, a mobile image reproducer, and a goggle display.

11. A method for fabricating a semiconductor device comprising:
    forming a plurality of insulating films extending in a form of linear stripe patterns over a glass substrate by an exposure system having a minimum working dimension of 1.5 µm or more;

forming a semiconductor film for covering the plurality of the insulating films; and improving crystallinity of at least a part of the semiconductor film to become a channel region by irradiating the semiconductor film with a linear laser beam, the channel region provided over a concave portion formed between at least two of the plurality of the insulating films, wherein a linear-laser-beam irradiation region is formed so that the longitudinal direction of the irradiation region becomes diagonal to the plurality of the insulating films.

12. A method according to claim 11, wherein the semiconductor film comprises a material selected from the group consisting of silicon, silicon germanium, and silicon carbide.

13. A method according to claim 11, wherein the linear laser beam is a continuous-oscillation linear laser beam.

14. A method according to claim 11, wherein a width of the concave portion is set in a range between 0.01 µm and 5 µm (both included) and a depth of the concave portion is set in a range between 0.01 µm and 3 µm (both included).

15. A method according to claim 11 wherein said semiconductor device is incorporated into one selected from the group consisting of a TV receiver, a video camera, a personal computer, a personal digital assistant, an acoustic reproducer, a digital camera, a cellular telephone, a mobile computer, a mobile image reproducer, and a goggle display.

16. A method for fabricating a semiconductor device comprising:

forming a plurality of insulating films extending in a form of linear stripe patterns over a glass substrate by an exposure system having a minimum working dimension of 1.5 µm or more;

forming a semiconductor film for covering the plurality of the insulating films; and improving crystallinity of at least a part of the semiconductor film to become a channel region by irradiating the semiconductor film with a linear laser beam, the channel region provided over a concave portion formed between at least two of the plurality of the insulating films, wherein a linear-laser-beam irradiation region is formed so that an angle formed between the longitudinal direction and the moving direction of the irradiation region ranges between 45±25°.

17. A method according to claim 16, wherein the semiconductor film comprises a material selected from the group consisting of silicon, silicon germanium, and silicon carbide.

18. A method according to claim 16, wherein the linear laser beam is a continuous-oscillation linear laser beam.

19. A method according to claim 16, wherein a width of the concave portion is set in a range between 0.01 µm and 5 µm (both included) and a depth of the concave portion is set in a range between 0.01 µm and 3 µm (both included).

20. A method according to claim 16 wherein said semiconductor device is incorporated into one selected from the group consisting of a TV receiver, a video camera, a personal computer, a personal digital assistant, an acoustic reproducer, a digital camera, a cellular telephone, a mobile computer, a mobile image reproducer, and a goggle display.

21. A method for fabricating a semiconductor device comprising:

forming first and second insulating films extending in a form of linear stripe patterns in a first direction;

forming a semiconductor film for covering the first and second insulating films; and improving crystallinity of at least a part of the semiconductor film to become a channel region by irradiating the semiconductor film with a linear laser beam having a longitudinal direction orthogonal to the first direction, the channel region provided over a concave portion formed between the first and second insulating films.

22. A method according to claim 21, wherein the semiconductor film comprises a material selected from the group consisting of silicon, silicon germanium, and silicon carbide.

23. A method according to claim 21, wherein the linear laser beam is a continuous-oscillation linear laser beam.

24. A method according to claim 21, wherein a width of the concave portion is set in a range between 0.01 µm and 5 µm (both included) and a depth of the concave portion is set in a range between 0.01 µm and 3 µm (both included).

25. A method according to claim 21 wherein said semiconductor device is incorporated into one selected from the group consisting of a TV receiver, a video camera, a personal computer, a personal digital assistant, an acoustic reproducer, a digital camera, a cellular telephone, a mobile computer, a mobile image reproducer, and a goggle display.

26. A method for fabricating a semiconductor device comprising:

forming first and second insulating films extending in a form of linear stripe patterns;

forming a semiconductor film for covering the first and second insulating films; and improving crystallinity of at least a part of the semiconductor film to become a channel region by irradiating the semiconductor film with a linear laser beam having an angle formed between a longitudinal direction and a moving direction of the linear laser beam in a range between 45±25°, the channel region provided over a concave portion formed between the first and second insulating films.

27. A method according to claim 26, wherein the semiconductor film comprises a material selected from the group consisting of silicon, silicon germanium, and silicon carbide.

28. A method according to claim 26, wherein the linear laser beam is a continuous-oscillation linear laser beam.

29. A method according to claim 26, wherein a width of the concave portion is set in a range between 0.01 µm and 5 µm (both included) and a depth of the concave portion is set in a range between 0.01 µm and 3 µm (both included).

30. A method according to claim 26 wherein said semiconductor device is incorporated into one selected from the group consisting of a TV receiver, a video camera, a personal computer, a personal digital assistant, an acoustic reproducer, a digital camera, a cellular telephone, a mobile computer, a mobile image reproducer, and a goggle display.

* * * * *